(12) United States Patent
Wang et al.

(10) Patent No.: US 11,300,852 B2
(45) Date of Patent: Apr. 12, 2022

(54) MEMS OPTICAL SWITCH WITH A CANTILEVER COUPLER

(71) Applicant: Robert Bosch GmbH, Stuttgart (DE)

(72) Inventors: Ning Wang, Sunnyvale, CA (US);
Alexander Huebel, Leonberg (DE);
Christoph Schelling, Stuttgart (DE);
Jan Niklas Caspers, Stuttgart (DE);
Hartmut Kueppers, Reutlingen (DE);
Stefan Pinter, Reutlingen (DE)

(73) Assignee: ROBERT BOSCH GMBH

( * ) Notice: Subject to any disclaimer, the term of this patent is extended or adjusted under 35 U.S.C. 154(b) by 0 days.

(21) Appl. No.: 16/919,581

(22) Filed: Jul. 2, 2020

(65) Prior Publication Data
US 2022/0004078 A1 Jan. 6, 2022

(51) Int. Cl.
*G02F 1/313* (2006.01)

(52) U.S. Cl.
CPC .......... *G02F 1/313* (2013.01); *G02F 2203/24* (2013.01)

(58) Field of Classification Search
CPC ............................. G02F 1/313; G02F 2203/24
See application file for complete search history.

(56) References Cited

U.S. PATENT DOCUMENTS

| | | | |
|---|---|---|---|
| 5,542,009 A | 7/1996 | Kuehnle | |
| 5,911,018 A | 6/1999 | Bischel et al. | |
| 6,385,355 B1 | 5/2002 | Nashimoto et al. | |
| 6,683,711 B2 | 1/2004 | Zhang et al. | |
| 6,782,155 B2 | 8/2004 | Katayama et al. | |
| 8,755,647 B2* | 6/2014 | Yaacobi | G02B 6/12007 385/27 |
| 8,988,754 B2* | 3/2015 | Sun | G02B 6/12033 359/238 |
| 9,476,981 B2* | 10/2016 | Yaacobi | G01S 7/4814 |
| 10,338,321 B2* | 7/2019 | Hosseini | G02B 6/3526 |
| 10,359,630 B2* | 7/2019 | Raval | G02B 27/0179 |

(Continued)

OTHER PUBLICATIONS

Han et al., Large-Scale Polarization-Insensitive Silicon Photonic MEMS Switches, in Journal of Lightwave Technology, vol. 36, No. 10, pp. 1824-1830, May 15, 15, 2018, doi: 10.1109/JLT.2018.2791502 (Year: 2018).*

(Continued)

*Primary Examiner* — Peter Radkowski
(74) *Attorney, Agent, or Firm* — Dickinson Wright PLLC

(57) ABSTRACT

An optical switch includes a bus waveguide supported by a substrate, a coupling waveguide suspended over the bus waveguide, a reaction electrode coupled with, and adjacent to, the coupling waveguide, an actuation electrode supported by the substrate and configured to control a position of the coupling waveguide relative to the bus waveguide via the reaction electrode, and an optical antenna coupled with the coupling waveguide and disposed at a fixed distance from the bus waveguide. When a voltage difference between the reaction electrode and the actuation electrode is less than a lower threshold, the coupling waveguide is positioned a first distance from the bus waveguide, when the voltage difference between the reaction electrode and the actuation electrode is greater than an upper threshold, the coupling waveguide is positioned a second distance from the bus waveguide, and the second distance is less than the first distance.

20 Claims, 44 Drawing Sheets

(56) References Cited

U.S. PATENT DOCUMENTS

| | | | |
|---|---|---|---|
| 10,444,596 | B1 | 10/2019 | Wu et al. |
| 10,466,423 | B2 | 11/2019 | Spector et al. |
| 10,545,289 | B1* | 1/2020 | Chriqui ............. G02B 27/0087 |
| 10,613,276 | B2* | 4/2020 | Mansouri Rad ...... G01S 7/4817 |
| 10,627,485 | B2* | 4/2020 | Swanson ............ G02B 6/29302 |
| 10,627,517 | B2* | 4/2020 | Yaacobi ................ G02F 1/292 |
| 10,656,496 | B2* | 5/2020 | Hashemi ............... G02F 1/2955 |
| 10,677,594 | B2 | 6/2020 | Scheirich et al. |
| 10,761,272 | B2* | 9/2020 | Hosseini ............. G02B 6/3512 |
| 10,823,913 | B1 | 11/2020 | Moebius et al. |
| 2002/0023999 | A1 | 2/2002 | Hsu et al. |
| 2003/0044106 | A1 | 3/2003 | Lin |
| 2003/0108274 | A1 | 6/2003 | Haronian |
| 2003/0123798 | A1 | 7/2003 | Zhang et al. |
| 2003/0179998 | A1 | 9/2003 | Zhang et al. |
| 2003/0198259 | A1 | 10/2003 | Zhang et al. |
| 2003/0223675 | A1 | 12/2003 | Berger et al. |
| 2004/0071395 | A1 | 4/2004 | Hsu et al. |
| 2004/0075366 | A1 | 4/2004 | Mehta |
| 2004/0228574 | A1 | 11/2004 | Chen et al. |
| 2005/0141896 | A1 | 6/2005 | Huang et al. |
| 2007/0160318 | A1 | 7/2007 | Jao et al. |
| 2009/0200144 | A1 | 8/2009 | Naito |
| 2013/0032570 | A1 | 2/2013 | Rogers |
| 2013/0272652 | A1* | 10/2013 | Yaacobi ............... G02B 6/1226 385/27 |
| 2014/0192394 | A1* | 7/2014 | Sun ........................ G02B 6/26 359/289 |
| 2015/0346340 | A1* | 12/2015 | Yaacobi ................ G01S 7/4915 356/5.11 |
| 2017/0003507 | A1* | 1/2017 | Raval ..................... G02F 1/292 |
| 2017/0016990 | A1* | 1/2017 | Yaacobi ................. G01S 17/36 |
| 2017/0299697 | A1* | 10/2017 | Swanson ............ G01N 21/4795 |
| 2018/0039154 | A1* | 2/2018 | Hashemi ............ G02B 6/1226 |
| 2018/0267250 | A1* | 9/2018 | Hosseini ............... G01S 7/4814 |
| 2018/0356597 | A1 | 12/2018 | Spector et al. |
| 2019/0004151 | A1* | 1/2019 | Abediasl ................ G02F 1/292 |
| 2019/0146087 | A1 | 5/2019 | Mansur et al. |
| 2019/0170946 | A1 | 6/2019 | Tu |
| 2019/0324214 | A1* | 10/2019 | Hosseini .............. G01S 7/4816 |
| 2019/0377135 | A1* | 12/2019 | Mansouri Rad ........ G01S 17/06 |
| 2020/0049886 | A1* | 2/2020 | Chriqui ................... G02B 6/26 |
| 2020/0166703 | A1* | 5/2020 | Charles et al. |
| 2020/0284910 | A1* | 9/2020 | Yaacobi ............... G01S 7/4814 |
| 2020/0379185 | A1* | 12/2020 | Hosseini .............. G01S 7/4816 |
| 2020/0393737 | A1* | 12/2020 | Hosseini ................ G02F 1/225 |
| 2021/0018691 | A1 | 1/2021 | Jandric et al. |

OTHER PUBLICATIONS

Wang et al., Improving the performance of optical antenna for optical phased arrays through high-contrast grating structure on SOI substrate, Opt. Express 27, 2703-2712 (2019) (Year: 2019).*

Han et al., Large-scale silicon photonic switches with movable directional couplers, Optica 2, 370-375 (2015) (Year: 2015).*

Errando-Herranz et al., New dynamic silicon photonic components enabled by MEMS technology, Proc. SPIE 10537, Silicon Photonics XIII, 1053711 (Feb. 22, 2018); doi: 10.1117/12.2297588 (Year: 2016).*

Du et al., Mechanically-Tunable Photonic Devices with On-Chip Integrated MEMS/NEMS Actuators, Micromachines 2016, 7, 69; doi:10.3390/mi7040069 (Year: 2016).*

Akihama et al., Ultra-small silicon waveguide coupler switch using gap-variable mechanism , Nov. 2011 / vol. 19, No. 24 / OPTICS Express 23658 (Year: 2011).*

Chollet, Franck, Devices Based on Co-Integrated MEMS Actuators and Optical Waveguide: A Review, Micromachines 2016, 7, 18; doi:10.3390/mi7020018 (Year: 2016).*

Tu et al. State of the Art and Perspectives on Silicon Photonic Switches, Micromachines 2019, 10, 51; doi:10.3390/mi10010051 (Year: 2019).*

Seok et al., Silicon Photonics with MEMS for Efficient Light Manipulation,2019 International Conference on Optical MEMS and Nanophotonicsm Jul. 28-Aug. 1, 2019/ KAIST, Daejeon, Korea (Year: 2019).*

Quack et al., Scalable Row/Column Addressing of Silicon Photonic MEMS Switches, IEEE Photonics Technology Letters, vol. 28, No. 5, Mar. 1, 2016 (Year: 2016).*

Seok et al., Large-scale broadband digital silicon photonic switches with vertical adiabatic couplers, vol. 3, No. 1 / Jan. 2016 / Optica 64 (Year: 2016).*

Kwon et al., 128×128 Silicon Photonic MEMS Switch with Scalable Row/Column Addressing, SF1A.4.pdf, CLEO 2018 (Year: 2018).*

Yu et al., MEMS-Based Tunable Grating Coupler, IEEE Photonics Technology Letters, vol. 31, No. 2, Jan. 15, 2019 (Year: 2019).*

Seok et al. "Highly scalable digital silicon photonic MEMS switches", Journal of Lightwave Technology 2016, vol. 34, No. 2, pp. 365-371.

Behroozpour et al. "Electronic-Photonic Integrated Circuit for 3D Microimaging", IEEE Journal of Solid-State Circuits 2017, vol. 52, No. 1, pp. 161-172.

Pallay et al. "A reliable MEMS switch using electrostatic levitation", Appl. Phys. Lett. 2018, vol. 113, 5 Pages.

* cited by examiner

Simulation results of single MEMS switch:
coupling from bus waveguide to cantilever coupler waveguide
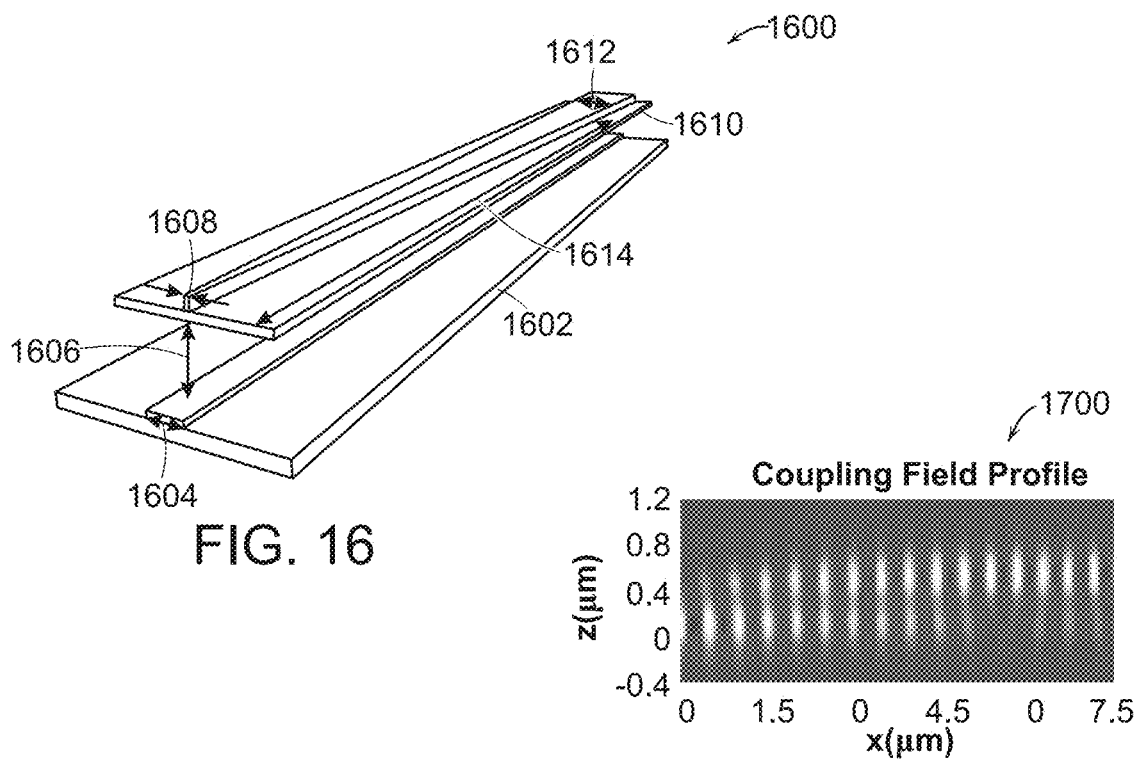
FIG. 16
FIG. 17
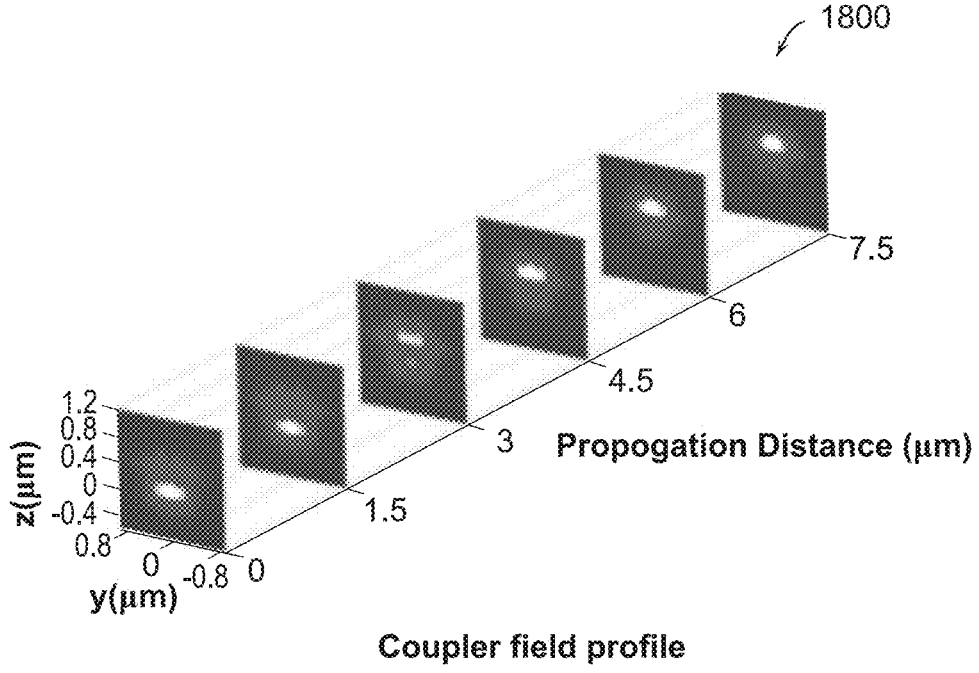
Coupler field profile
FIG. 18 intentionally left blank

FIG. 37 intentionally left blank

FIG. 38

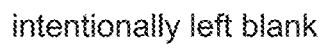

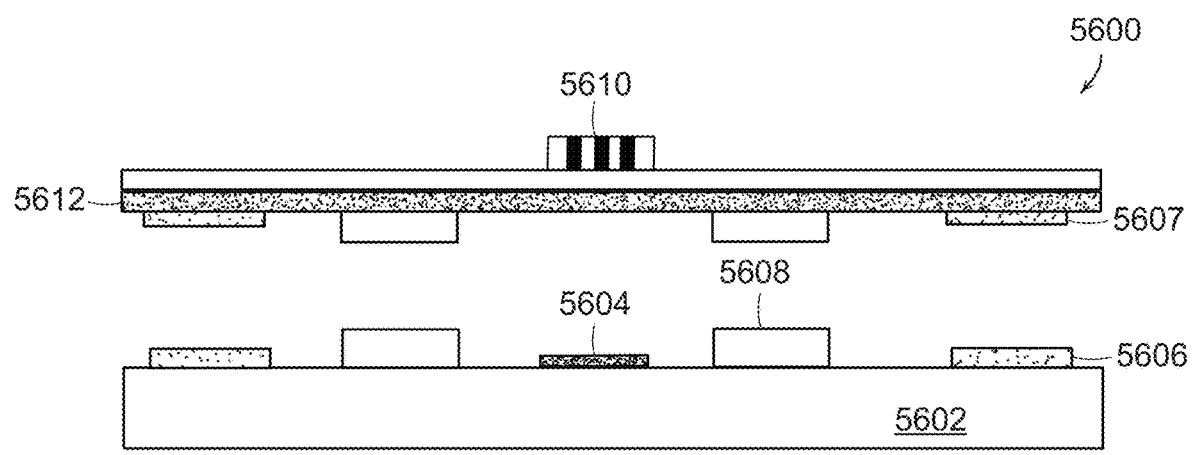
FIG. 56A
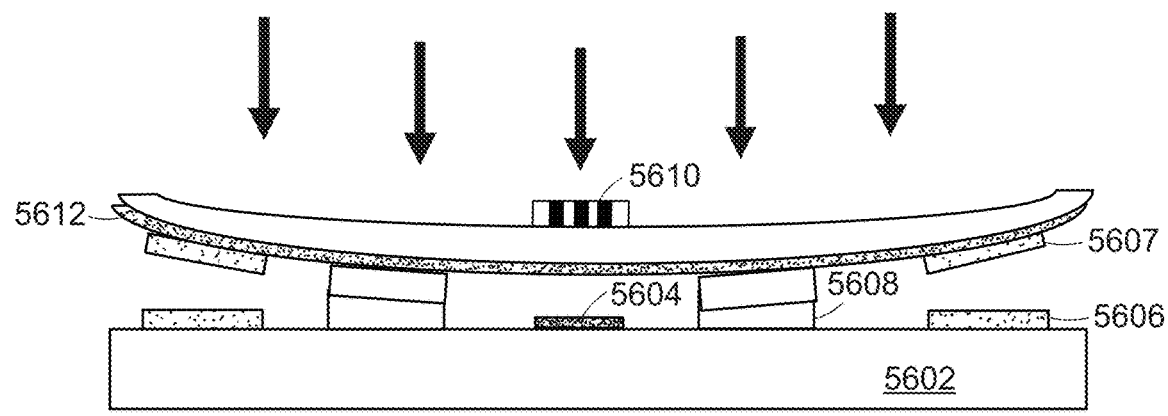
FIG. 56B
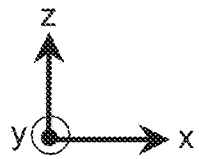

MEMS OPTICAL SWITCH WITH A CANTILEVER COUPLER

CROSS-REFERENCE TO RELATED APPLICATIONS

Technical Field

This invention relates generally to a system and apparatus for channeling and emitting light signals.

BACKGROUND

Lidar is considered to be a key enabler for many new technologies such as autonomous vehicles. Chip-Lidar (also known as solid-state Lidar, or Lidar on a chip) is expected to be widely used in future autonomous vehicles. However, many challenges remain in creating a practical chip-Lidar that can meet the requirements of vehicle OEMs. One of the challenges is beam steering. There has been various approaches developed to steer a beam in chip-Lidar, such as micro mirror array, optical phased array, wavelength tuning, and photonic crystal waveguides, however, these approaches face challenges such as limited field of view, complicated control electronics, and high requirement of the laser.

SUMMARY

An optical switch includes a bus waveguide supported by a substrate, a coupling waveguide suspended over the bus waveguide, a reaction electrode coupled with, and adjacent to, the coupling waveguide, an actuation electrode supported by the substrate and configured to control a position of the coupling waveguide relative to the bus waveguide via the reaction electrode, and an optical antenna coupled with the coupling waveguide and disposed at a fixed distance from the bus waveguide. When a voltage difference between the reaction electrode and the actuation electrode is less than a lower threshold, the coupling waveguide is positioned a first distance from the bus waveguide, when the voltage difference between the reaction electrode and the actuation electrode is greater than an upper threshold, the coupling waveguide is positioned a second distance from the bus waveguide, and the second distance is less than the first distance.

A beam steering system includes a bus waveguide supported by a substrate, a coupling waveguide suspended over the bus waveguide, a reaction electrode coupled with, and adjacent to, the coupling waveguide, an actuation electrode supported by the substrate and configured to control a position of the coupling waveguide relative to the bus waveguide via the reaction electrode, and optical antenna, an optical tree, and a lens. The optical antenna is coupled with the coupling waveguide and disposed at a fixed distance from the bus waveguide. The optical tree has at least one type of optical switch and configured to distribute light to the optical antenna. The lens is spaced apart from the substrate and configured to diffract the light emitted by the optical antenna. When a voltage difference between the reaction electrode and the actuation electrode is less than a lower threshold, the coupling waveguide is positioned a first distance from the bus waveguide, when the voltage difference between the reaction electrode and the actuation electrode is greater than an upper threshold, the coupling waveguide is positioned a second distance from the bus waveguide, and the second distance is less than the first distance.

A beam steering system includes a bus waveguide supported by a substrate, a coupling waveguide suspended over the bus waveguide, a reaction electrode coupled with, and adjacent to, the coupling waveguide, an actuation electrode, an optical antenna, an optical tree, and a lens. The actuation electrode is supported by the substrate and configured to control a position of the coupling waveguide relative to the bus waveguide via the reaction electrode. The optical antenna is coupled with the coupling waveguide. The optical tree has at least one type of optical switch and configured to collect light from the optical antenna. The lens is spaced apart from the substrate and configured to diffract the light received from the optical antenna. When a voltage difference between the reaction electrode and the actuation electrode is less than a lower threshold, the coupling waveguide is positioned a first distance from the bus waveguide, when the voltage difference between the reaction electrode and the actuation electrode is greater than an upper threshold, the coupling waveguide is positioned a second distance from the bus waveguide, and the second distance is less than the first distance.

BRIEF DESCRIPTION OF THE DRAWINGS

FIG. 16 is a perspective view of a bus waveguide and a corresponding coupler waveguide.

FIG. 17 is a graphical representation of coupling field profile with respect to distance.

FIG. 18 is a series of 2-dimension graphical representations of coupling field profiles with respect to propagation distance.

FIG. 37 is intentionally left blank.

FIG. 38 is intentionally left blank.

FIG. 56A is a cross sectional view of a coupler waveguide with a bi-stable membrane in an OFF position.

FIG. 56B is a cross sectional view of a coupler waveguide with a bi-stable membrane in an ON position.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within +0%, 0.1%, 0.5%, 1%, 2%, 3%, 4%, 5% or 10% of the value or relative characteristic.

Although in this application different embodiments are illustrated with the use of silicon MEMS structures, the MEMS structures may be other MEMS material such as SiC, SiN, This disclosure presents microelectromechanical system (MEMS) switches, switch arrays, and systems including MEMS switches with coupler cantilever and multiple fixed optical antenna configurations. Such MEMS switches can be used to couple light from a waveguide on photonic integrated circuit (PIC) chip to free space in various applications.

Lidar is a key enabler for many new systems such as autonomous driving. Chip-Lidar (also known as solid-state Lidar, Lidar on a chip) is expected to be widely used in future autonomous vehicles due to its compact size and low cost. Nevertheless, many challenges still remain in creating a practical chip-Lidar meeting the requirements from OEMs. One of the challenges is beam steering. Various approaches have been developed to steer beam in chip-Lidar, such as micro mirror array, optical phased array, wavelength tuning, photonic crystal waveguides, etc. However, these approaches are facing one or more challenges such as limited field of view, complicated control electronics, high requirement of laser, low technology maturity, etc.

Figure 1:
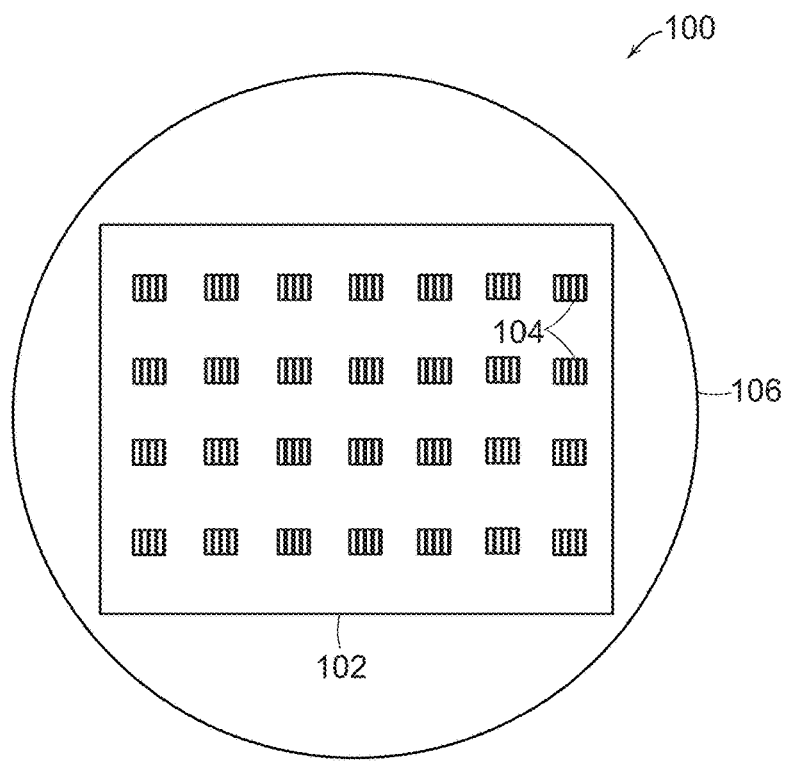
FIG. 1 is a top view of an optical switch array system.
Figure 2:
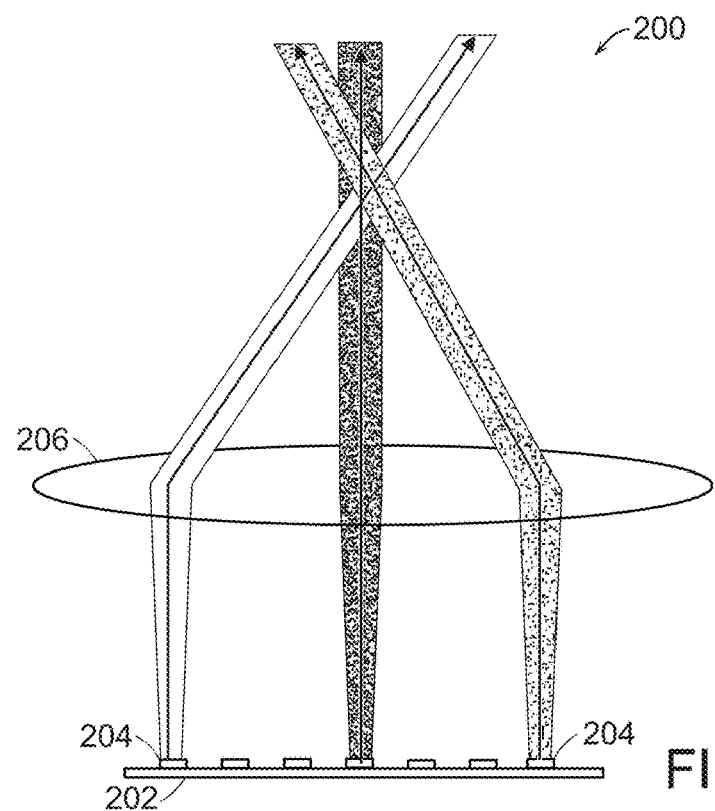
FIG. 2 is a side view of an optical switch array system.

Besides the approaches mentioned above, an optical amplitude array can also steer optical beam in chip-Lidar. FIG. 1 is a top view of an optical switch array system 100. The system 100 includes a photonic integrated circuit (PIC) chip 102, multiple optical sources/optical antennae 104, and a lens 106. FIG. 2 is a side view of an optical switch array system 200. The system 200 includes a photonic integrated circuit (PIC) chip 202, multiple optical sources/optical antennae 204, and a lens 206.

As shown in FIG. 1 (top view) and FIG. 2 (side view), an optical amplitude array consists of an array of optical sources or optical antennas (e.g., 104, 204)(each optical source or optical antenna can be regarded as one "pixel") and a lens or lens system (e.g., 106, 206) ("lens" is used in the following description for simplicity), with the optical pixel array locating at the focal plane (or in close proximity to the focal plane) of the lens. The light amplitude emitting from each optical pixel can be either 0 (no light emission) or 1 (full light emission). The emitted light from each optical pixel experiences refraction when passing through the lens and is deflected into certain direction following physical optical laws. By switching on an optical pixel at different positions, light can be controlled and steered into different directions in free space, and thus beam steering is achieved. A two-dimensional (2D) arranged optical pixel array can realize 2D beam steering.

There are various ways to make an optical pixel array. For example, such an array can be made up of an array of optical sources, such as Vertical-External-Cavity Surface-Emitting-Laser (VECSELs). Such an array can also be composed of a waveguide array with optical antenna array controlled by optical switch array. In this disclosure, methods are explored including optical MEMS switch arrays configured to control light emission from the optical antennas.

This disclosure includes beam steering enabled by a MEMS switch based amplitude array. Such MEMS switch based amplitude array consists of a waveguide array with MEMS switchable antennas being located at or in close proximity to the focal plane of a lens. Switching on optical antennas at different positions can steer the beam to different directions, as shown in FIG. 1 and FIG. 2.

Compared to the micro mirror array based beam steering, the amplitude array beam steering can reach a larger field-of-view. Compared to optical phased array beam steering, the amplitude array beam steering requires much simpler control electronics. Compared to wavelength tuning based beam steering, the amplitude array beam steering does not require large wavelength tunability of the laser source. Compared to the photonic crystal waveguide based beam steering, the amplitude array beam steering is more straightforward and technically more stable.

There are many options for optical switches. The most common ones that can be used in the amplitude array application include micro mirror based switches, liquid-crystal switches, thermo-optical switches, etc. The micro mirror based switches and liquid-crystal switches have a relatively large size such as hundreds of micrometers, and require switching time in the millisecond range, which makes each pixel too large and too slow for the chip-Lidar application. The thermo-optical switches, on the other hand, have low extinction ratio and high insertion loss, which is also not good for this application. MEMS structure based optical switch can be compact and fast switching and have high extinction ratio, therefore this technology is a good candidate for the amplitude array application.

Figure 3:
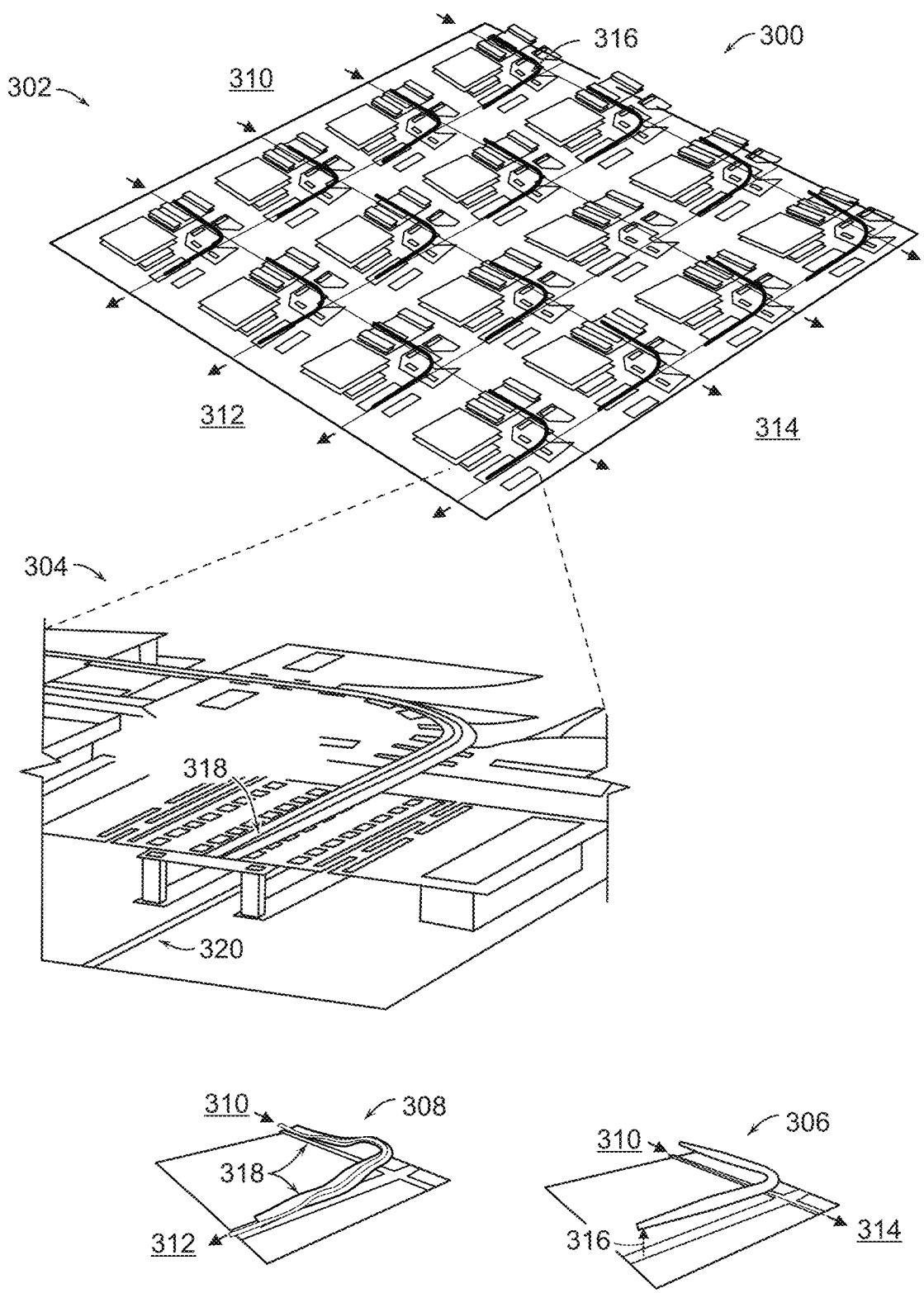
FIG. 3 is a perspective view of a silicon photonic switch array.

FIG. 3 is a perspective view of a silicon photonic integrated switch (PIC) array 300. The array has in-ports 310, through ports 314, and drop ports 312, such that when a low-loss crossing 316, such as an optical switch, is activated the light travels from the in-port 310 to through the low-loss crossing 316 to the drop port 312. For the light to travel from the in-port 310 to the low-loss crossing 316, a MEMS actuated adiabatic coupler must be a certain distance from the bus waveguide. When a low-loss crossing 316 is not activated the light travels from the in-port 310 to the through port 314.

A close-up view of an optical switch element of the array 304 includes a MEMS actuated adiabatic coupler 318 and a bus waveguide 320. An illustration of the optical switch in an off state 306, in which light passes from the input 310 to the output 314 while the cantilever coupler is a distance 316 from the bus waveguide such that the coupling efficiency is less than 1%. An illustration of the optical switch in an on state 308, in which light passes from the input 310 to the output 312 while the cantilever coupler 318 is activated such that light from the bus waveguide couples with the output 312 with a coupling efficiency greater than 50%.

As shown in FIG. 3, such a silicon photonic MEMS switch network employs two orthogonal sets of bus waveguides and MEMS-actuated vertical adiabatic couplers. The vertical gap distance can be controlled by MEMS electrostatic actuators and the mechanical stoppers. In the OFF state, the adiabatic couplers are located far above the waveguides, so light continues to propagate toward the through port without interruption. In the ON state, the adiabatic couplers are moved toward the bus waveguides, and light is coupled to the adiabatic couplers, and then coupled out to the drop port by another adiabatic coupler.

MEMS switch can be used to selectively couple light in and out of a waveguide in an optical transmit/receive terminal. In one embodiment, each optical switch may be implemented by a physically translatable optical grating. In the OFF state, the translatable optical grating is sufficiently far above the bus waveguide, and in the ON state, MEMS actuators can move the translatable optical grating down towards the bus waveguide for efficient light coupling between the grating and the bus waveguide.

Figure 4A:
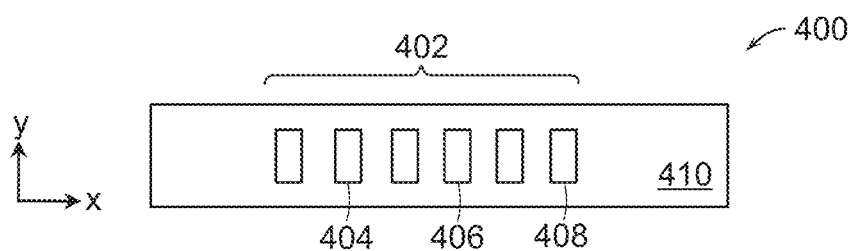
FIG. 4A is a top view of an optical switch of an optical switch array.
Figure 4B:
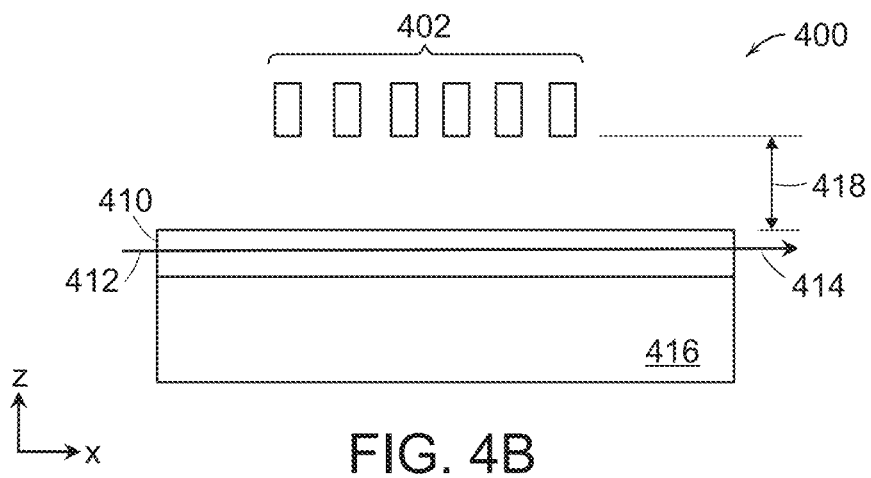
FIG. 4B is a side view of an optical switch of an optical switch array in an OFF state.
Figure 4C:
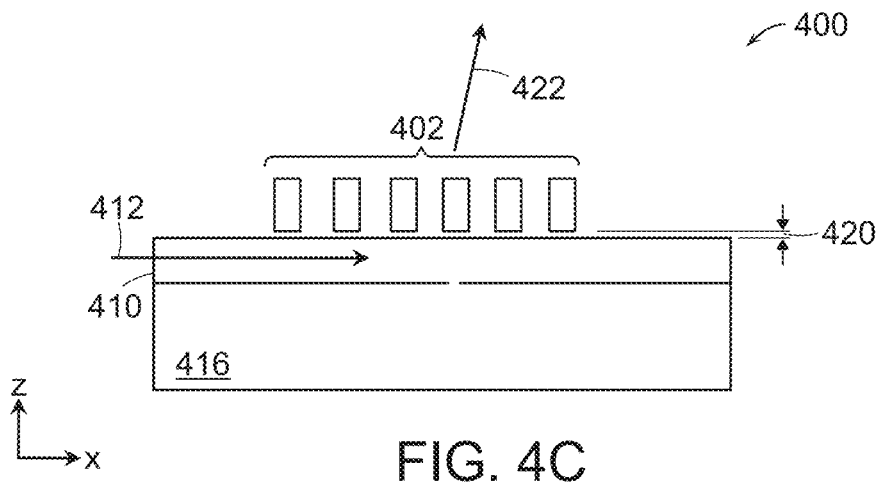
FIG. 4C is a side view of an optical switch of an optical switch array in an ON state.

FIG. 4A is a top view of an optical switch 400. The optical switch 400 includes a grating 402 that comprises multiple optical coupler elements 404, 406, 408 that are aligned with a bus waveguide 410. FIG. 4B is a side view of the optical switch 400 in an OFF state. A wave 412 travels in a direction 414 in the bus waveguide 410. The bus waveguide is supported by a substrate 416 and in the OFF state, the grating 402 is a distance 418 above the bus waveguide 410 such that the coupling efficiency between the grating 402 and bus waveguide 410 is low and the wave continues to propagate in the bus waveguide 410. FIG. 4C is a side view of the optical switch 400 in an ON state. In this figures, the grating 402 is a distance 420 above the bus waveguide 410 such that the coupling efficiency between the grating 402 and bus waveguide 410 is high and the wave refracts 422 into free space from the bus waveguide 410.

Figure 5A:
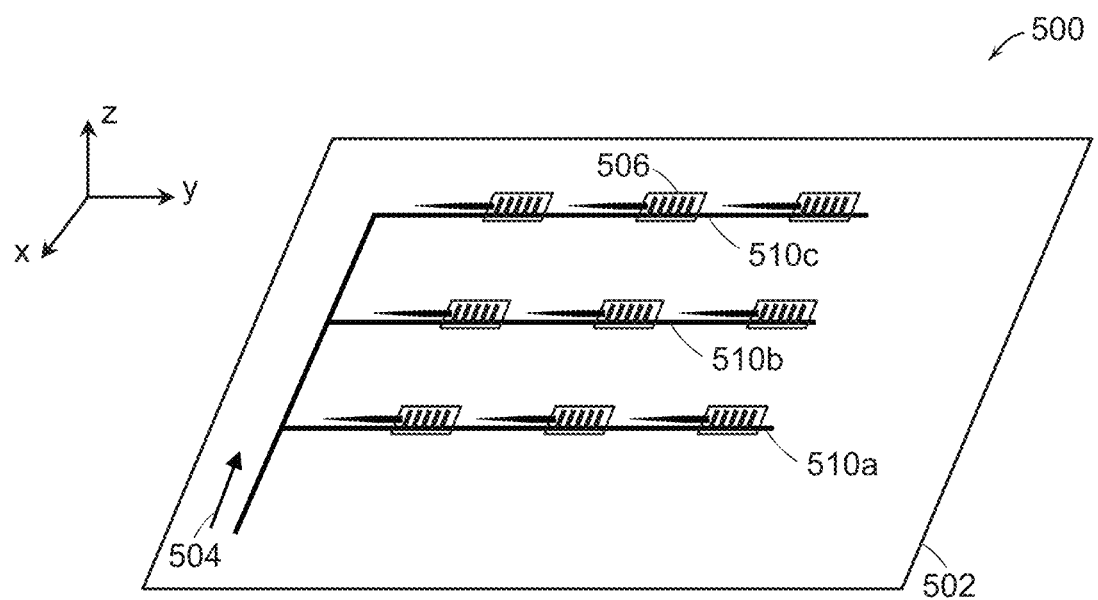
FIG. 5A is a perspective view of an optical switch with an optical coupled cantilever and fixed optical antenna in a switch array.

In this disclosure, multiple MEMS switch embodiments are including a MEMS switch with coupler cantilever and optical antenna. FIG. 5A illustrates an array of such MEMS switch used in optical terminals. Here gratings are used as an optical antenna in an example to illustrate the concept, other optical antennas (e.g. FIG. 5B) also work in this concept.

FIG. 5A is a perspective view of an optical switch with an optical coupled cantilever and fixed optical antenna in a switch array 500. The switch array 500 may be on a single substrate 502 or can be configured as a multi-chip module in which multiple optical switches are monolithically integrated on a photonic integrated circuit (PIC) chip that is then combined with other PIC chips to form the array system 500. The single substrate photonic integrated circuit (PIC) chip 502 includes a bus waveguide configured to input light 504 and distribute the light among multiple rows 510 and columns of optical switches. Here three rows are configured as a first row 510a, a second row 510b, and a third row 510c in which each row has three columns of optical switches 506.

Figure 5B:
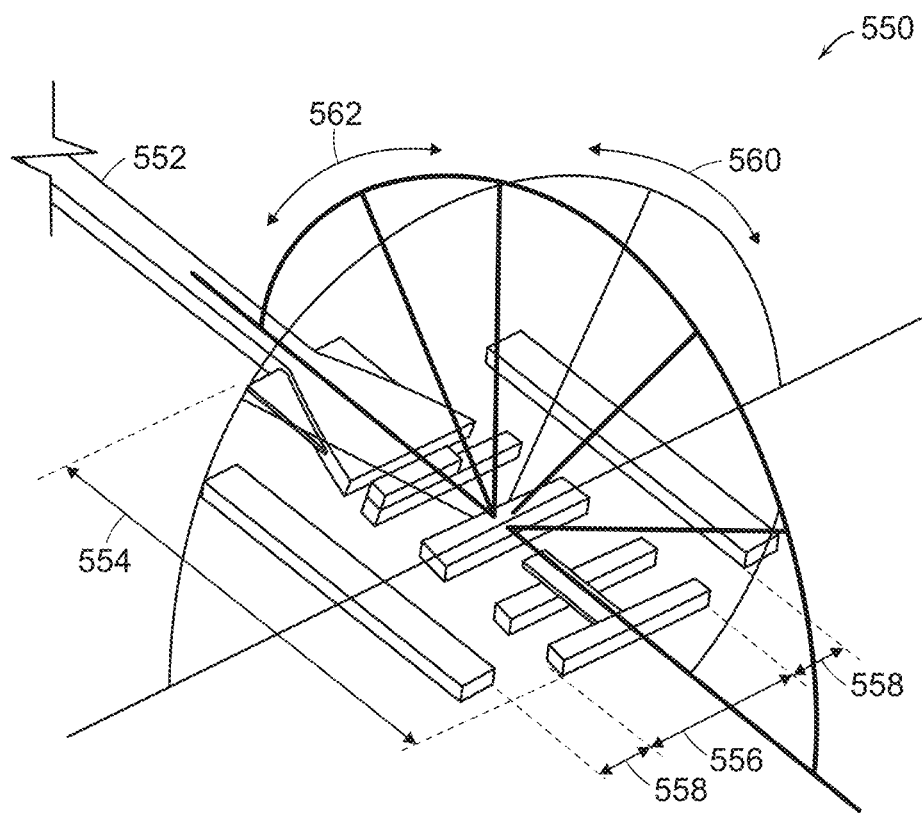
FIG. 5B is a perspective view of a 2 dimensional fixed optical antenna.

FIG. 5B is a perspective view of a 2-dimensional fixed optical antenna 550. The optical antenna includes a coupler cantilever 552 and an optical antenna that had a length 554 and width 556. The ratio of length 554 to width 556 could be substantially 3:1, 5:2, 2:1, or similar. With a gap 558 between the optical antenna and side that may be substantially 0.2, 0.3, 0.4, 0.5, 0.6 of the width 556. The optical antenna can be configured to substantially output or receive light along an angle in a x-axis 560 and along an angle in a y-axis 562.

Figure 6:
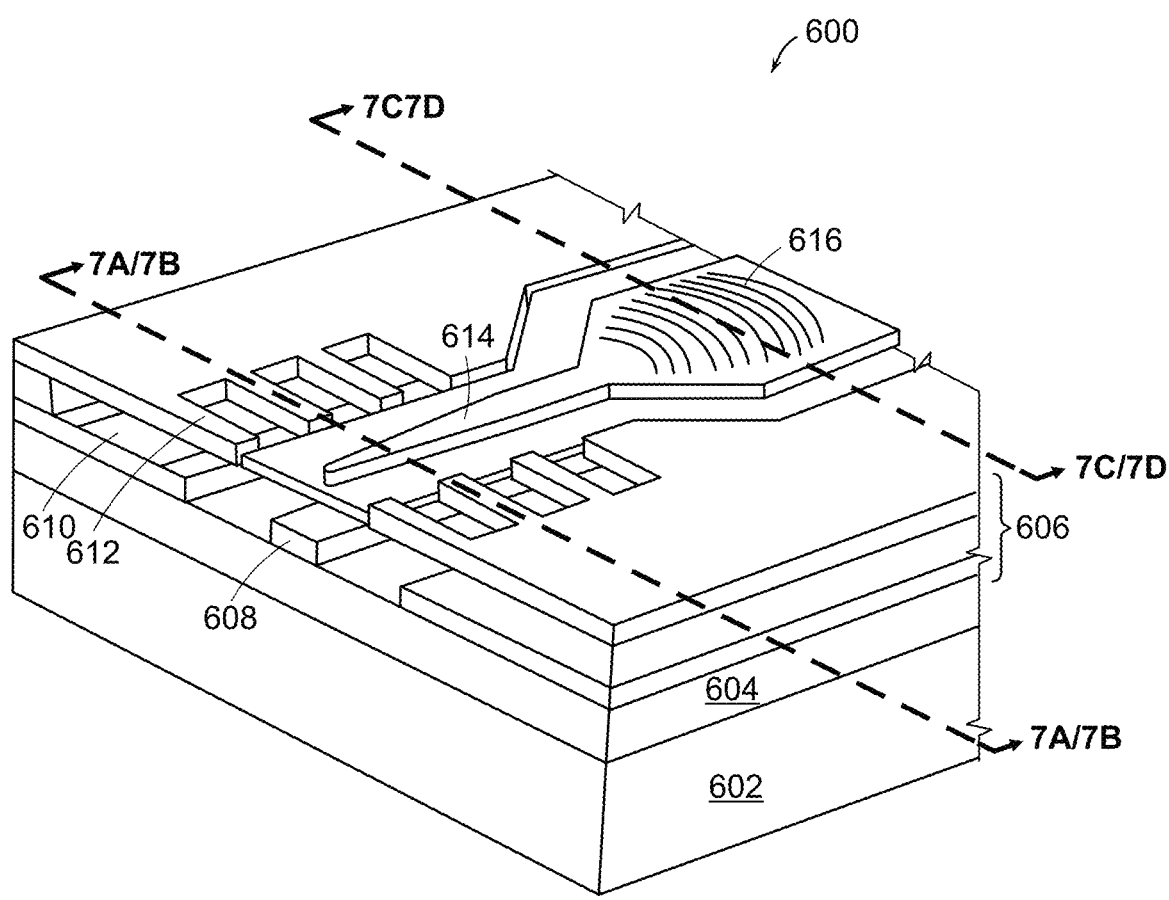
FIG. 6 is a perspective view of an optical coupled cantilever with a fixed optical antenna.

FIG. 6 is a perspective view of a MEMS switch 600 with an optical coupled cantilever 614 and a fixed optical antenna 616. The MEMS switch 600 includes a substrate 602 such as a silicon substrate with an insulating layer 604 such as silicon dioxide. On top of the insulating layer 604 are structure layers 606, such as silicon layers. In the structure layers 606 are structures such as a bus waveguide 608, a MEMS actuation electrode 610, a MEMS spring 612, the coupling cantilever 614, and the optical antenna 616. In this embodiment, the coupling waveguide 614 moves or articulates based on MEMS principles. For example, the MEMS actuation electrode 610 could be configured to corporate with a reaction electrode located adjacent to the coupling waveguide and between the MEMS spring 612 and coupling waveguide 614. When a voltage difference is applied between the reaction electrode and the actuation electrode that is less than a lower threshold, the coupling waveguide is held via electrostatic forces at a first distance from the bus waveguide. The lower threshold may be a low differential voltage such as 0 volts or some low voltage around zero volts such as −5, −4, −3, −2, −1, 1, 2, 3, 4, or 5 volts. A voltage below this lower threshold, the coupling cantilever may either maintain a rest position, or possible slightly move such that the coupling efficiency between the bus waveguide 608 and the optical antenna 616 via the coupling waveguide 614 is less than 1% (e.g., turned off). Similarly when the voltage difference between the reaction electrode and the actuation electrode 610 is greater than an upper threshold, the coupling waveguide is held via electrostatic forces at a second distance from the bus waveguide 608 in which the second distance is less than the first distance. For example, at the second distance, the coupling efficiency between the bus waveguide 608 and the optical antenna 616 via the coupling waveguide 614 may be greater than 50% (e.g., turned on).

In other words, FIG. 6 is a schematic of a single MEMS switch 600 consisting of a movable optical coupler 614 and a fixed optical antenna 616. The optical coupler 614 can be moved to be close enough to the bus waveguide so that a sufficient amount of light will be coupled out from bus waveguide 608 to the coupler waveguide 614. One example of such an optical coupler can be tapered waveguide, and electrostatic actuated cantilever can move the optical coupler up and down. The optical antenna 616 is on the same layer with the optical coupler, but it is fixed. The light from the optical coupler can be emitted to free space via the optical antenna, and vice versa, the light from free space can also be coupled back to the optical coupler via the optical antenna, then further coupled back to the bus waveguide.

The MEMS switch includes a substrate 700 such as a silicon substrate with an insulating layer 702 such as silicon dioxide. On top of the insulating layer 702 is a silicon layer 704. The first three layers (700, 702, 704) may be a Silicon on Insulator (SoI) substrate. The next layer may be an oxide 706, such as a low-temperature oxide (LTO), that is used to form anchor points. The top layer may be a Silicon layer 708, such as a Poly-silicon layer that may be deposited via Plasma Enhanced Chemical Vapor Deposition (PECVD) or Low Pressure Chemical Vapor Deposition (LPCVD). In this embodiment, the structures such as bus waveguide 608 and MEMS actuation electrode 610 are in the silicon layer 704 while the MEMS spring 612, the coupling cantilever 614, reaction electrode, and the optical antenna 616 are in the poly-silicon layer 708.

Figure 7A:
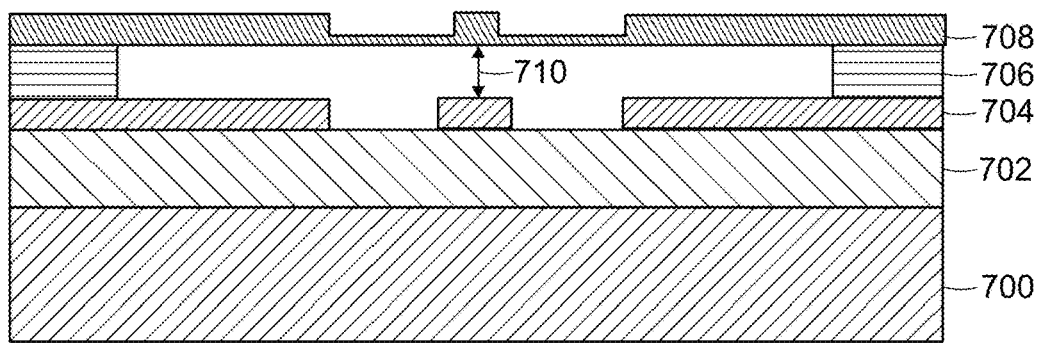
FIG. 7A is a cut view of the optical coupled cantilever of the MEMS switch of FIG. 6 in an idle state.

FIG. 7A is a cut view of the optical coupled cantilever of the MEMS switch of FIG. 6 in an idle state. When in the idle or off state, the cantilever of the poly-silicon layer 708 may be a first distance from the bus waveguide of the silicon layer 704 as a voltage difference between the reaction electrode and the actuation electrode is less than the lower threshold. And the coupling efficiency between the bus waveguide 608 and the optical antenna 616 via the coupling waveguide 614 is less than 1% (e.g., turned off).

Figure 7B:
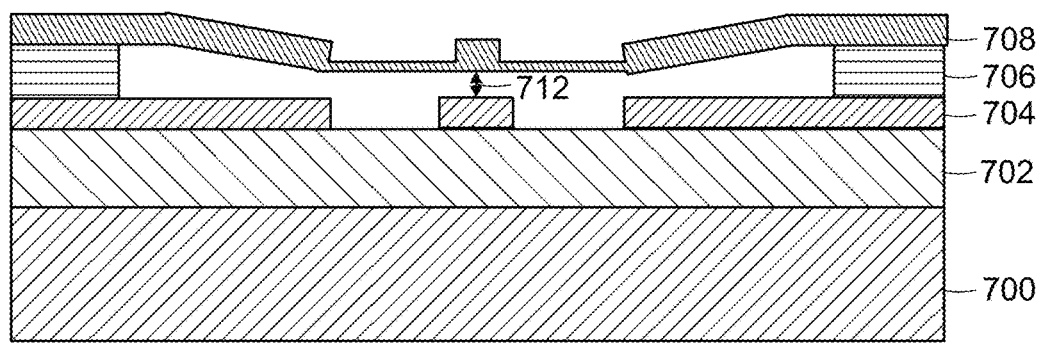
FIG. 7B is a cut view of the optical coupled cantilever of the MEMS switch of FIG. 6 in an actuated state.

FIG. 7B is a cut view of the optical coupled cantilever of the MEMS switch of FIG. 6 in an actuated state. When in the on state, the cantilever of the poly-silicon layer 708 may be a second distance from the bus waveguide of the silicon layer 704 as a voltage difference between the reaction electrode and the actuation electrode is greater than the upper threshold. And the coupling efficiency between the bus waveguide 608 and the optical antenna 616 via the coupling waveguide 614 is greater than 50% (e.g., turned on).

Figure 7C:
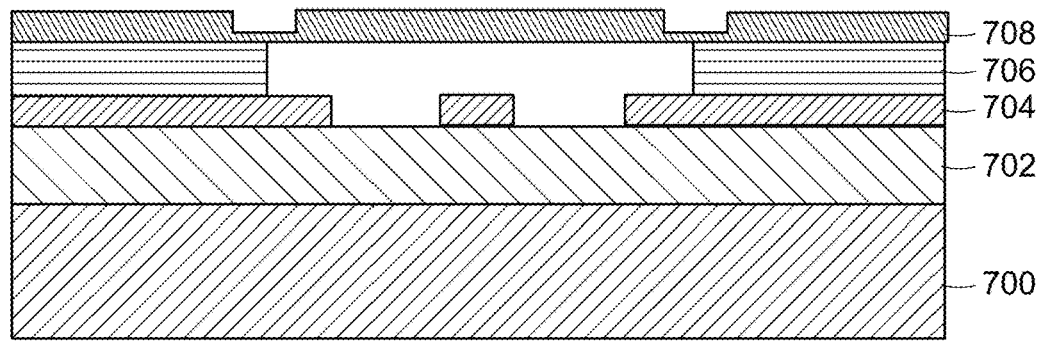
FIG. 7C is a cut view of the fixed optical antenna of the MEMS switch of FIG. 6 in an idle state.

FIG. 7C is a cut view of the fixed optical antenna of the MEMS switch of FIG. 6 in an idle state. When in the off state, the optical antenna of the poly-silicon layer 708 may substantially be the first distance from the bus waveguide of the silicon layer 704.

Figure 7D:
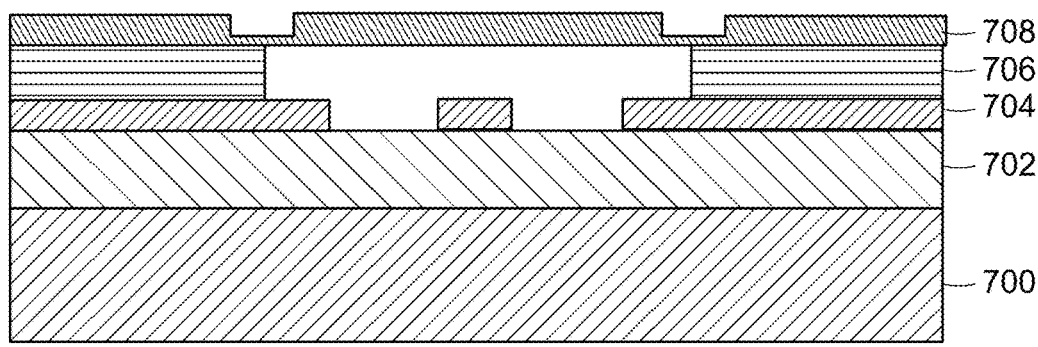
FIG. 7D is a cut view of the fixed optical antenna of the MEMS switch of FIG. 6 in an actuated state.

FIG. 7D is a cut view of the fixed optical antenna of the MEMS switch of FIG. 6 in an actuated state. When in the on state, the optical antenna of the poly-silicon layer 708 is maintained substantially to be the first distance from the bus waveguide of the silicon layer 704.

FIGS. 7A-D illustrate the cross section of the optical coupler and optical antenna in an ON and OFF state, respectively. The advantage of this concept is that it imposes less design restrictions on the MEMS switch design than in current state of the art. The operation frequency of the Lidar system requires very high switching/movement speeds. This translates into a limitation of the translated mass which requires a trade-off with the antenna and coupler design. In this disclosure, however, the antenna remains static and thus can be designed with much greater freedom, e.g. it can have a larger in-plane extension vertical to the bus waveguide which translates into a favorable narrower emitted light beam profile. For example, for the design in FIG. 6, the fan angle of the optical antenna can be larger, the area of antenna along bus waveguide and across waveguide can both be larger so that the output beam will be narrower. The narrower beam is helpful to reach a better angular resolution in beam steering.

If the antenna is not fixed, the area of the antenna will be preferably to be limited to 30×30 um$^2$ or less, with the antenna being fixed, there is no such a limitation. In addition, the optical antenna can have more freedom in terms of periods and aspect ratio, which can increase its emission efficiency. For example, because there is no hard limitation of the surface area and mass of the fixed antenna, it can have a larger extension along the waveguide, meaning having more periods. The aspect ratio is limited by the mass of the antenna. Without limitation on the mass, the aspect ratio can be designed mainly based on the emission efficiency rather than a trade-off between emission efficiency and antenna mass. And the optical coupler can be designed to have a smaller dimension and lighter weight without antenna being movable, therefore, fast switching operation and optimized output beam quality can be achieved in this MEMS switch design.

In another embodiment, more than one coupling cantilevers can be coupled to each antenna. They can be connected to opposite ends of the antenna providing separate emit and receive channel. The emit cantilever would be oriented towards the laser source whereas the receive cantilever would be oriented towards the light detector using either the same waveguide for light coupling or using separate waveguides. Separate emit and receive channels could be operated independently enabling additional functionalities. For example, the light could be received from several pixels surrounding the current emitting pixel thus increasing overall light collection efficiency.

Figure 8:
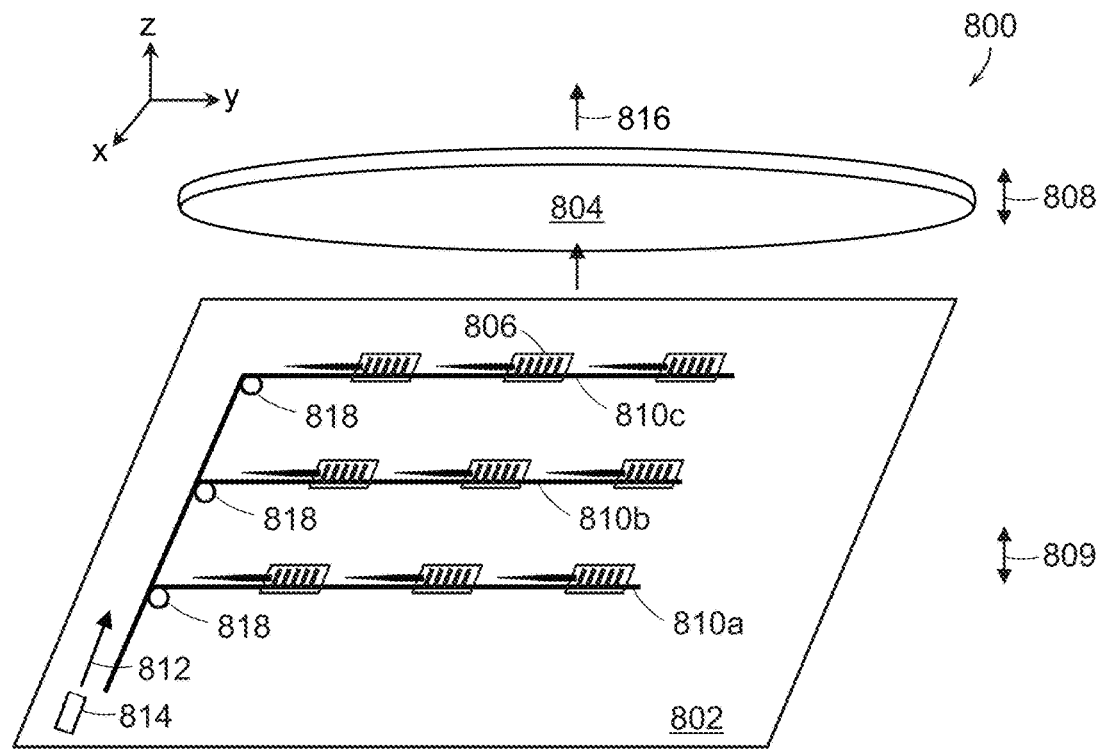
FIG. 8 is a perspective view of an optical switch array system transmitting an optical signal.

An array of MEMS switch can be organized in a rectangular pattern (FIG. 8), round pattern or other patterns in an optical terminal. Combined with a lens, this terminal can work as an optical transmitter with the emitting beam steered to various directions (e.g., FIG. 8). FIG. 8 is a perspective view of an optical switch array system 800 transmitting an optical signal. Here a substrate 802, can be a monolithic chip such as a silicon chip, Silicon on Insulator (SoI) chip, Silicon carbide chip. Silicon Nitride chip, or other monolithic MEMS chip, or the substrate can be a multi-chip module on a substrate. Each optical antennae 806 is configured to be aligned with a bus waveguide 810, for example in this embodiment, there is a first bus waveguide 810a, a second bus waveguide 810b, and a third bus waveguide 810c. In this embodiment, each bus waveguide 810 coupled with a main bus waveguide via a type I switch 818. That is coupled with a light source 814 (e.g., laser, LED, etc.) such that light emitted from the light source 814 travels along a direction 812 and it distributed via the type I switches 818 to the optical antennae 806. Positioned near the chip is a lens 804 that is configured to create a collimated beam of light 816 from optical antennae 806 via the lens 804. In this embodiment, the beam of light 816 can be collimated by translating the lens 804 along an axis 808 perpendicular to substrate 802 and optical antennae 806, or by translating the substrate 802 and optical antennae 806 along an axis 809 perpendicular to lens 804.

Figure 9:
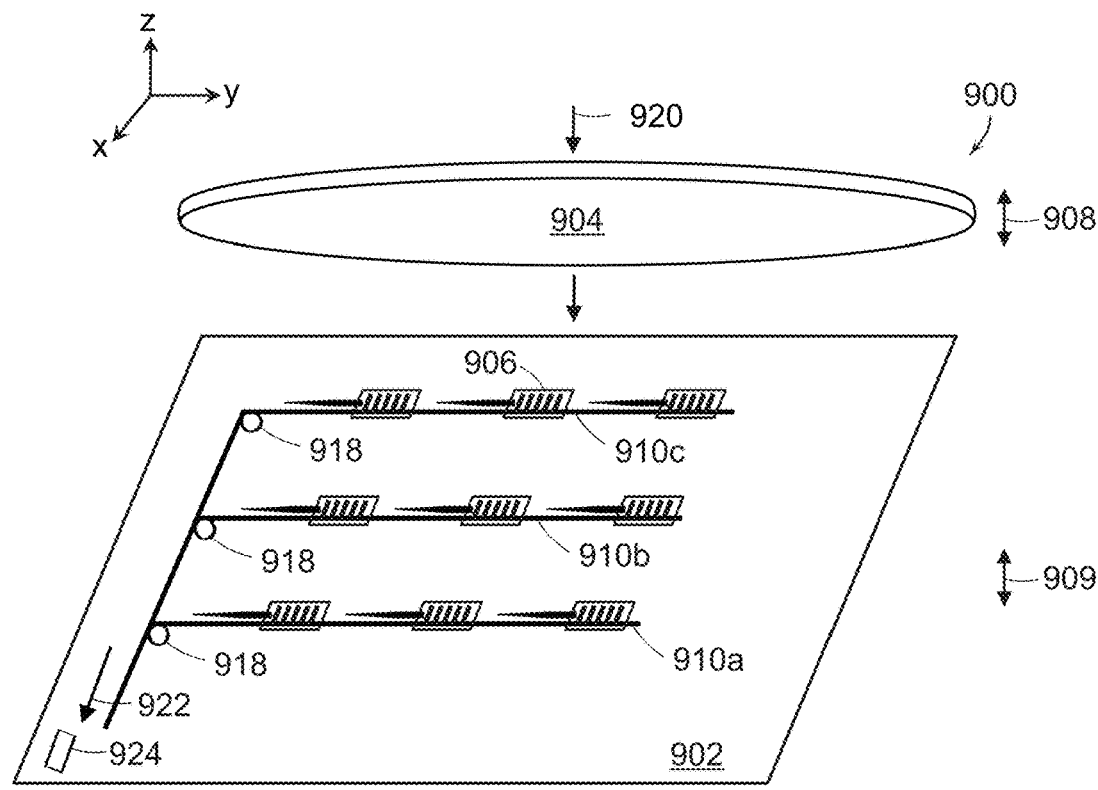
FIG. 9 is a perspective view of an optical switch array system receiving an optical signal.

Such terminal can also work as an optical receiver which can receive beam coming back from various directions and couple the beam back to PIC (FIG. 9). FIG. 9 is a perspective view of an optical switch array system 900 receiving an optical signal. Here a substrate 902, can be a monolithic chip such as a silicon chip, Silicon on Insulator (SoI) chip, Silicon carbide chip. Silicon Nitride chip, or other monolithic MEMS chip, or the substrate can be a multi-chip module on a substrate. Each optical antennae 906 is configured to be aligned with a bus waveguide 910, for example in this embodiment, there is a first bus waveguide 910a, a second bus waveguide 910b, and a third bus waveguide 910c. In this embodiment, each bus waveguide 910 coupled with a main bus waveguide via a type I switch 918. That is coupled with a light detector 924 (e.g., photo diode, photo transistor, CCD, etc.) such that light is collected from the light detector 924 as the light travels along a direction 922 and is collected via the type I switches 918 that gathered via the optical antennae 906. Positioned near the chip is a lens 904 that is configured to gather a beam of light 920 to optical antennae 906 via the lens 904. In this embodiment, the beam of light 920 can be focused by translating the lens 904 along an axis 908 perpendicular to substrate 902 and optical antennae 906, or by translating the substrate 902 and optical antennae 906 along an axis 909 perpendicular to lens 904.

Figure 10:
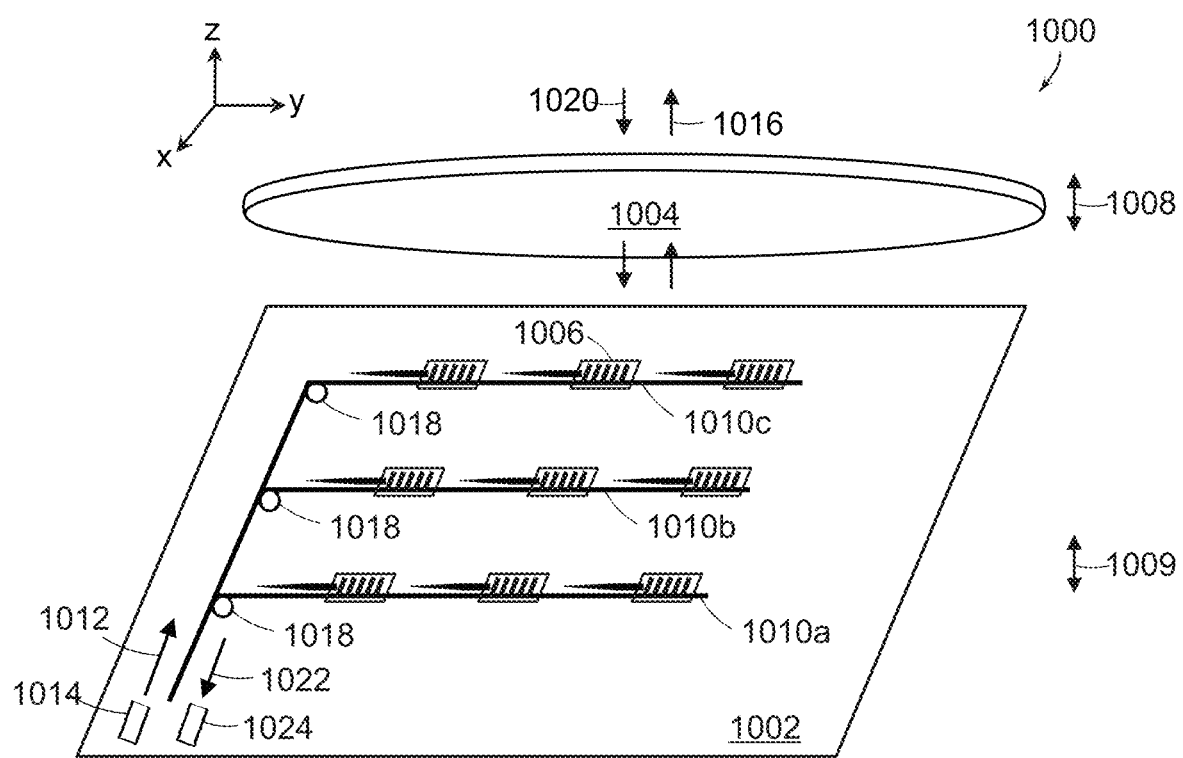
FIG. 10 is a perspective view of an optical switch array system receiving and transmitting optical signals.

Such terminal can also work as a transceiver, which can both transmit and receive beam (FIG. 10). FIG. 10 is a perspective view of an optical switch array system 1000 receiving and transmitting an optical signal. Here a substrate 1002, can be a monolithic chip such as a silicon chip, Silicon on Insulator (SoI) chip, Silicon carbide chip, Silicon Nitride chip, or other monolithic MEMS chip, or the substrate can be a multi-chip module on a substrate. Each optical antennae 1006 is configured to be aligned with a bus waveguide 1010, for example in this embodiment, there is a first bus waveguide 1010a, a second bus waveguide 1010b, and a third bus waveguide 1010c. In this embodiment, each bus waveguide 1010 coupled with a main bus waveguide via a type I switch 1018. That is coupled with a light detector 1024 (e.g., photo diode, photo transistor, CCD, etc.) such that light is collected from the light detector 1024 as the light travels along a direction 1022 and is collected via the type I switches 1018 that gathered via the optical antennae 1006. Positioned near the chip is a lens 1004 that is configured to gather a focus beam of light 1020 from optical antennae 1006 via the lens 1004. In this embodiment, the beam of light 1020 can be focused by translating the lens 1004 along an axis 1008 perpendicular to substrate 1002 and optical antennae 1006, or by translating the substrate 1002 and optical antennae 1006 along an axis 1009 perpendicular to lens 1004. And, That is coupled with a light source 1014 (e.g., laser, LED, etc.) such that light emitted from the light source 1014 travels along a direction 1012 and it distributed via the type I switches 1018 to the optical antennae 1006. Positioned near the chip is a lens 1004 that is configured to create a collimated beam of light 1016 from optical antennae 1006 via the lens 1004. In this embodiment, the beam of light 1016 can be collimated by translating the lens 1004 along an axis 1008 perpendicular to substrate 1002 and optical antennae 1006, or by translating the substrate 1002 and optical antennae 1006 along an axis 1009 perpendicular to lens 1004. If such terminal works as a transmitter only, an independent optical photodetector or photodetector array, or a receiver like shown in FIG. 9 can be used as receiver. Similarly, if such terminal uses as a receiver only, other optical emitter, emitter array, or transmitter similar to what shown in FIG. 8 can be used as an independent transmitter.

Although not limited to the embodiments presented, in the design embodiments mentioned above, the lens and/or the MEMS switch array chip can be integrated with mechanical structure so that one or both of them can move along z-direction, as shown in FIG. 8-10. The advantage of including this freedom is to be able to adjust the distance between the lens and the MEMS switch array chip to maximize the transmitting efficiency and receiving efficiency from/into each pixel.

Figure 11:
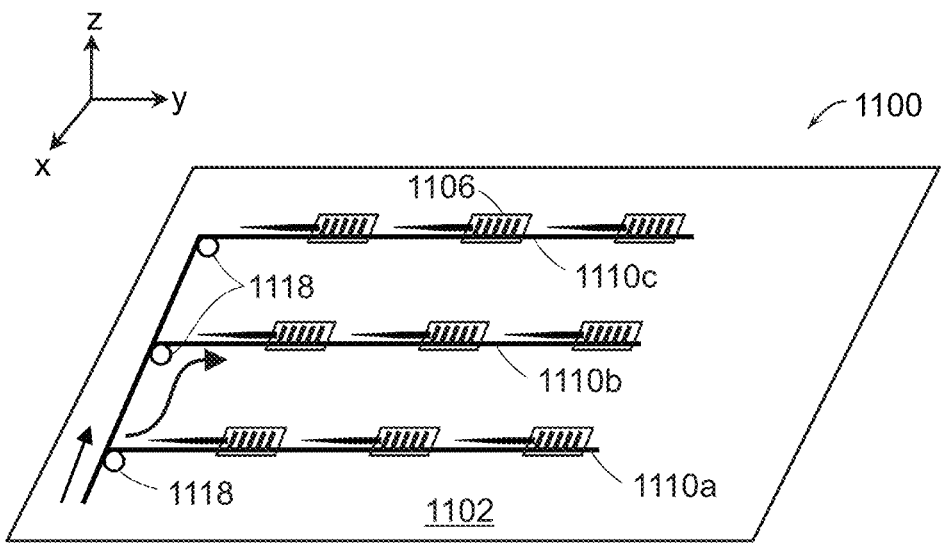
FIG. 11 is a perspective view of an optical switch array system including at least two types of optical switches.

The proposed system can be used in chip-Lidar system, including time-of-flight (ToF) operation and frequency modulated continuous wave (FMCW) operation. In a chip-Lidar system, light is coupled onto one waveguide of the PIC and then distribute into sub-waveguides. The proposed MEMS switch can combine with other types of binary switches (FIG. 11) or splitter optical trees (FIG. 12) or switches and splitter optical trees (FIG. 13) for light distribution. FIG. 11 is a perspective view of an optical switch array system 1100 including at least two types of optical switches. Here a substrate 1102 is illustrated with a cantilever coupling switch that is coupled with an optical antennae 1106 that is configured to be aligned with a bus waveguide 1110, for example in this embodiment, there is a first bus waveguide 1110a, a second bus waveguide 1110b, and a third bus waveguide 1110c. In this embodiment, each bus waveguide 1110 coupled with a main bus waveguide via a type I switch 1118.

Figure 12:
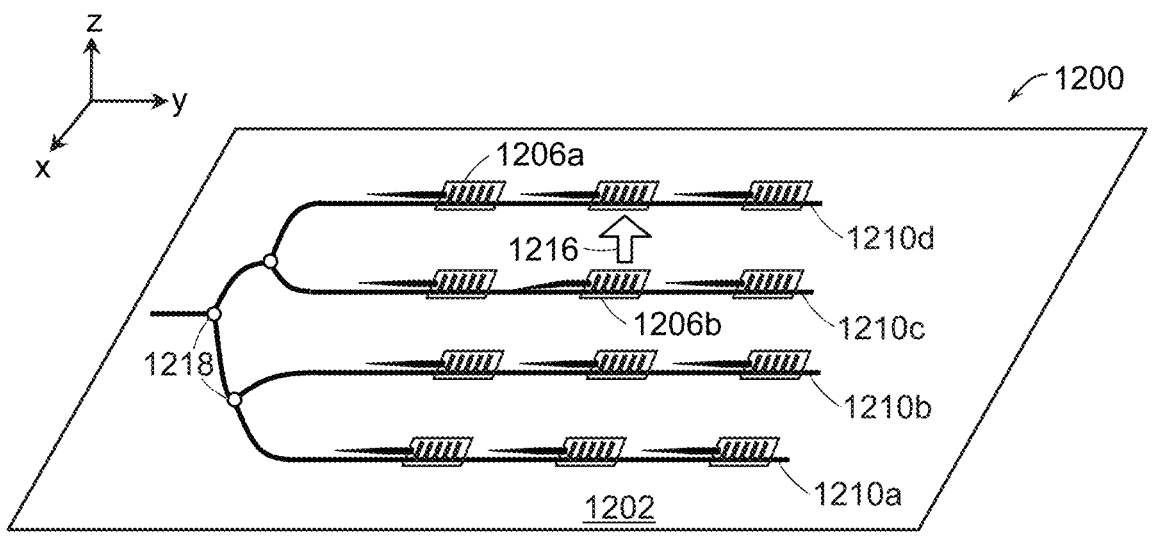
FIG. 12 is a perspective view of an optical switch array system including a splitter tree and an optical switch.

FIG. 11 shows a layout with two types of binary switches. Use the transmitting terminal as an example, light is propagating in the main waveguide. At the intersection of the main waveguide and the row waveguide, there's the type I switch to selectively guide the light into the selected row (the row of waveguide 1110b is selected in this example). And then light propagates in the selected row waveguide until it reaches the MEMS switch (switch type II) that is in ON state and emits out. The type I switch can be either MEMS switch or other switches such as thermo-optic switch, electro-optic switch, etc. FIG. 12 shows a layout with splitter trees and binary MEMS switches. FIG. 12 is a perspective view of an optical switch array system 1200 including a splitter tree and an optical switch. Here a substrate 1202 is illustrated with a cantilever coupling switch that is coupled with an optical antennae 1206 that is configured to be aligned with a bus waveguide 1210, for example in this embodiment, there is a first bus waveguide 1210a, a second bus waveguide 1210b, a third bus waveguide 1210c, and a fourth bus waveguide 1210d. In this embodiment, each bus waveguide 1210 is coupled with a main bus waveguide via a splitter tree 1218. Also, FIG. 12 illustrates a cantilever coupling and optical antenna 1206a in an off state, and a cantilever coupling and optical antenna 1206b in an on state such that light 1216 is radiated from the optical antenna 1206b via the coupling cantilever that is coupled with the bus guide 1210c when the coupling cantilever and optical antenna 1206b is turned on. The difference between these two layouts is that in the splitter tree layout, the optical power from the laser is distributed evenly into the waveguides, while in the combined binary switch layout, the light from the laser is selectively guided to a desired waveguide.

Figure 13:
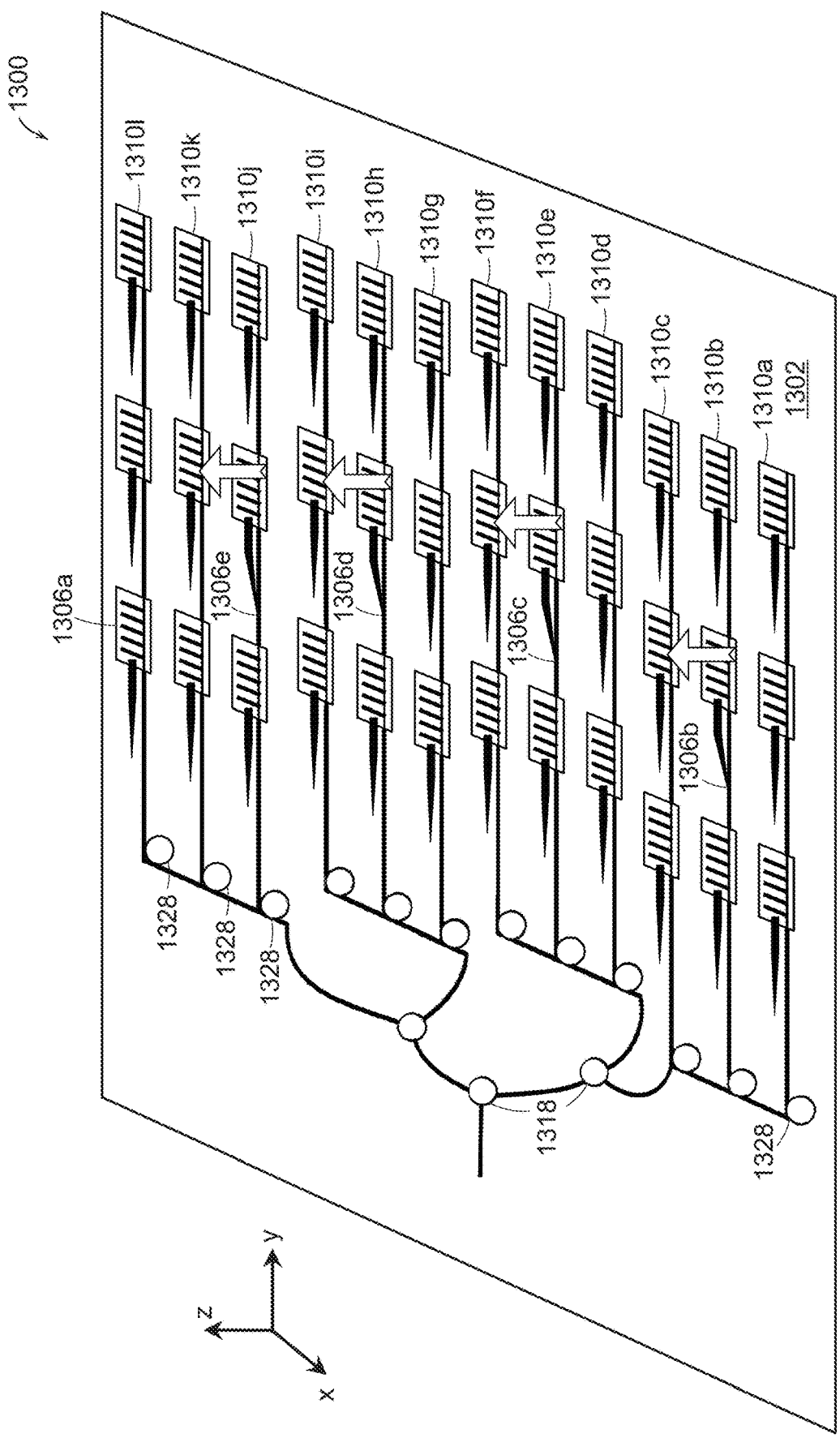
FIG. 13 is a perspective view of an optical switch array system including a splitter tree and at least two types of optical switches.

These two layout can be combined in a third layout, as shown in FIG. 13. FIG. 13 is a perspective view of an optical switch array system 1300 including a splitter tree and at least two types of optical switches. Here a substrate 1302 is illustrated with a cantilever coupling switch that is coupled with an optical antennae 1306 that is configured to be aligned with a bus waveguide 1310, for example in this embodiment, there is a first bus waveguide 1310a, a second bus waveguide 1310b, and a third bus waveguide 1310c. In this embodiment, each bus waveguide 1310 is coupled with a main bus waveguide via a splitter tree 1318 and a type I switch 1328. Also, FIG. 13 illustrates a cantilever coupling and optical antenna 1306a in an off state, and a cantilever coupling and optical antenna 1306b, 1306c, 1306d and 1306e in an on state such that light is radiated from the optical antenna 1306b, 1306c, 1306d, and 1306e via the coupling cantilever that is coupled with the bus guide 1310b, 1310e, 1310h and 1310j when the coupling cantilever and optical antenna 1306b, 1306c, 1306d, and 1306e is turned on. In this layout, light from the laser is distributed into several sections of waveguide subarrays, then in each waveguide subarray, binary switches are used to selectively guide the light to desired waveguides. This layout enables the MEMS switches in various subarrays to be controlled independently and simultaneously. All these layout can work in the MEMS switch array based transmitting, receiving and transceiving terminals.

Figure 14:
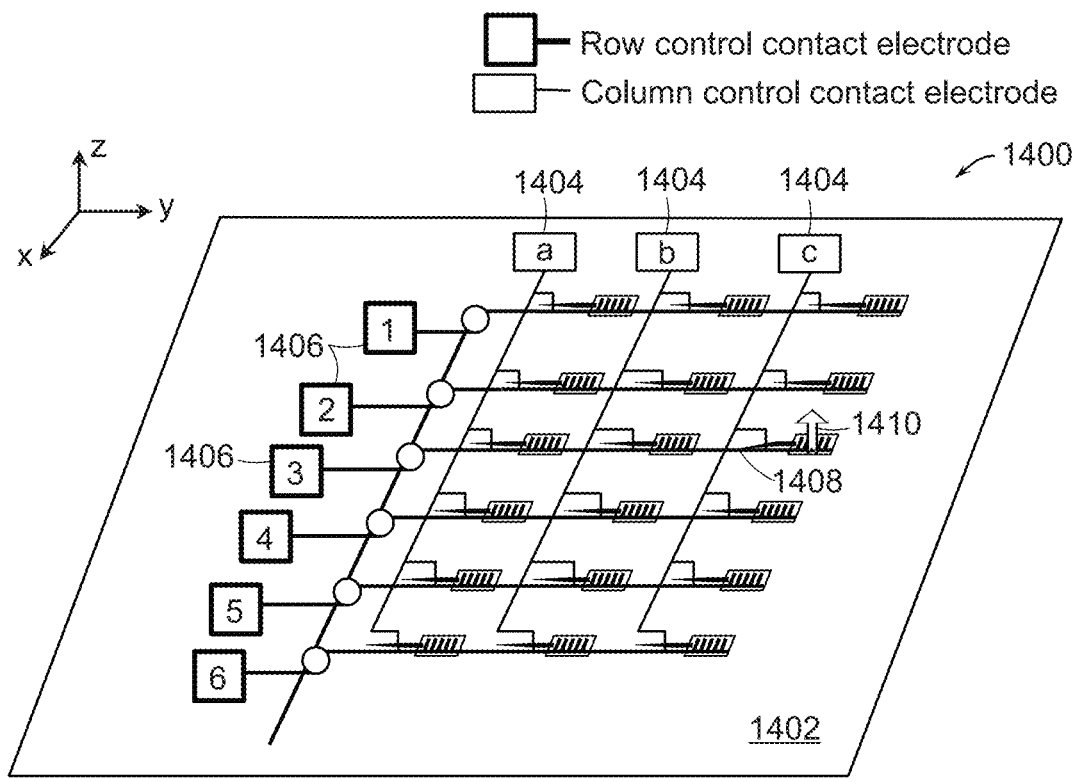
FIG. 14 is a diagram of a switch array system configured to independently address rows and columns.
Figure 15:
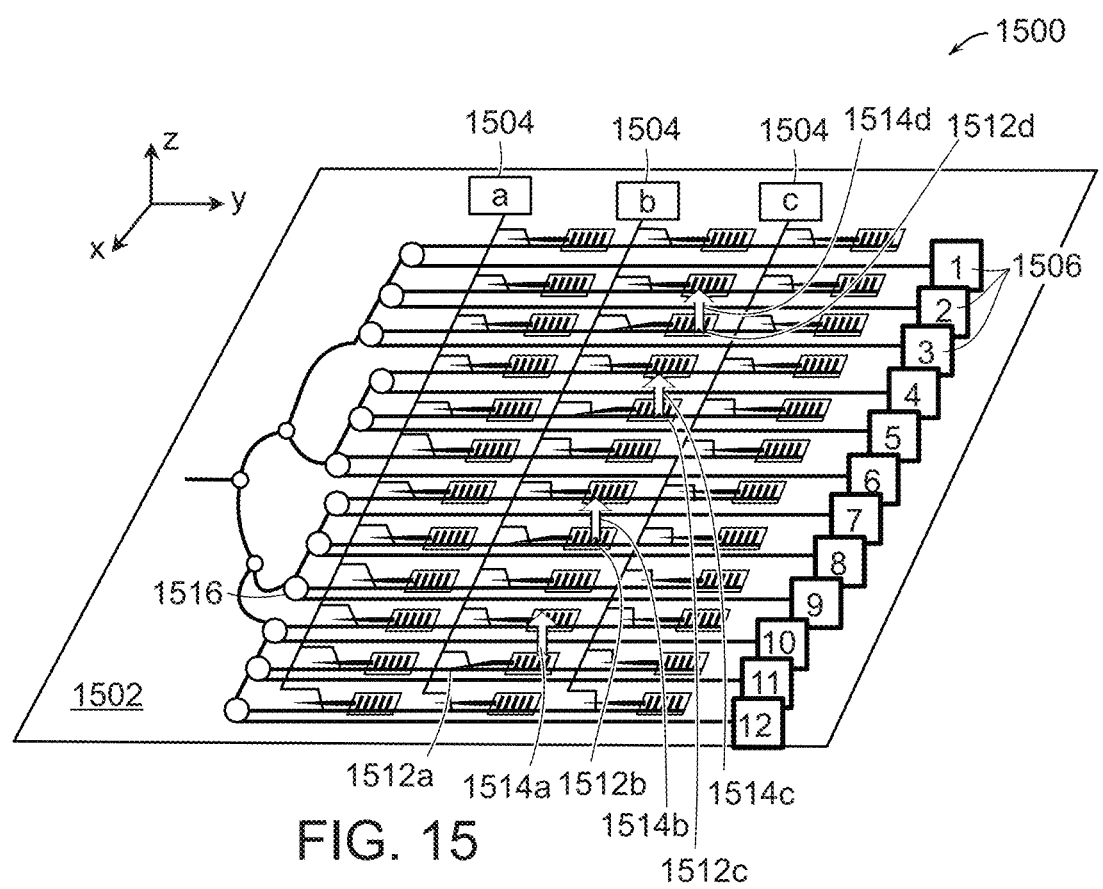
FIG. 15 is a diagram of a switch array system configured to address sub arrays simultaneously.

One advantage of the MEMS switch array is the relatively simple control electronics. FIGS. 14 and 15 shows two example of the electronic controls to electrostatically actuate the MEMS switch array.

FIG. 14 is a diagram of a switch array system 1400 configured to independently address rows and columns. This system 1400 addresses columns via a column contact controller 1404 and addresses rows via a row contact controller 1406. In this illustration, columns contact controller 1404c is enabled thus turning on selected or all switches associated with that columns, and row contact controller 1406.3 is enabled thus turning on the wave guide associated with that switch. The result includes turning on optical switch 1408 enabling light 1410 to be emitted from a single optical switch of the array. FIG. 15 is a diagram of a switch array system 1500 configured to address sub arrays simultaneously. This system 1500 addresses columns via a contact controller 1504 and addresses rows via a row contact controller 1506. In this illustration, column contact controller 1504b is enabled thus turning on selected or all switches associated with that column, and row contact controller

1506.11, 1506.8, 1506.5, and 1506.3 are enabled thus turning on the wave guide associated with those switches. The result includes optical switch 1512a, 1512b, 1512c, and 1512d turning on and enabling light 1514a, 1514b, 1514c and 1514d to be emitted from a single optical switch of the array.

In other words, one way to actuate the MEMS switches in the array is of course to have each switch individually addressed, therefore, if there are M×N switches in the array in which M is the number of rows and N is the number of columns, there will need M×N controls. One example approach to simplify the control is to address rows and columns (as shown in FIG. 14), so that M×N switches only need M+N controls. In FIG. 14, the switchable pixel that is illuminating is enabled by applying the right amount of voltage to row-1406 and column-1404. Another example approach is to split the MEMS switch array into subarrays, and address the switch in multiple subarrays simultaneously, as shown in FIG. 15. In FIG. 15, four switchable pixels are illuminating simultaneously, and they are enabled by applying suitable voltages on column-1504, row-3, row-5, row-8 and row-11 to actuate the corresponding MEMS switches. And of course, the subarrays can be addressed individually too. All these electronic control approaches can work in the MEMS switch array based transmitting, receiving and transceiving terminals. The advantages of the control method shown in FIG. 14 and FIG. 15 is the simplicity. The amount of controls is significantly decreased compared to the individual controlled switches.

FIG. 16 is a perspective view of a bus waveguide and a corresponding coupler waveguide on an optical switch 1600. A substrate 1602 supports a bus waveguide 1604 aligned with the bus waveguide 1604 is a cantilever coupler 1610 that is separated from the bus waveguide 1604 by a vertical gap 1606. The cantilever coupler 1610 may be tapered such that it has a narrow tip 1608 and a wider base 1612. For example, the tip 1608 may be a point, a rounded tip, or have a blunt end in which a ratio of the tip 1608 to the base 1612 include 1:3, 1:4, 1.5, etc. For example, a tip width 1608 may be 0.08, 0.1, 0.15, 0.2 um while the base 1612 may be 0.2, 0.3, 0.4, 0.5, etc. The length of the cantilever coupler 1614 is such that the cantilever coupler can be deflected to reduce the gap 1606 such that a coupling efficiency between the wave guide 1604 and the cantilever coupler 1610 is above a threshold such as 50%, 60%, or greater. It should be noted that typically two actuation electrodes are on the substrate 1602 parallel with the bus waveguide 1604 with one electrode on either side of the bus waveguide 1604, the length of the electrodes is approximately equal to the length of the cantilever coupler 1610. Likewise, typically there are two reaction electrodes are on the cantilever coupler 1610 substantially parallel with the bus waveguide 1604 with one electrode on either side of the cantilever coupler waveguide outlined by the narrow tip 1608 and wide base 1612. The length of the reaction electrodes is approximately equal to the length of the cantilever coupler 1610.

FIG. 17 is a graphical representation of coupling field profile 1700 with respect to distance. This illustrates a field profile when a coupling cantilever is turned on and energy is transferred from the bus wave guide to the cantilever waveguide. This illustration is associated with the cantilever coupler of FIG. 16 with a length of 7.5 um illustrating transfer of energy over the length of the cantilever coupler. Similarly, FIG. 18 is a series of 2-dimension graphical representations of coupling field profiles 1800 with respect to propagation distance. This illustrates a field profile when a coupling cantilever is turned on and energy is transferred from a bus waveguide. This illustration is associated with the cantilever coupler of FIG. 16 with a length of 7.5 um illustrating transfer of energy over the length of the cantilever coupler.

Figure 19:
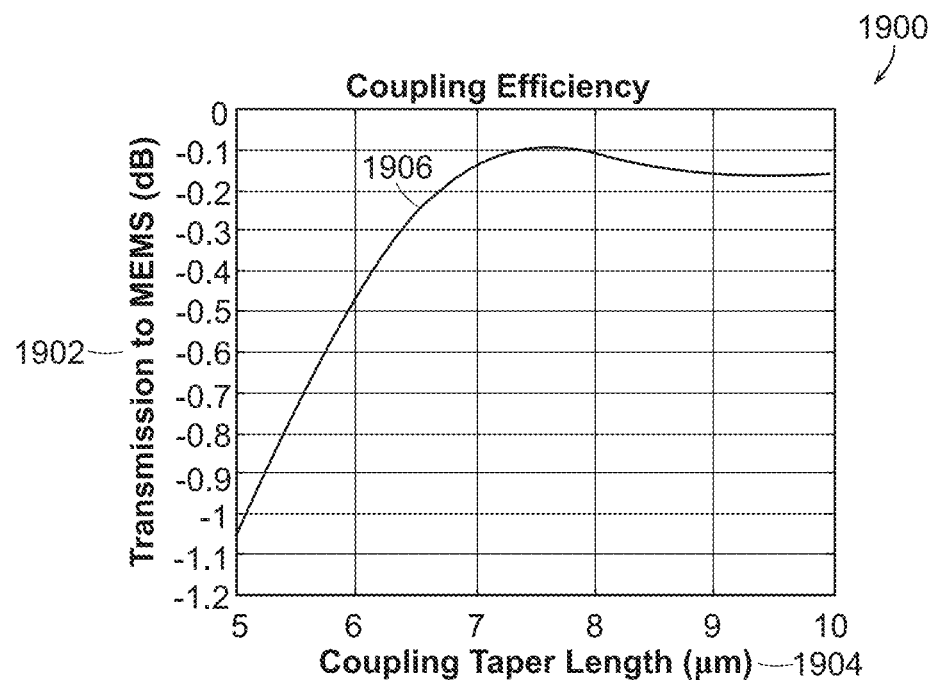
FIG. 19 is a graphical representation of coupling efficiency with respect to coupling taper length.
Figure 20:
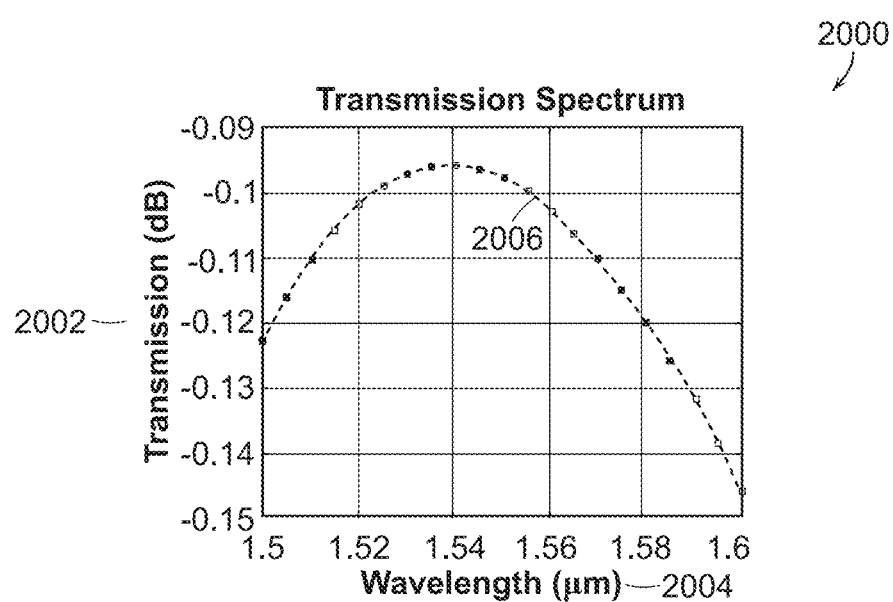
FIG. 20 is a graphical representation of transmission loss with respect to wavelength.

FIG. 19 is a graphical representation 1900 of coupling efficiency 1902 with respect to coupling taper length 1904. This illustrates a coupling efficiency 1906 when a coupling cantilever with various taper lengths is turned on and energy is transferred from a bus waveguide. This illustration is associated with the cantilever coupler of FIG. 16 with various taper lengths illustrating transfer of energy over the length of the cantilever coupler. FIG. 20 is a graphical representation 2000 of transmission loss 2002 with respect to wavelength 2004. This illustrates a transmission loss 2002 when a coupling cantilever is turned on and energy is transferred from a waveguide. This illustration is associated with the cantilever coupler of FIG. 16 with a length of 7.5 um illustrating transmission loss 2002 over the length of the cantilever coupler. As stated in this disclosure, the cantilever coupler is not limited to a Silicon, however in this example, the cantilever coupler is a Silicon cantilever coupler.

Figure 21:
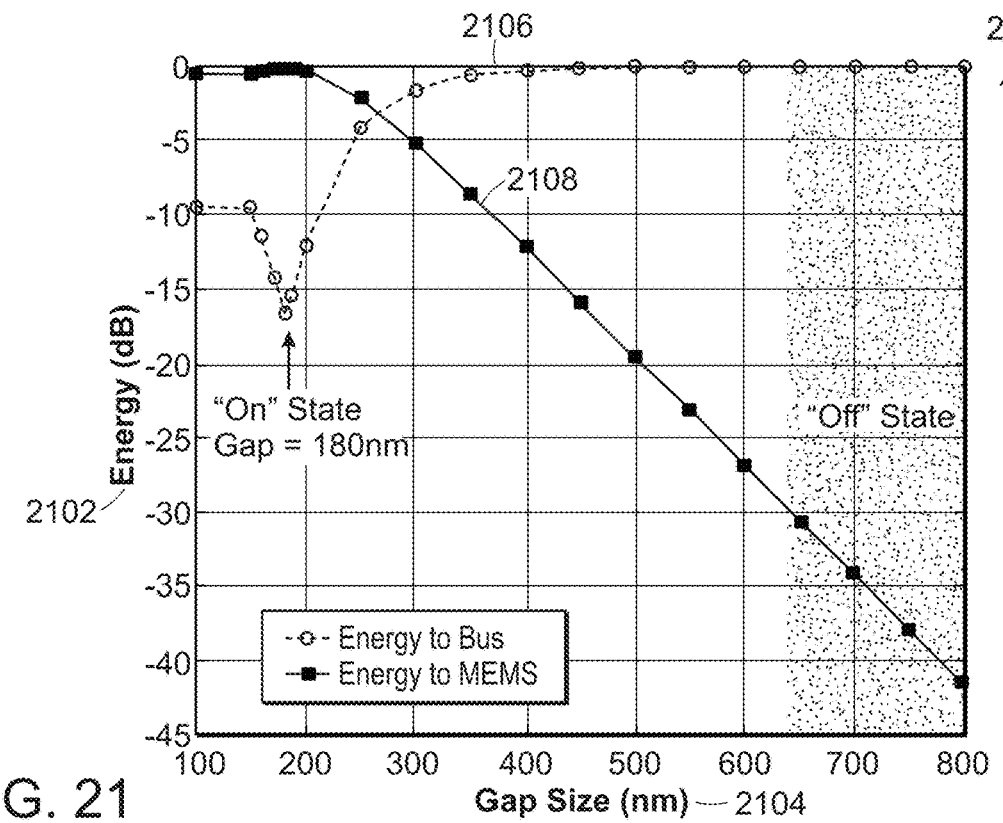
FIG. 21 is a graphical representation of energy loss with respect to gap size.
Figure 22:
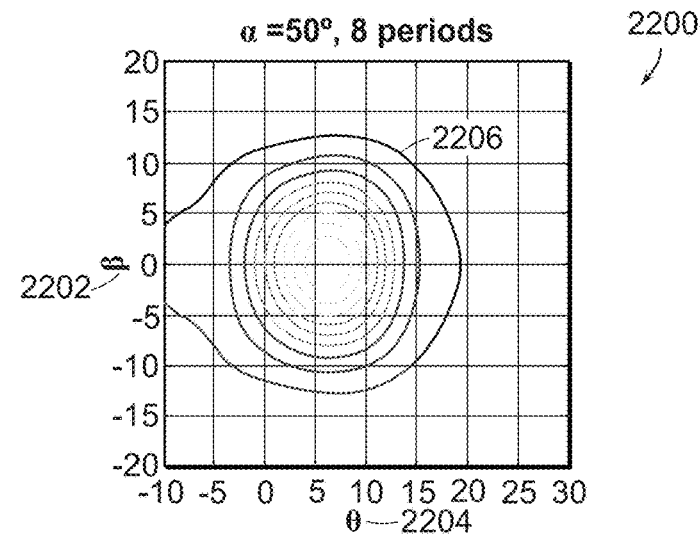
FIG. 22 is a graphical representation of a radiation pattern with respect to angle.

FIG. 21 is a graphical representation 2100 of energy loss 2102 with respect to gap size 2104. In this illustration, the energy to bus 2106 has a minimum at approximately 180 nm at which point the energy to MEMS 2108 begins to deflect and drop off. Based on this, during the "ON" state, the gap is maintained substantially at 180 nm to ensure maximum coupling efficiency to the MEMS waveguide. In an "OFF" state, the gap returns to a distance above a distance for example 650 nm such that a resulting energy to MEMS is less than −30 dB. FIG. 22 is a graphical representation 2200 of a radiation pattern 2206 with respect to an angle β 2202 (as illustrated in FIG. 5B angle 562) and an angle θ 2204 (as illustrated in FIG. 5B angle 560). In FIG. 22, the energy intensity is normalized to a 1 based on the grey scale and the contour lines are shown as the radiation patterns 2206.

Figure 23:
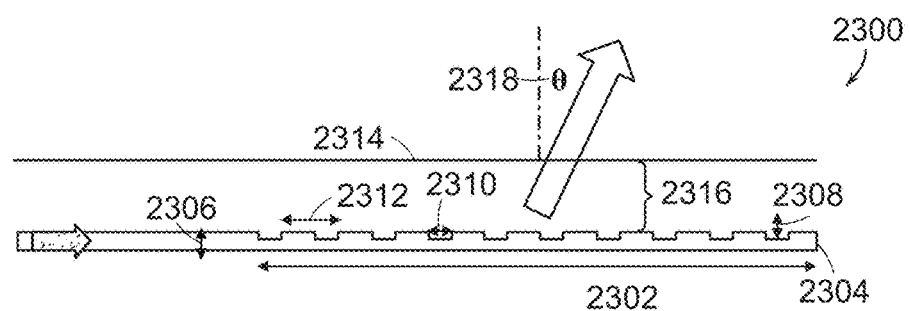
FIG. 23 is a side view illustration of a waveguide grating to free space angle.
Figure 24:
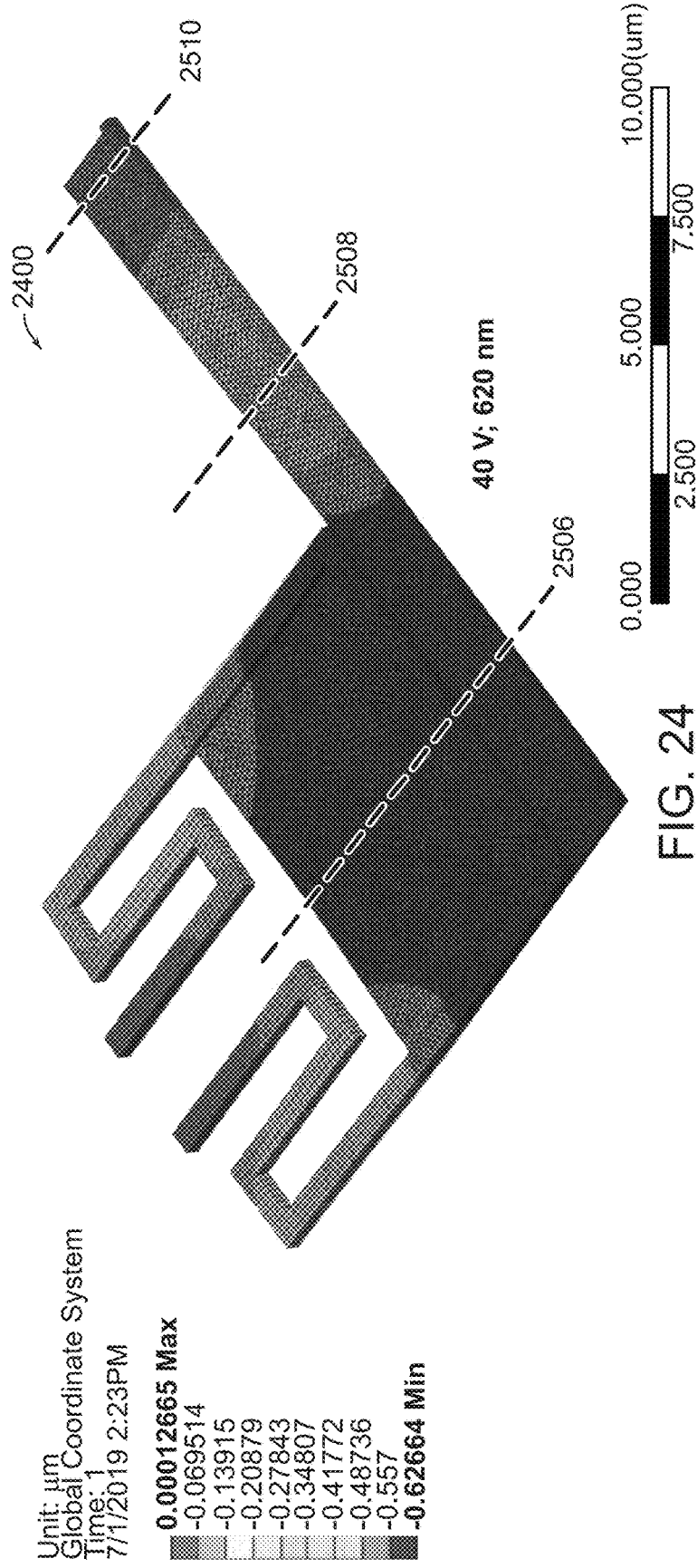
FIG. 24 is a perspective view of a cantilever spring biased by a voltage.
Figure 25:
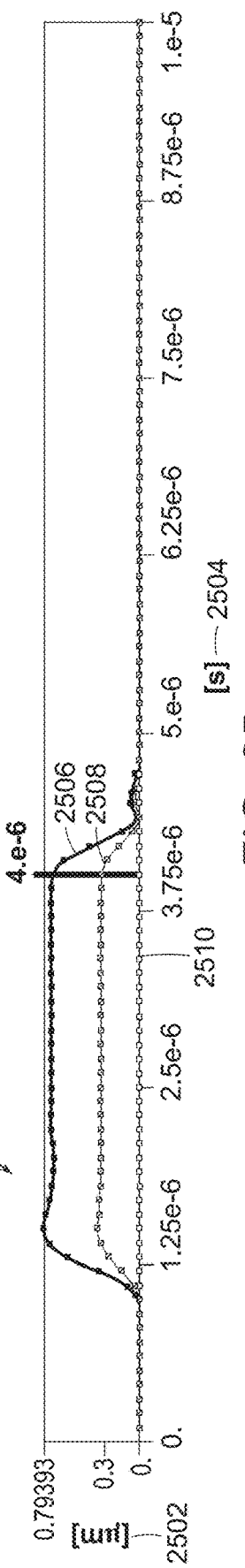
FIG. 25 is a graphical representation of displacement along a Z-axis with respect to switching speed.

FIG. 23 is a side view illustration of an optical system 2300 including a waveguide grating 2302 in a waveguide 2304. The waveguide may be a material such as silicon, polysilicon, silicon nitride, silicon carbide, silicon dioxide, or other material that can be configured to conduit energy (e.g., a waveguide). The grating 2302 includes gaps 2310 that may vary from 100 nm to 500 nm or more at a pitch 2312 that can be a factor of 1.5, 2.0, or 2.5 times the gap 2310 distance. The gap distance may vary across a plane perpendicular with the underlying wave guide. Performance of the waveguide can be evaluated along a plane 2314 substantially parallel with substrate and a distance 2316 above the substrate. The energy diffracts into free space substantially at an angle θ 2318 that is incident to the plane 2314. FIG. 24 is a perspective view of a cantilever spring 2400 illustrating displacement that results from biasing between a reaction electrode and actuation electrode at a voltage. For example a voltage difference of 40V between the reaction electrode and actuation electrode illustrating a displacement of substantially 620 nm. FIG. 25 is a graphical representation 2500 of displacement along a Z-axis 2502 with respect to switching speed 2504. This graphical representation shows the displacement along the Z-axis of FIG. 24 at different locations of the cantilever waveguide. In this example, three profiles are displayed, a displacement near the tip of the cantilever waveguide 2506, a displacement at the middle towards the end of the cantilever waveguide 2508 and a displacement near the end where it is connected to the optical antenna 2510.

Figure 26:
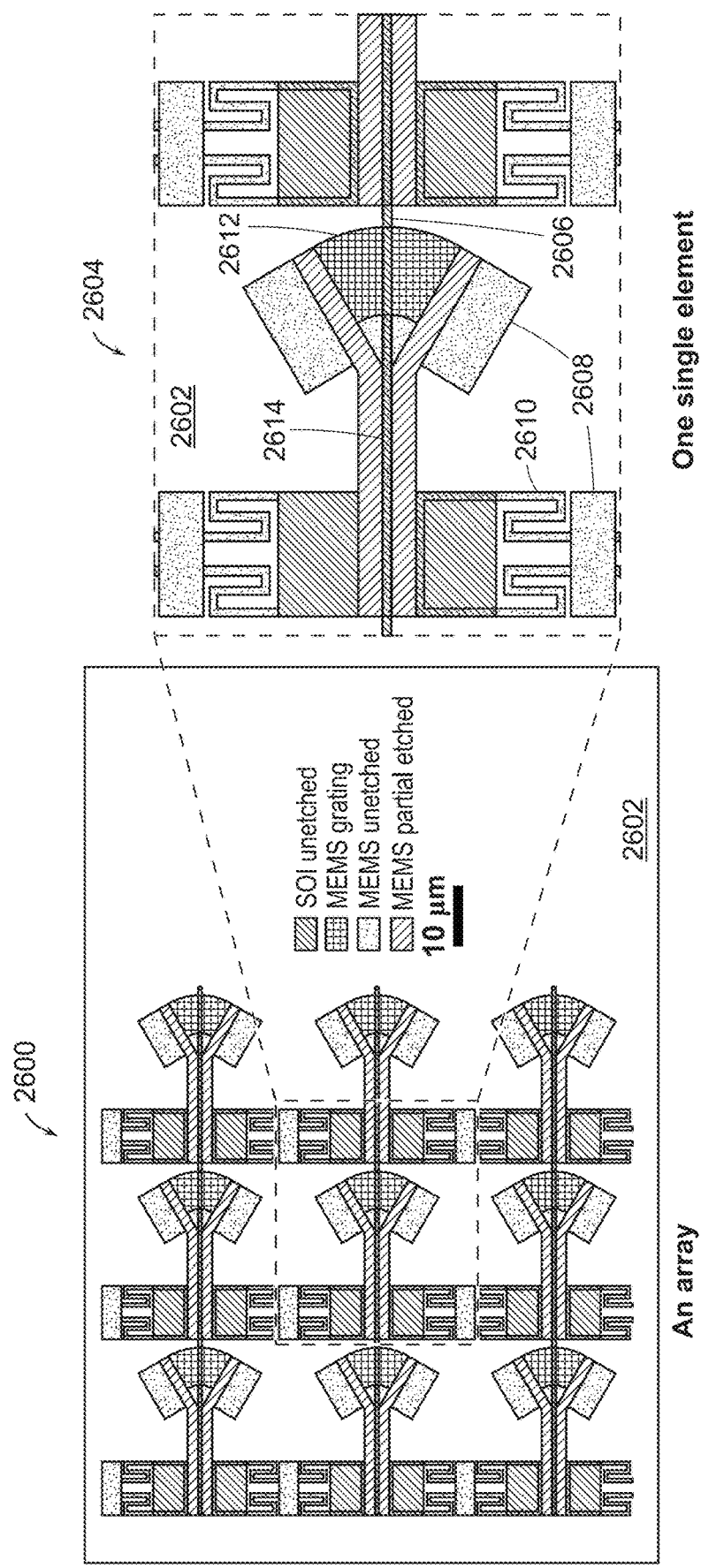
FIG. 26 is a top view of a switch array layout with a detailed illustration of a single element.

FIG. 26 is a top view of a switch array layout 2600 with multiple optical switches on a substrate 2602 and a detailed illustration of a single element 2604. The optical switch includes a wave guide 2606 coupled with the substrate 2602 also coupled with the substrate is an anchor point 2608. A MEMS spring 2610 is shown coupled with one anchor point 2608, while an optical grating 2612 is coupled with another anchor point 2608. The MEMS spring 2610 has a first end coupled with the anchor point 2608 and a second end coupled with a cantilever coupler 2614 that is suspended above the bus waveguide 2606. Mounted to the substrate 2602 on either side of the bus waveguide 2606 is an actuation electrode, and mounted on either side of the cantilever coupler 2614 is a reaction electrode that is configured to corporate with the actuation electrode. In this illustration, the optical grating/optical antenna 2612 is on the same layer as the cantilever coupler 2614. In an optical switch array system for beam steering applications, one embodiment includes a system in which each optical switch consists of a movable MEMS optical coupler on a suspending layer and an optical antenna on the substrate layer. The MEMS optical coupler enabled switch array can be used to couple light from waveguide on photonic integrated circuit (PIC) chip to free space (or vice versa) in various applications including Lidar.

Figure 27A:
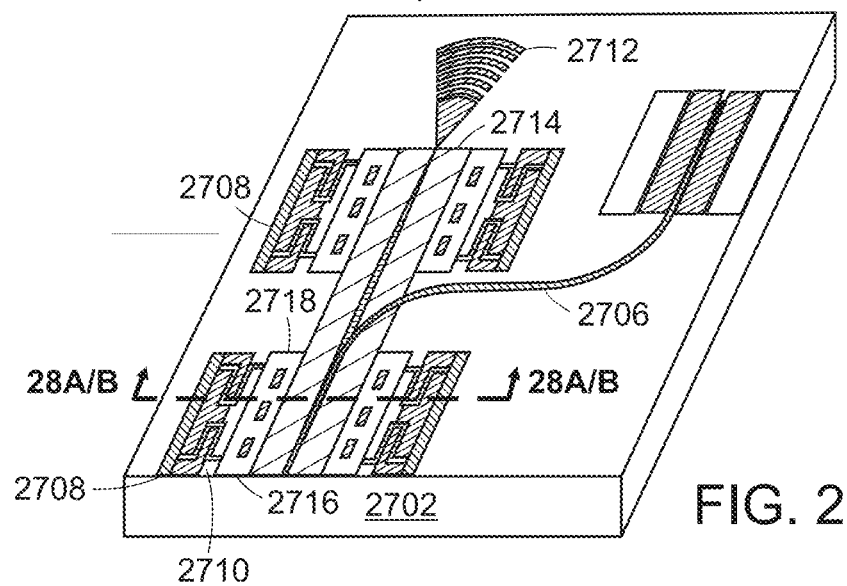
FIG. 27A is a perspective view of a switch array with movable optical coupler on a suspension layer and a fixed optical antenna on a substrate layer.
Figure 27B:
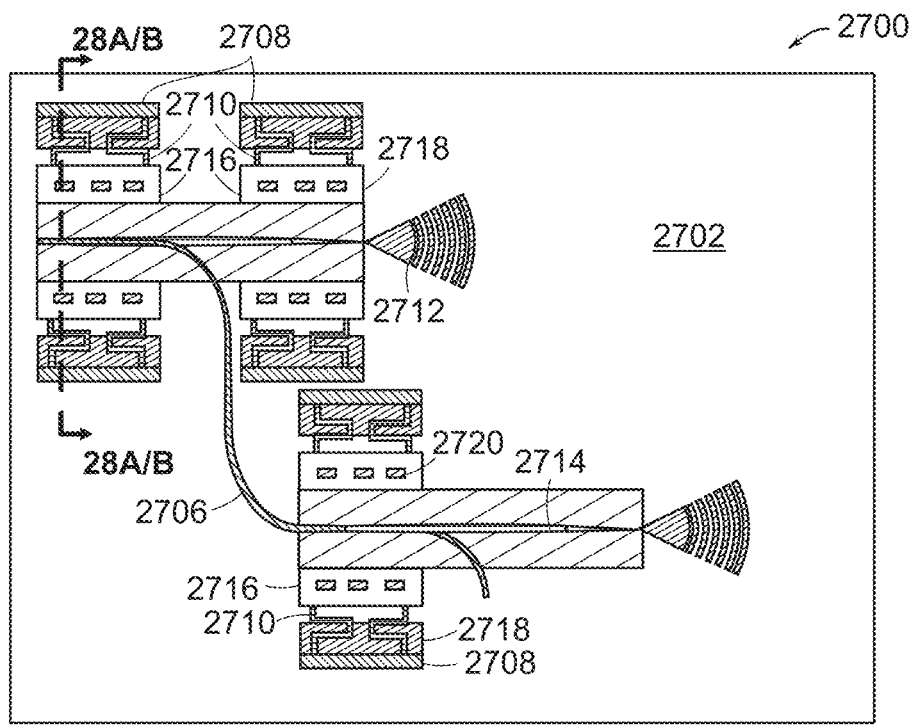
FIG. 27B is a top view of a switch array with movable optical coupler on a suspension layer and a fixed optical antenna on a substrate layer.

FIG. 27A is a perspective view of a switch array 2700 with movable optical coupler 2714 on a suspension layer 2716 and a fixed optical antenna 2712 on a substrate layer 2702. FIG. 27B is a top view of the switch array 2700 with movable optical coupler on a suspension layer and a fixed optical antenna on a substrate layer. The optical switch includes a waveguide 2706 coupled with the substrate 2702 also coupled with the substrate is an anchor point 2708. A MEMS spring 2710 is shown coupled with one anchor point 2708. The MEMS spring 2710 has a first end coupled with the anchor point 2708 and a second end coupled with a cantilever coupler 2714 via the suspension layer 2716 that is suspended above the bus waveguide 2706. Mounted to the substrate 2702 on either side of the bus waveguide 2706 is an actuation electrode 2718, and mounted on either side of the cantilever coupler 2714 is a reaction electrode 2716 that is configured to corporate with the actuation electrode 2718. In this illustration, the optical grating/optical antenna 2712 is on the same layer as the bus waveguide 2706.

The MEMS switch array may be enabled by movable MEMS optical coupler 2714 on a suspending layer 2716 and fixed optical antenna 2712 on substrate layer 2702. FIGS. 27A and 27B provide a perspective view and top view of such a MEMS switch. Each MEMS switch consists of a movable MEMS optical coupler 2714 on the suspending layer 2716 (we call "MEMS layer"), and an optical antenna 2712 on the substrate layer 2702. Here grating antenna 2712 is used as an example to illustrate the concept, other optical antenna designs also work for this concept. When in an OFF state, the MEMS layer, reaction electrode 2716, and cantilever coupler 2714 are far away from the bus waveguide 2706 and actuation electrode 2718 such that light can propagate in the bus waveguide 2706 unperturbed. When in an ON state, the reaction electrode 2716 is actuated and moves the MEMS optical coupler 2714 close to the bus waveguide 2706, such that light is coupled to the coupler waveguide 2714 on the MEMS layer with the reaction electrode 2716 a second cantilever coupler drops to a detached bus waveguide that is connected to the optical antenna 2712, which transmits signal to free space. This light path is reversed when receiving a signal.

Figure 28A:
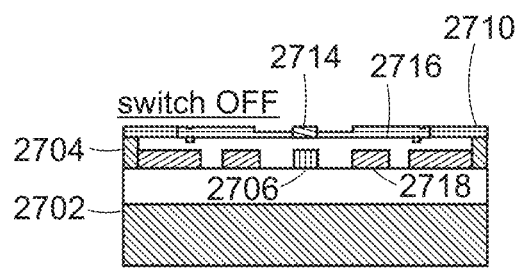
FIG. 28A is a cross sectional view of the movable optical coupler of FIG. 27 while in the OFF position.

FIG. 28A is a cross sectional view of the movable optical coupler of FIG. 27 while in the OFF position. When in an OFF state, the MEMS layer (that includes the reaction electrode) 2716 is over the top of the bus waveguide 2706 at a first distance. The distance is due to a voltage difference between the actuation electrode 2718 and the reaction electrode 2716 being below a voltage threshold such that the cantilever coupler 2714 is far away from the bus waveguide 2706. The first distance is such that light propagates in the bus waveguide 2706 substantially unperturbed.

Figure 28B:
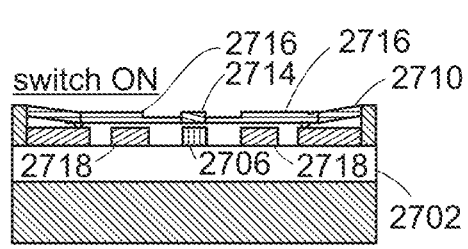
FIG. 28B is a cross sectional view of the movable optical coupler of FIG. 27 while in the ON position.

FIG. 28B is a cross sectional view of the movable optical coupler of FIG. 27 while in the ON position. When in an ON state, the MEMS layer (that includes the reaction electrode) 2716 is over the top of bus waveguide 2706 at a second distance. The second distance is due to a voltage difference between the actuation electrode 2718 and the reaction electrode 2716 being above the voltage threshold such that the cantilever coupler 2714 is pulled towards the bus waveguide 2706. At the second distance, light is coupled to the coupler waveguide 2714 on the MEMS layer with the reaction electrode 2716 and a second cantilever coupler that drops to a detached bus waveguide that is connected to the optical antenna 2712, which transmits signal to free space. This light path is reversed when receiving a signal.

FIGS. 28A and 28B illustrates a cross-section of the actuation of the optical coupler. The advantage of this concept is that the optical antenna is on the substrate layer, which does not add weight to the suspending structure and has fewer fabrication challenges compared to other structures. The operation frequency of a Lidar system requires very high switching/movement speeds. This translates into a limitation of the translated mass. In the present disclosure, however, the optical antenna remains on the substrate layer so that its dimension does not affect the operation speed. As a result, the antenna can have a larger footprint to form a favorable Gaussian beam profile, and the emission efficiency can be optimized by flexible grating periods and/or duty cycle. The coupler waveguide on the suspending layer is small and light weight, which further promises fast switching speed. The optical coupler can be actuated electrostatically, piezoelectrically or by other mechanisms. It can be a dual cantilever with the middle part anchored such that both ends can be operated together or both ends can be operated independently. Also it can be a beam in which the entire coupler waveguide moves during operation (as shown in FIG. 27B).

Figure 29:
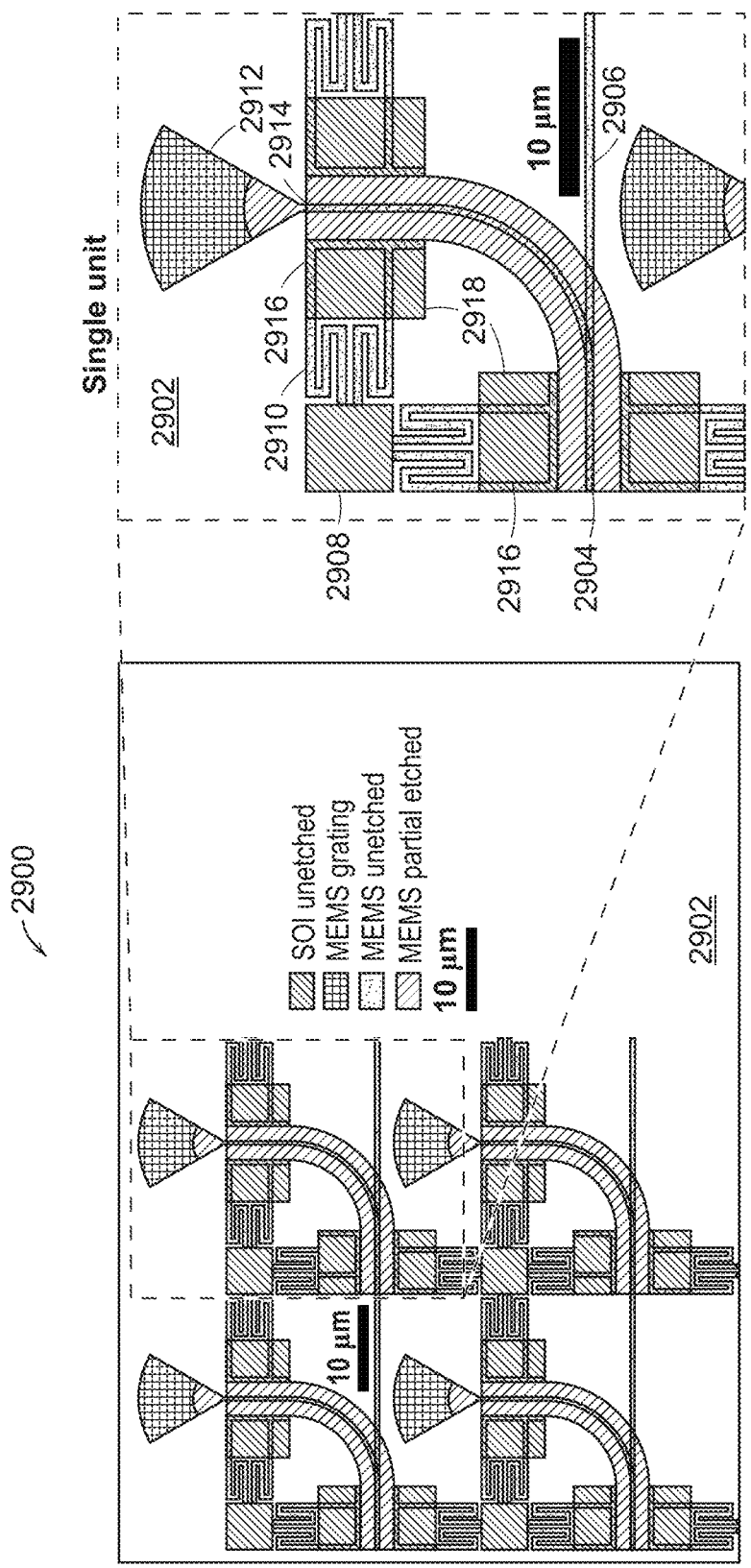
FIG. 29 is a top view of a switch array layout with a movable optical coupler on a suspension layer and a fixed optical antenna on a substrate layer with a detailed illustration of a single element.
Figure 30:
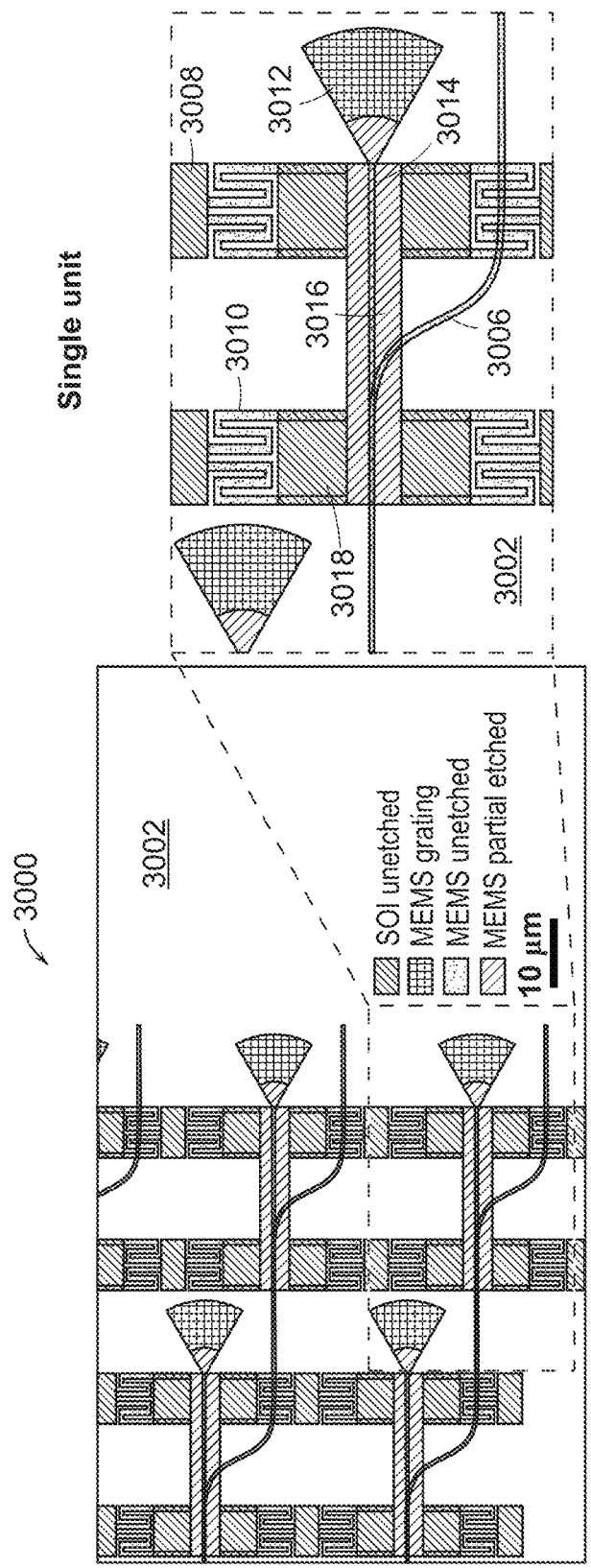
FIG. 30 is a top view of a switch array layout with a movable optical coupler on a suspension layer and a fixed optical antenna on a substrate layer with a detailed illustration of a single element.

The concepts described in here can be implemented in alternative embodiments. Another embodiment is shown in FIGS. 29 and 30. FIG. 29 is a top view of a switch array layout 2900 with a movable optical coupler 2914 on a suspension layer and a fixed optical antenna 2912 on a substrate layer 2902 with a detailed illustration of a single element. The optical switch includes a wave guide 2906 coupled with the substrate 2902 also coupled with the substrate is an anchor point 2908. A MEMS spring 2910 is shown coupled with one anchor point 2908. The MEMS spring 2910 has a first end coupled with the anchor point 2908 and a second end coupled with a cantilever coupler 2914 via the suspension layer 2916 that is suspended above the bus waveguide 2906. Mounted to the substrate 2902 on either side of the bus waveguide 2906 is an actuation electrode 2918, and mounted on either side of the cantilever coupler 2914 is a reaction electrode that is configured to corporate with the actuation electrode 2918. In this illustration, the optical grating/optical antenna 2912 is on the same layer as the bus waveguide 2906.

FIG. 30 is a top view of a switch array layout 3000 with a movable optical coupler on a suspension layer and a fixed optical antenna on a substrate layer with a detailed illustration of a single element. The optical switch includes a waveguide 3006 coupled with the substrate 3002 also coupled with the substrate is an anchor point 3008. A MEMS spring 3010 is shown coupled with one anchor point 3008. The MEMS spring 3010 has a first end coupled with the anchor point 3008 and a second end coupled with a cantilever coupler 3014 via the suspension layer 3016 that is suspended above the bus waveguide 3006. Mounted to the substrate 3002 on either side of the bus waveguide 3006 is an actuation electrode 3018, and mounted on either side of the cantilever coupler 3014 is a reaction electrode that is configured to corporate with the actuation electrode 3018. In this illustration, the optical grating/optical antenna 3012 is on the same layer as the bus waveguide 3006.

The layout in FIG. 29 consists of an array of straight waveguides with an array of optical antennas 2912 locating at an offset distance from the waveguides 2906. In this design, the coupler waveguide 2914 makes a turn to pick up light from bus waveguide 2906 and drop it to the antenna 2912. Alternatively, the layout in FIG. 30 consists of an array of curved bus waveguides 3006 with an array of optical antennas 3012 aligned to the straight parts of the bus waveguide 3006. In this design, the coupler waveguide is straight.

Figure 31:
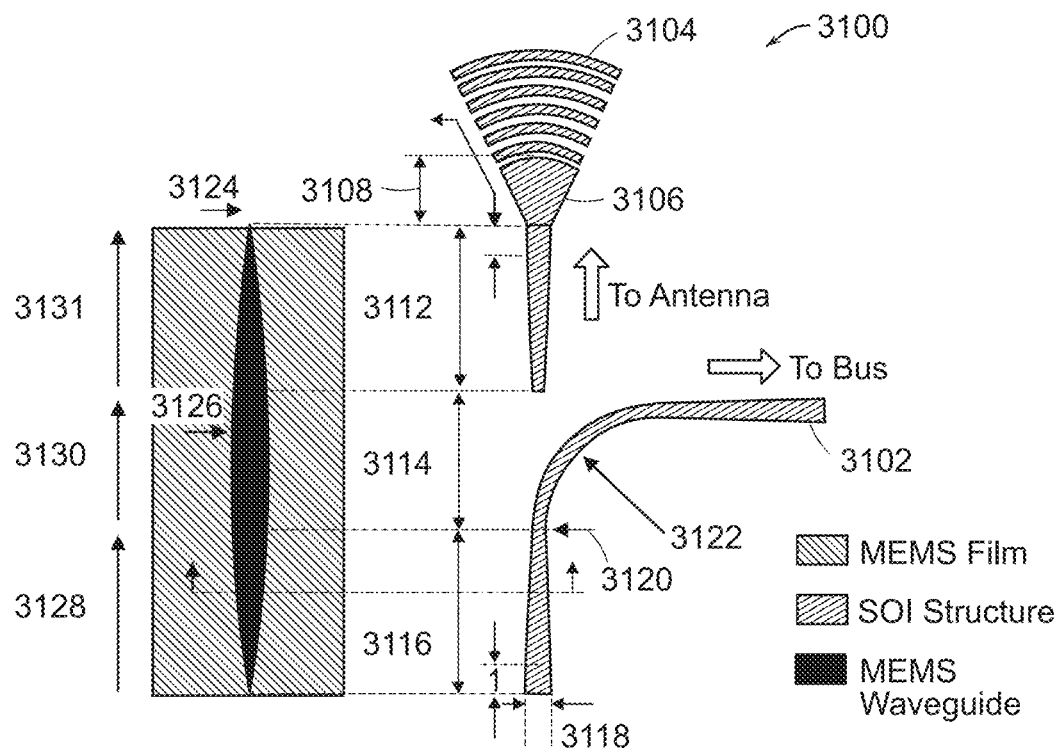
FIG. 31 is a top view of an element of a switch array layout with a movable optical coupler on a suspension layer and a fixed optical antenna on a substrate layer.
Figure 32:
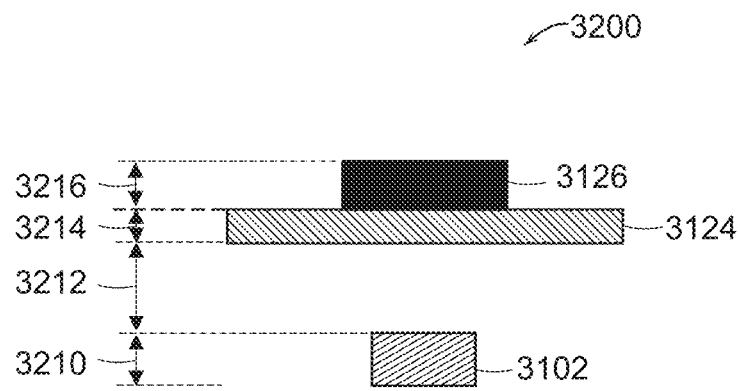
FIG. 32 is a cross sectional view of the element of FIG. 31.

FIG. 31 is a top view of an element of a switch array layout 3100 with an optical coupler 3126 on a suspension layer 3124 and a fixed optical antenna 3104 on a substrate layer. The optical antenna 3104 covers an angle 3106, such as 45 degrees, 60 degrees, or 90 degrees, and has a base or taper 3108 after which the grating begin. The optical coupler 3126 may be a single element or consist of multiple segments. Here the optical coupler 3126 has three segments, the first segment 3112 is the segment that is drawn down to couple with the optical antenna 3104 when activated. The second segment 3114 connects the first segment 3112 with the third segment 3116. The third segment 3116 is the segment that moves down to couple with the bus waveguide 3102. The second segment 3114 may be stationary and directly coupled with an anchor point such that the distance from the second segment 3114 to the substrate does not move, or in another embodiment, the second segment 3114 is floating and moves with the movement of the first 3112 and third segments 3116. The bus waveguide 3102 may have a width 3118 at a point at which the tip of the optical coupler 3126 will couple when activated, and that width may narrow to a width 3120 prior to a turn of radius 3122 such that the turn is configured to be substantially adiabatic. The transmission through the optical coupler 3126 may have a first loss 3128 through the third segment 3116, a second loss 3130 through the second segment 3114, and a third loss 3132 through the first segment 3112. These losses may be a fraction of a dB, for example, the first 3128 and third 3132 may be 0.1 dB while the loss in the second segment 3130 may be less than 0.02 dB. FIG. 32 is a cross sectional view of the element 3200 of FIG. 31. Here the optical coupler 3126 is coupled with the suspension layer 3124 and aligned over the bus waveguide 3102. The optical bus waveguide 3102 has a height 3210 and the suspension layer 3124 is a distance 3212 above the bus waveguide 3102, that distance changes with state, for example, when on, the distance 3212 may be less than 0.2 microns and when off the distance 3212 may be greater than 0.6 microns. The suspension layer 3124 may have a thickness 3214 such that it can provide support yet still allow for optical coupling between the bus waveguide 3102 and the optical coupler 3126. The optical coupler 3126 may have a thickness of 3216.

Figure 33:
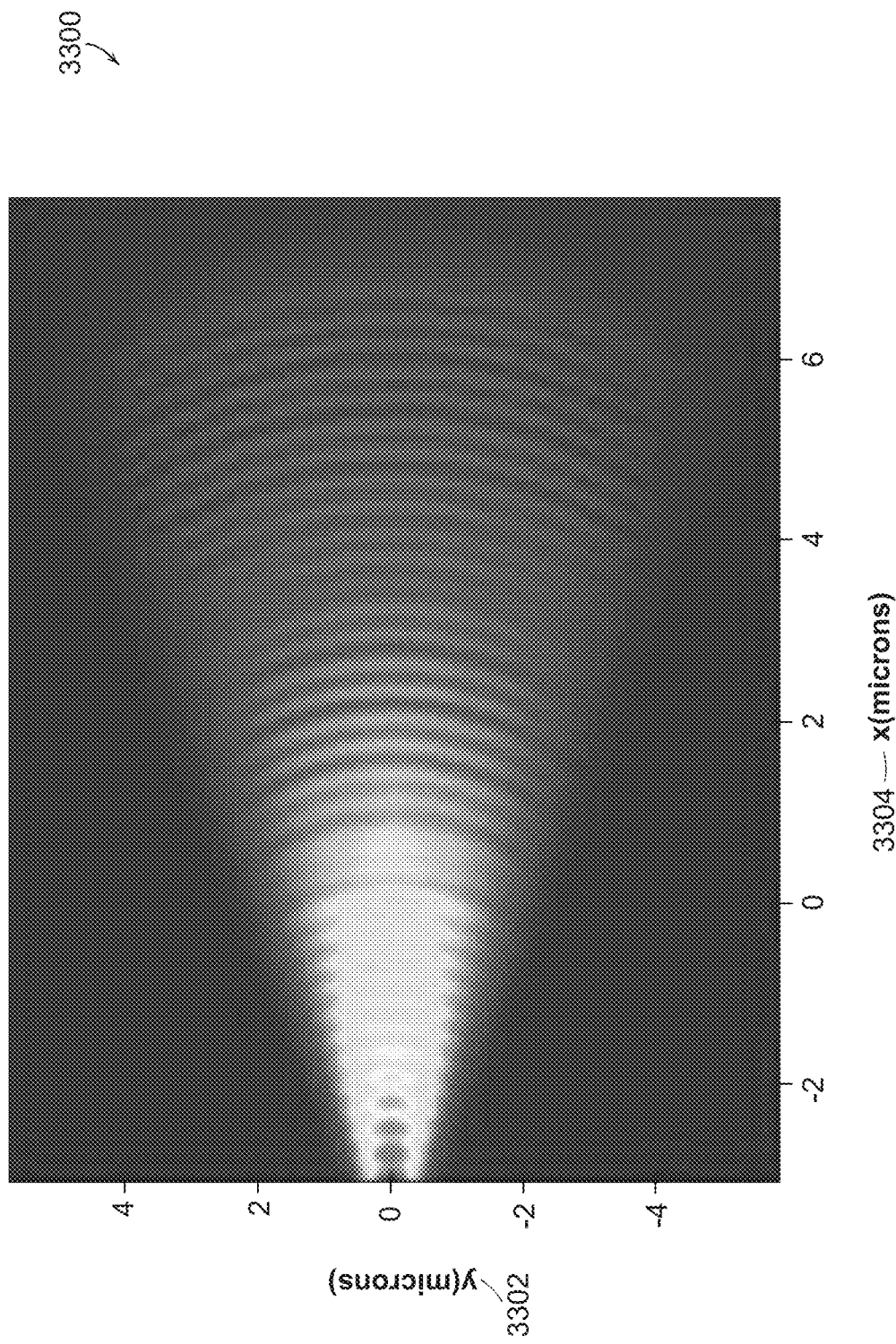
FIG. 33 is a graphical representation of a field profile of a grating antenna with respect to X and Y coordinates.
Figure 34:
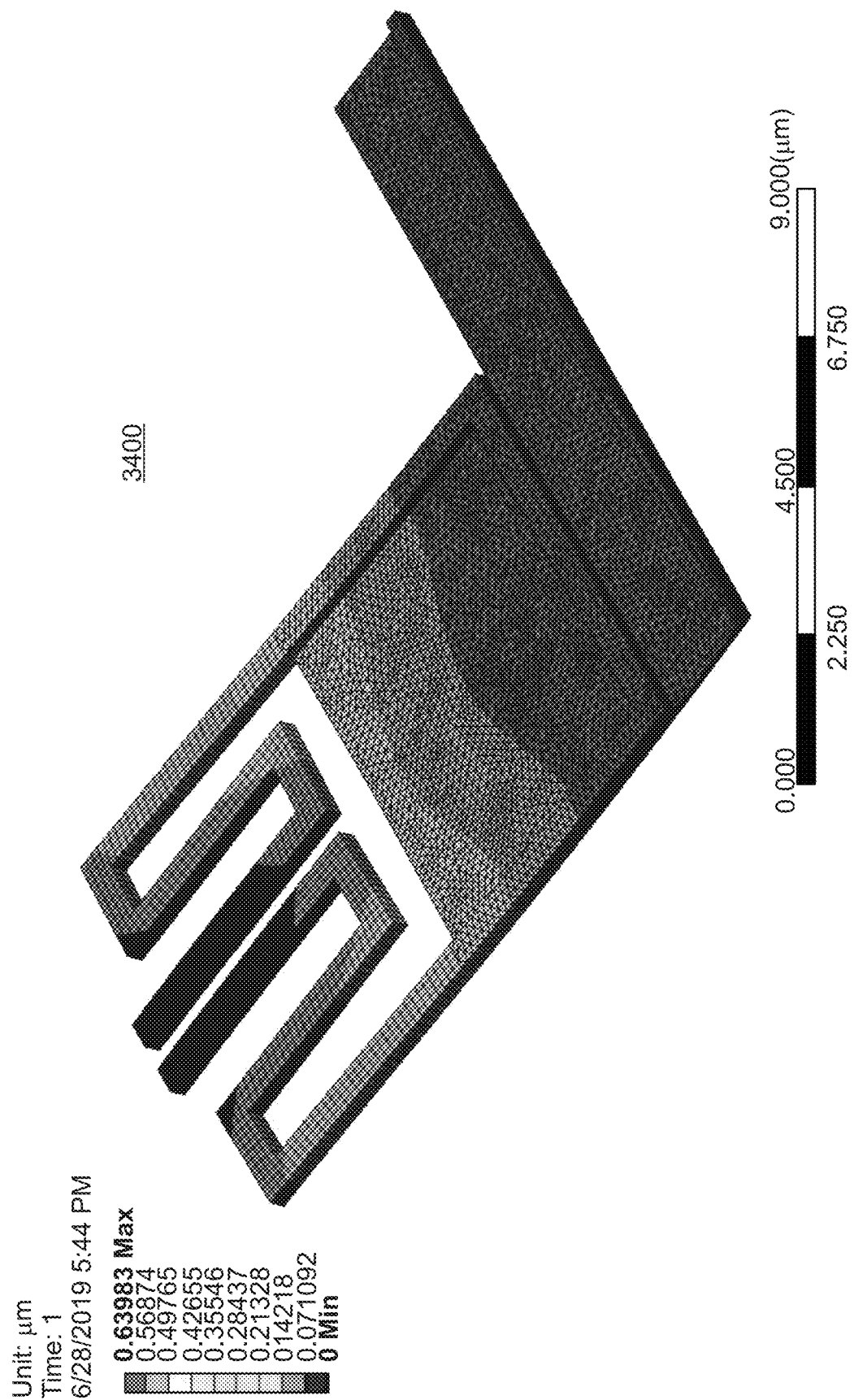
FIG. 34 is a perspective view of a illustrating displacement of an optical coupler.

FIG. 31 and FIG. 32 shows an example of a single MEMS optical coupler and a fixed grating antenna in the FIG. 30 layout. The dimensions labeled in FIG. 31 is an example, FIGS. 17 and 18 shows its coupling performance with the MEMS optical coupler being 180 nm away from the bus waveguide, and FIG. 33 shows the electrical field distribution on the grating. FIG. 33 is a graphical representation of a field profile 3300 of a grating antenna with respect to X coordinates 3304 and Y coordinates 3302. FIG. 34 is a perspective view of an illustrating displacement of an optical coupler 3400 such as the optical coupler of FIG. 31. FIG. 34 is a simulation of the displacement of a MEMS optical coupler. In general, the optical coupling length ranges from several micro-meters to hundreds of micro-meters depending on different designs, and the distance between the coupler waveguide and the bus waveguide/antenna waveguide ranges from several nanometers to several microns at ON state.

Figure 35:
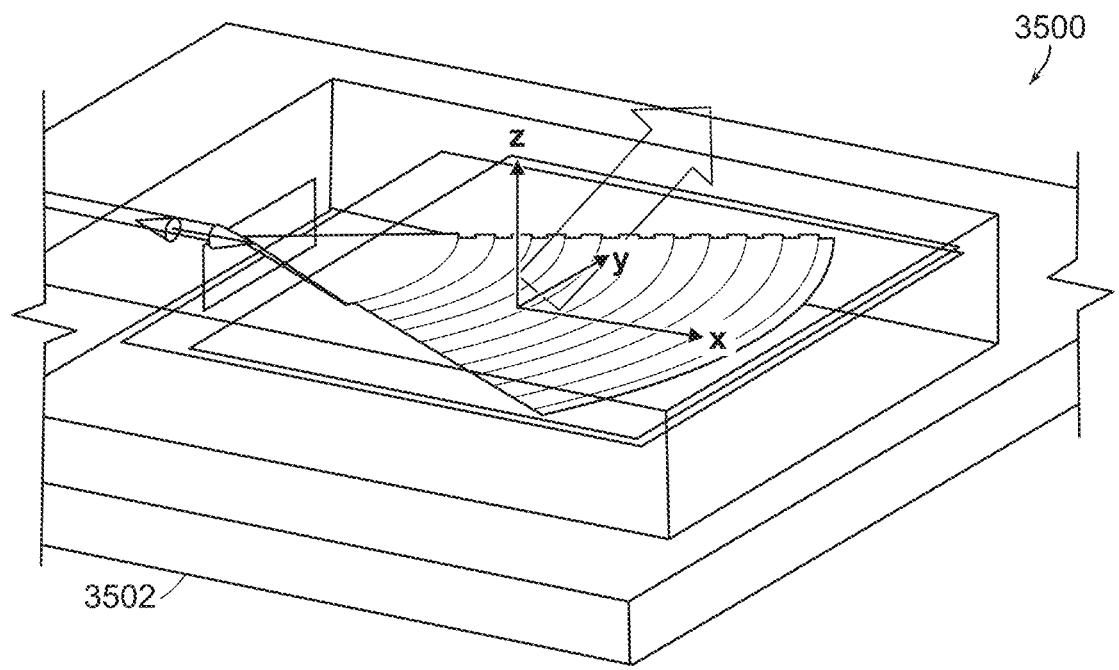
FIG. 35 is a perspective view of a grating antenna illustrating emission angles.
Figure 35:
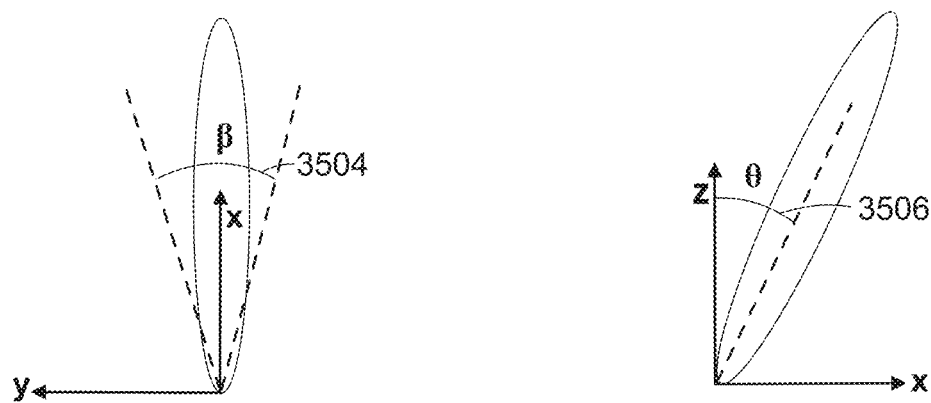
Figure 36:
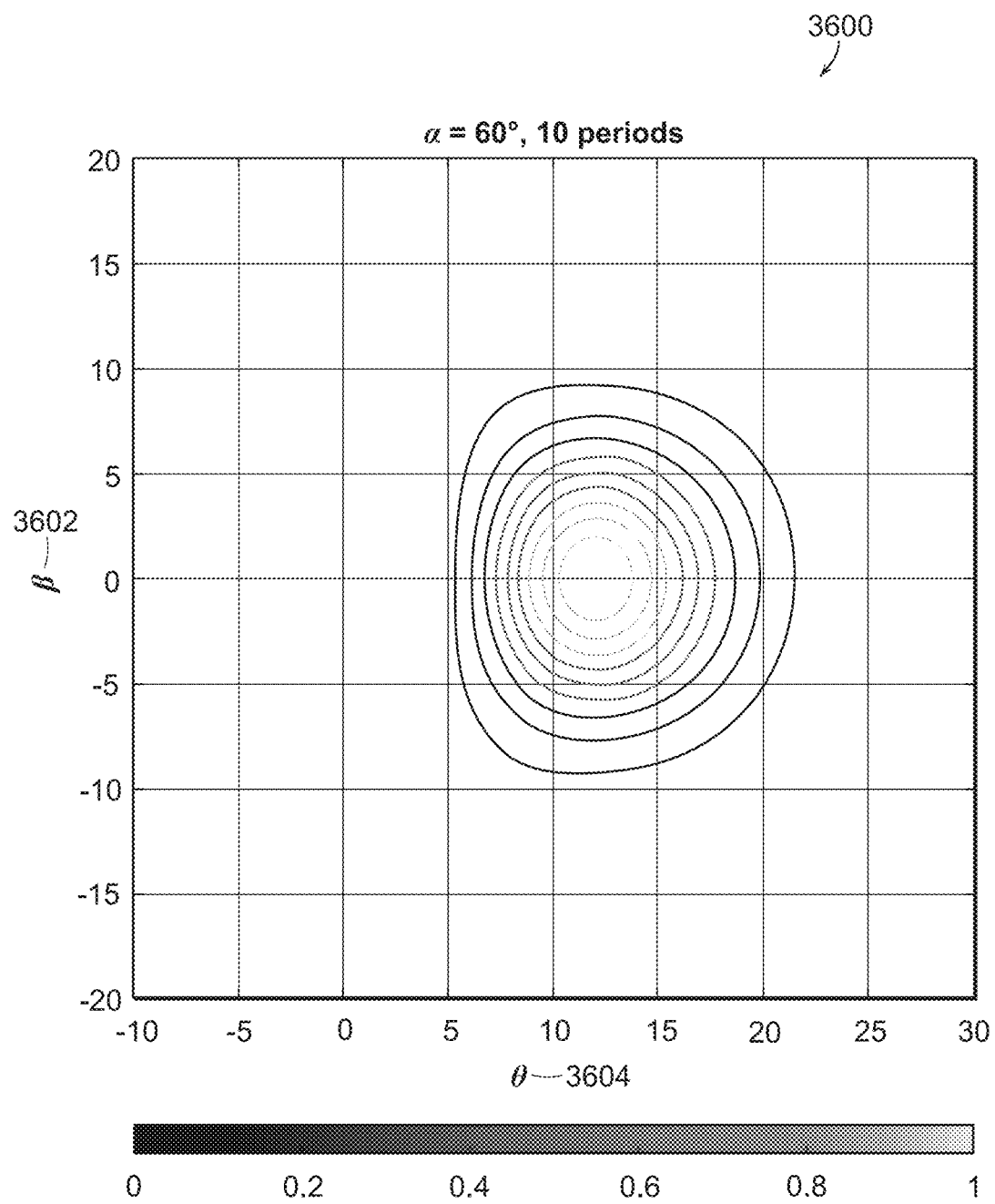
FIG. 36 is a graphical representation of intensity with respect to emission angles.

Some optical antennas have non-zero emission angle θ, as shown in FIG. 35 and FIG. 36, which may raise an issue in the amplitude array terminal. FIG. 35 is a perspective view of a grating antenna 3500 of a MEMS structure 3502 illustrating emission angles β 3504 and θ 3506. FIG. 36 is a graphical representation of intensity 3600 with respect to emission angles β 3602 and θ 3604. In this figures, 10 periods are shown in which the intensity is illustrated via a gray scale.

Figure 39:
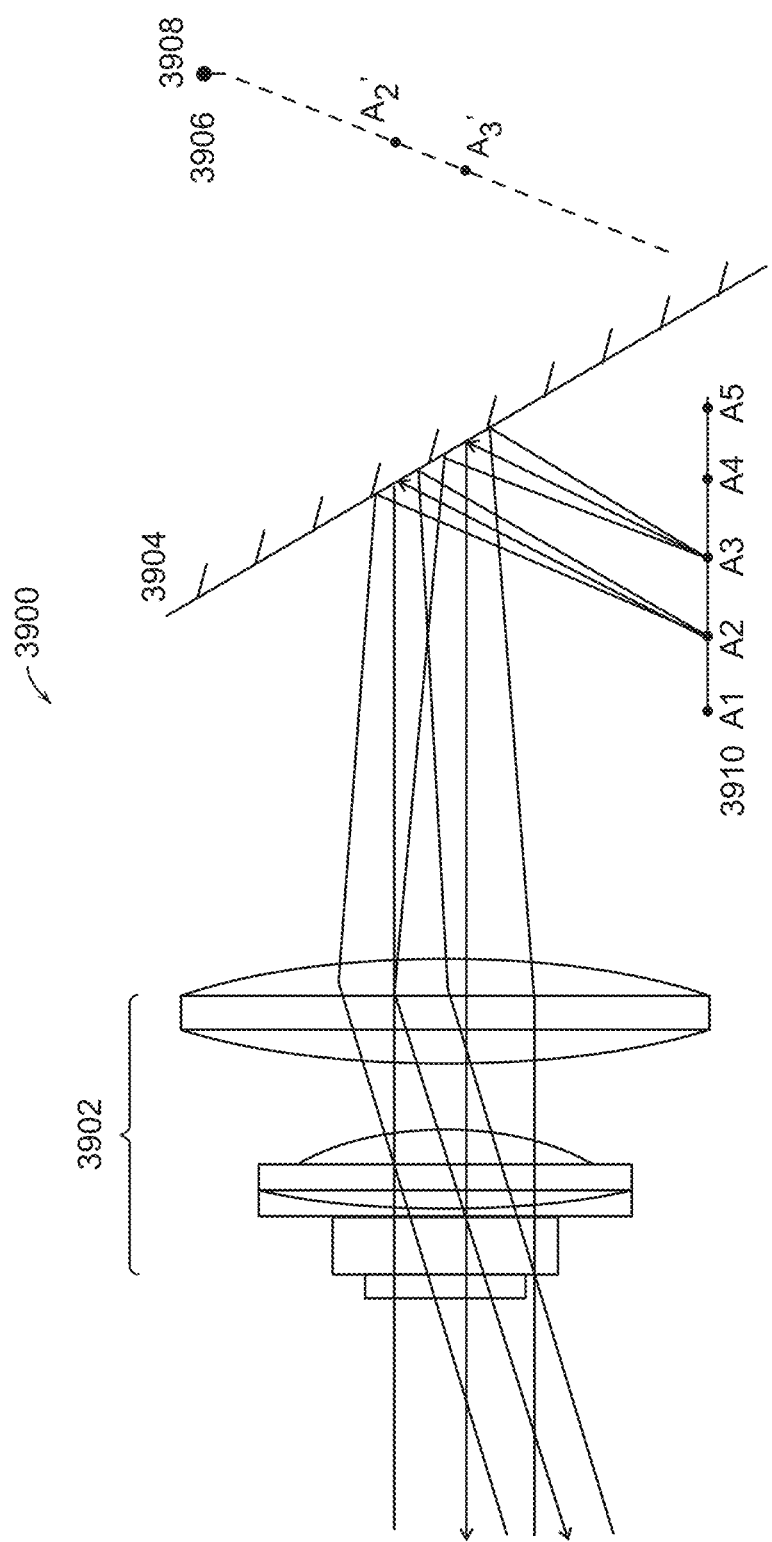
FIG. 39 is a side view illustrating a mirror to compensate for a non-zero antenna emission angle.
Figure 40:
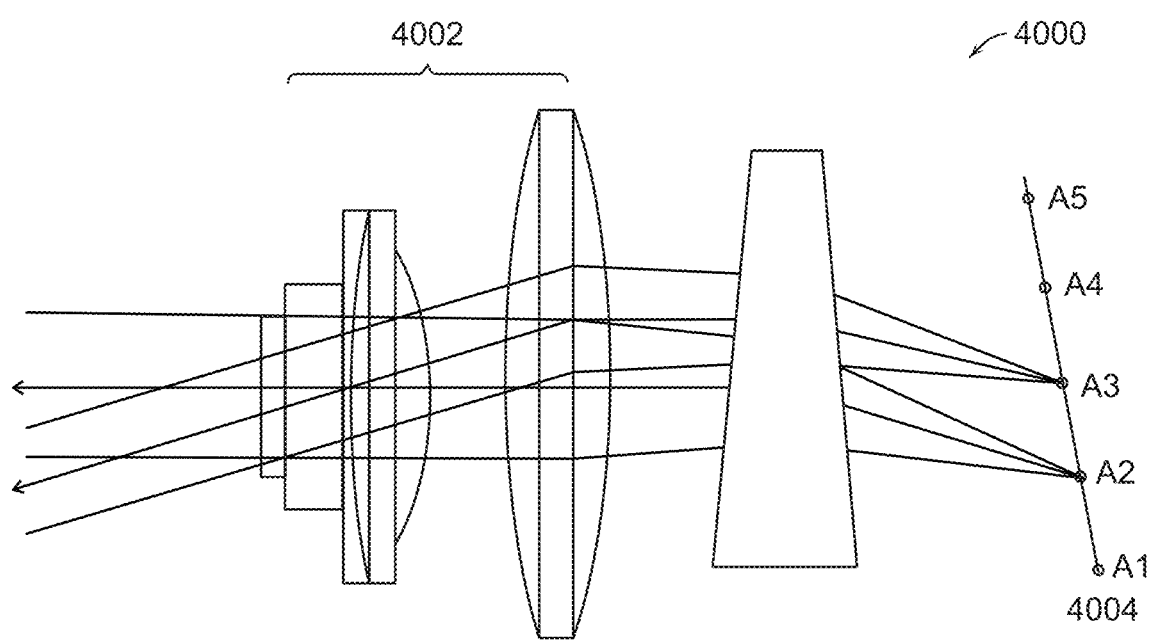
FIG. 40 is a side view illustrating an optical prism to compensate for a non-zero antenna emission angle.
Figure 41:
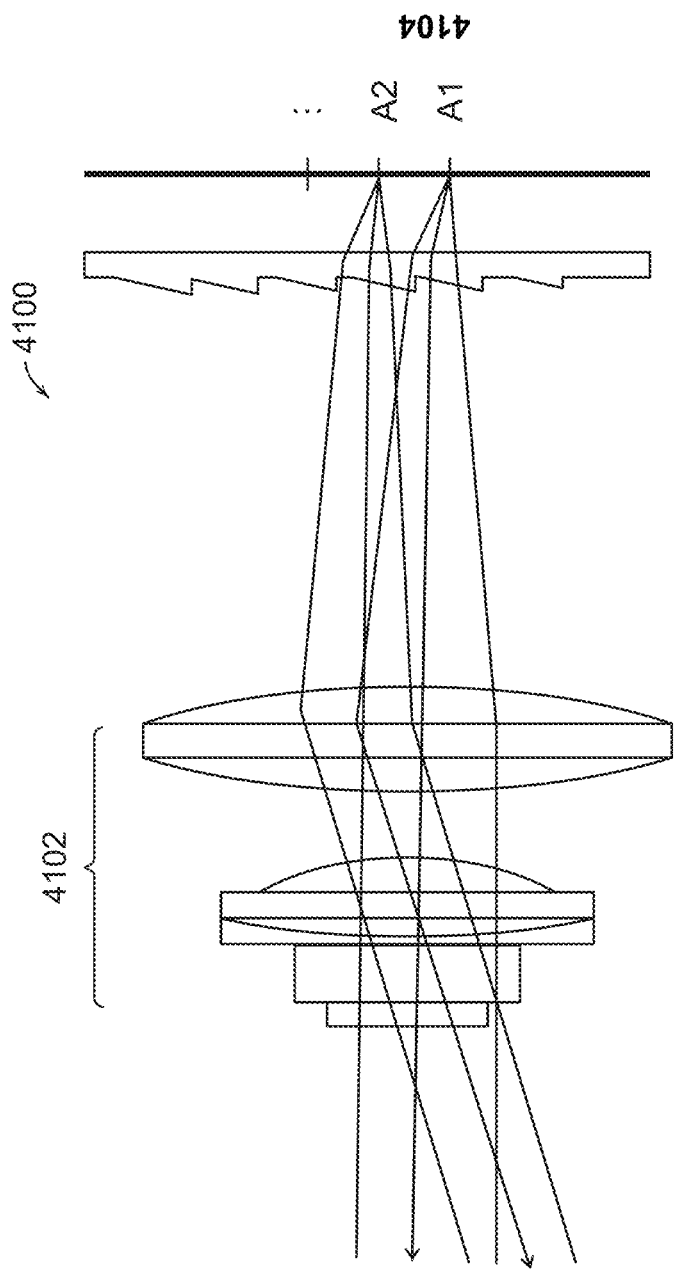
FIG. 41 is a side view illustrating a micro-prism array to compensate for non-zero antenna emission angle.

One solution to this problem is to sacrifice the optical antenna radiation efficiency and far-field beam quality to get a zero emission angle. The second solution is to add additional structure to force light emit vertically, including but not limited to bottom reflector, additional top dielectric layer, extra-fine etching groove. The third solution is to design the lens accordingly to compensate for the non-zero emission angles. However, it is not flexible enough to address different emission angles due to fabrication fluctuations. Here we propose to use a mirror or prism between the antenna array and the lens to compensate for the non-zero emission angle, as shown in FIG. 39, 40, 41. FIG. 39 is a side view 3900 illustrating a mirror to compensate for a non-zero antenna emission angle. Here a telecentric lens 3902 is used to collimate the light from antenna array or photonic integrated circuit to free space through a mirror (transmitting), or reflect off a mirror 3904 to an antenna array or photonic integrated circuit (PIC) 3910 (receiving). Here a virtual image 3906 of the PIC 3910 is shown on a virtual plane 3908. FIG. 40 is a side view illustrating an optical prism system 4000 to compensate for a non-zero antenna emission angle. Here a telecentric lens 4002 is used to collimate the light from an antenna array to free space through a prism (transmitting) or focus light through a prism to an antenna array 4004 (PIC) (receiving). FIG. 41 is a side view 4100 illustrating a micro-prism array to compensate for non-zero antenna emission angle. Here a telecentric lens 4102 is used to collimate the light from an antenna array to free space through micro prisms (transmitting) or focus light through micro prisms to an antenna array 4104 (PIC)(receiving).

The mirror or prism can bend the light so that the reflected or refracted rays incident onto the lens system with zero incidence angle. Because the mirror or prism can rotate, they can be adjusted during the calibration stage to compensate for the fabrication errors. Meanwhile, a telecentric lens can be used to match the tilted emission array. The advantage of this approach is that it does not require complicated lens design.

Figure 42A:
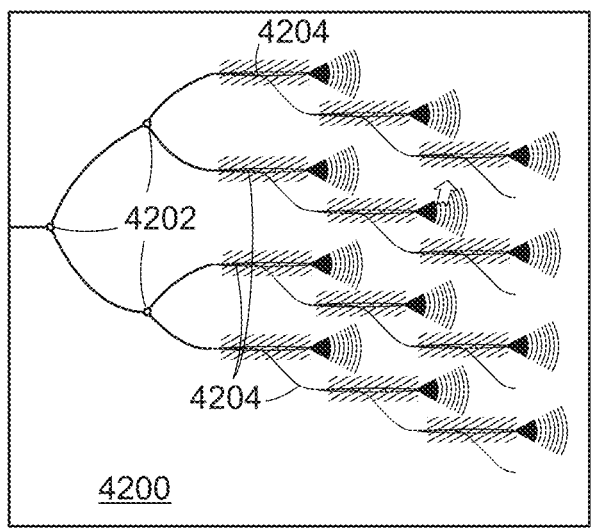
FIG. 42A is a top view of an antenna array with splitter trees and switches.
Figure 42B:
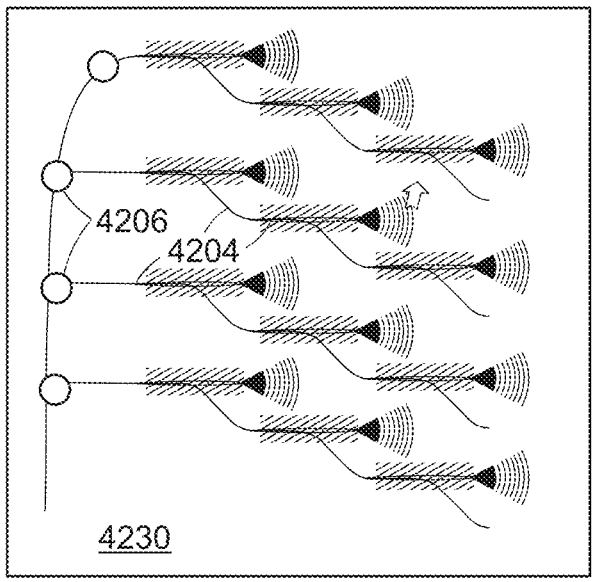
FIG. 42B is a top view of an antenna array with multiple switch types.
Figure 42C:
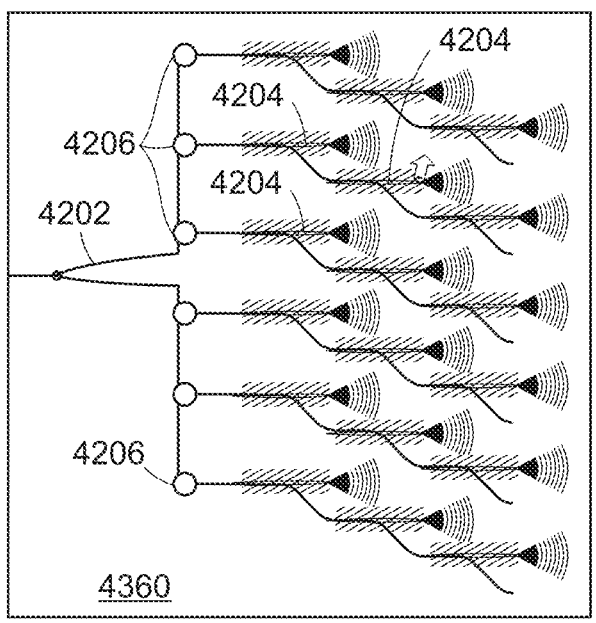
FIG. 42C is a top view of an antenna array with splitter trees and multiple switch types.

The proposed system can be used in chip-Lidar system, including time-of-flight (ToF) operation and frequency modulated continuous wave (FMCW) operation. In a chip-Lidar system, light is coupled onto one waveguide of the PIC and then distributed into sub-waveguides. FIG. 42A is a top view of an antenna array 4200 with splitter trees 4202 and optical switches 4204. FIG. 42B is a top view of an antenna array 4230 with multiple switch types, in this example, there are type I switches 4206 and optical switches 4204. FIG. 42C is a top view of an antenna array 4360 with splitter trees 4202 and multiple switch types such as type I switches 4206 and optical switches 4204. The proposed MEMS switch can be combined with splitter trees (FIG. 42A) or other types of binary switches (FIG. 42B) or switches and splitter trees (FIG. 42C) for light distribution. FIG. 42B shows a layout with two types of binary switches. Referring to the transmitting terminal as an example, light is propagating in the main waveguide. At the intersection of the main waveguide and the row waveguide, type I switch can selectively guide the light into the selected row (the second row from the top is selected in the drawing). Then light propagates in the selected row waveguide until it reaches the ON state MEMS switch (switch type II) and emits out. The type I switch can be either MEMS switch or other switches such as thermo-optic switch, electro-optic switch, etc. FIG. 42A shows a layout with splitter trees. The difference between these two layouts is that in the splitter tree layout, the optical power from the laser is distributed evenly into the waveguides, while in the combined binary switch layout, the light from the laser is selectively guided to one waveguide at a time. These two layouts can be combined in a third layout, as shown in FIG. 42C. In this layout, light from the laser is distributed into several sections of waveguide subarrays, then in each waveguide subarray, binary switches are used to selectively guide the light to desired waveguides. This layout enables the MEMS switches in various subarrays to be controlled independently and simultaneously. All these layouts can work in the MEMS switch array based transmitting/receiving terminals. In the layout of FIG. 42B and FIG. 42C, the active row is selected by the type I switch, while the active column is selected by the type II switches. Therefore, the control complexity for a M×N array scales linearly with the array size (O(M+N)) rather than quadratically (O(M×N)).

This section will disclose MEMS switch and arrays moving in-the-plane for optical coupling. The proposed MEMS switches can be used to couple light from waveguide on photonic integrated circuit (PIC) chip to free space in various applications.

Figure 43A:
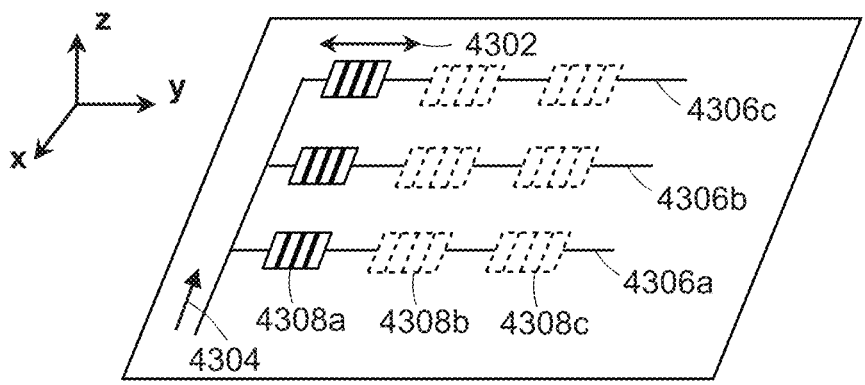
FIG. 43A is a perspective view of a switch array with a moveable grating that travels longitudinally with multiple stop positions.
Figure 43B:
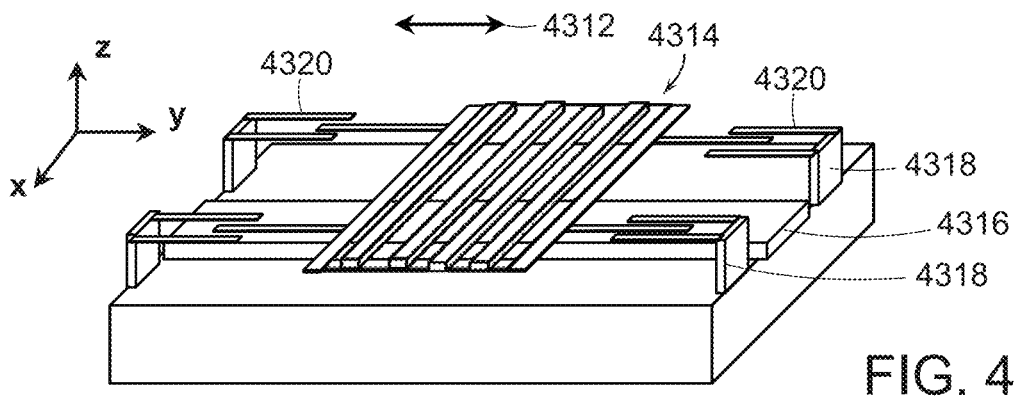
FIG. 43B is a perspective detailed view of a moveable grating that travels longitudinally with multiple stop positions to the bus waveguide from FIG. 43A.

FIG. 43A is a perspective view of a switch array with a moveable grating that travels longitudinally with multiple stop positions. In this embodiment, the grating 4308 travels longitudinally such that there are multiple stopping positions, this illustration shows 3 stopping positions, 4308a, 4308b, and 4308c. In this embodiment, the neutral position may be 4308a such that based on voltage applied to the interdigitated electrodes will move the grating to the other positions 4308b, and 4308c. Also, the grating may be configured such that the neutral position is in the middle 4308b, such that a positive voltage across the interdigitated electrodes moves the grating to one position (e.g., 4308a) and a negative voltage across the interdigitated electrode moves the grating to the other position (e.g., 4308c). In this illustration, the light travels down the waveguide 4304 and to three bus waveguides 4306a, 4306b, and 4306c. As described previously, the light may travel down via a beam splitter, or an optical switch, and the light may also travel in the opposite direction of 4304. FIG. 43B is a perspective detailed view of a moveable grating 4314 that travels longitudinally 4312 with multiple stop positions to the bus waveguide 4316 from FIG. 43A. The bus waveguide 4316 is supported by the substrate. The substrate supports an anchor 4318 which is coupled with the interdigitated electrodes 4320.

Figure 43C:
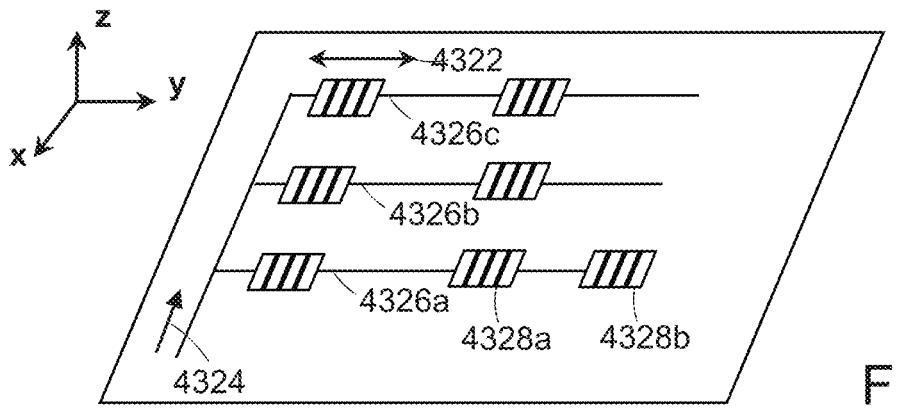
FIG. 43C is a perspective view of a switch array with a moveable grating that travels longitudinally to the bus waveguide.
Figure 43D:
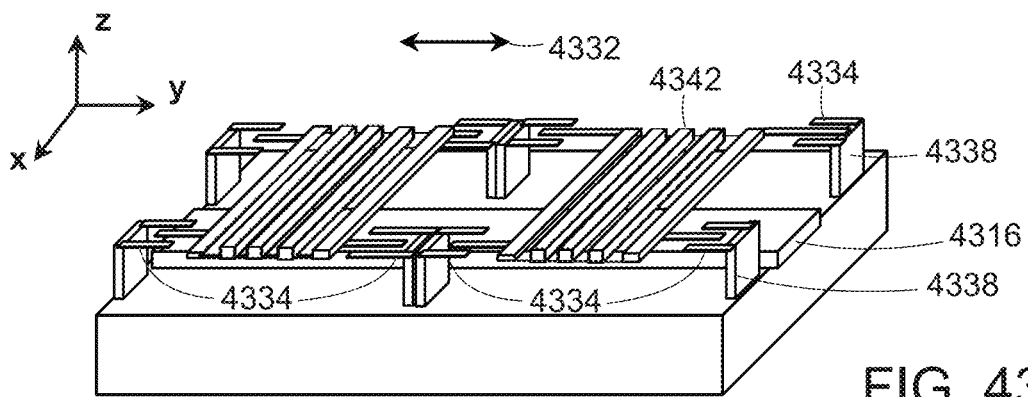
FIG. 43D is a perspective detailed view of two moveable gratings that travel longitudinally to the bus waveguide from FIG. 43C.
Figure 43E:
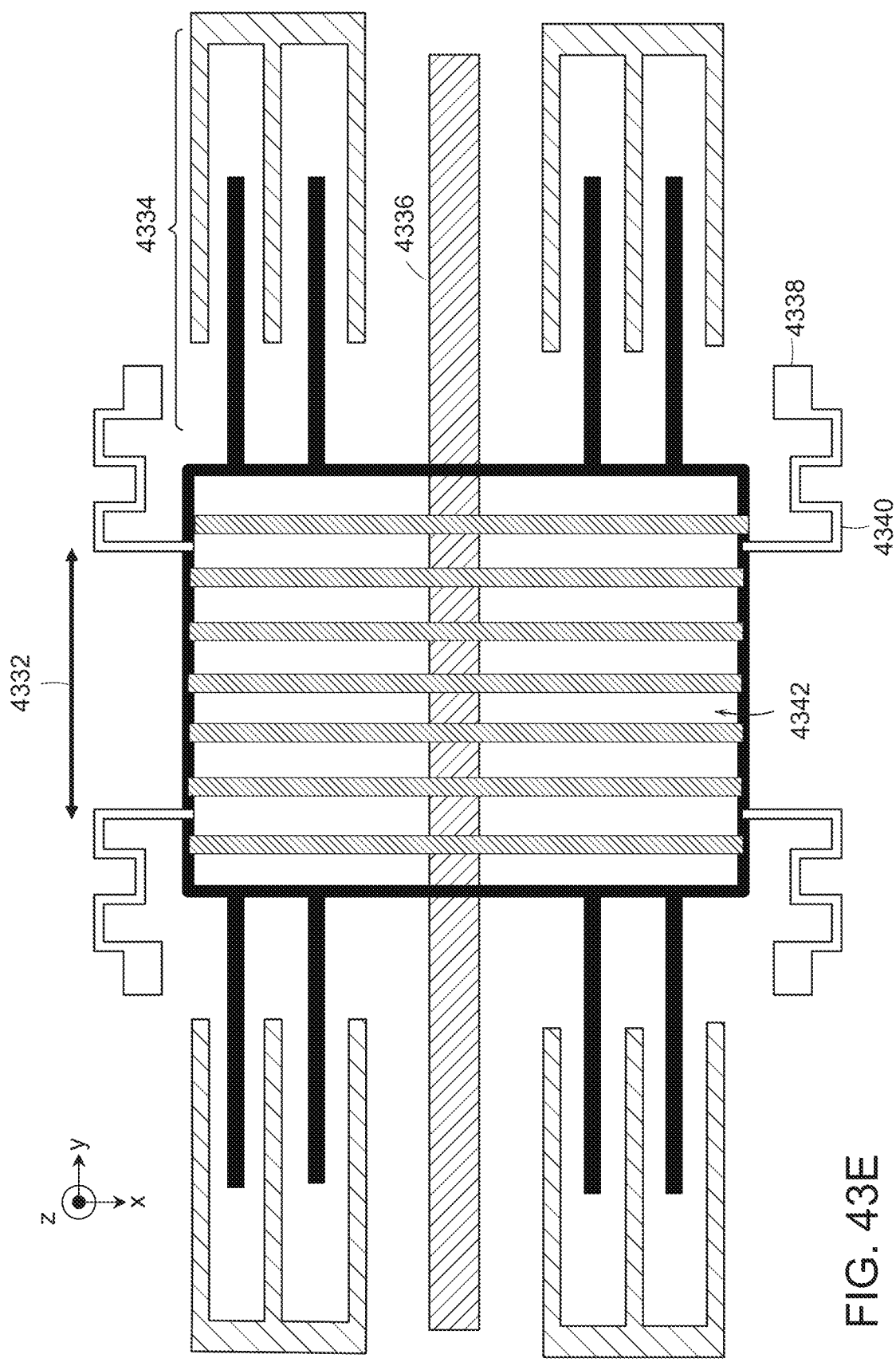
FIG. 43E is a top view of a movable grating that travels longitudinally to the bus waveguide via interdigitated electrodes.

FIG. 43C is a perspective view of a switch array with a moveable grating 4328 that travels longitudinally 4322 to the bus waveguide 4326. This illustration shows 2 stopping positions, 4328a and 4328b. In this embodiment, the neutral position may be 4328a such that based on voltage applied to the interdigitated electrodes will move the grating to the other position 4328b. In this illustration, the light travels down the waveguide 4324 and to three bus waveguides 4326a, 4326b, and 4326c. As described previously, the light may travel down via a beam splitter, or an optical switch, and the light may also travel in the opposite direction of 4324. FIG. 43D is a perspective detailed view of two moveable gratings 4342 that travel longitudinally to the bus waveguide 4316 from FIG. 43C. The bus waveguide 4316 is supported by the substrate. The substrate supports an anchor 4338 which is coupled with the interdigitated electrodes 4334. FIG. 43E is a top view of a movable grating 4342 that travels longitudinally 4332 to the bus waveguide 4336 via interdigitated electrodes 4334. The bus waveguide 4336 is supported by the substrate. The substrate supports an anchor 4338 which is coupled with the interdigitated electrodes 4334. A spring 4340 is coupled with the grating 4342 on one side and an anchor 4338 on the other.

Figure 44A:
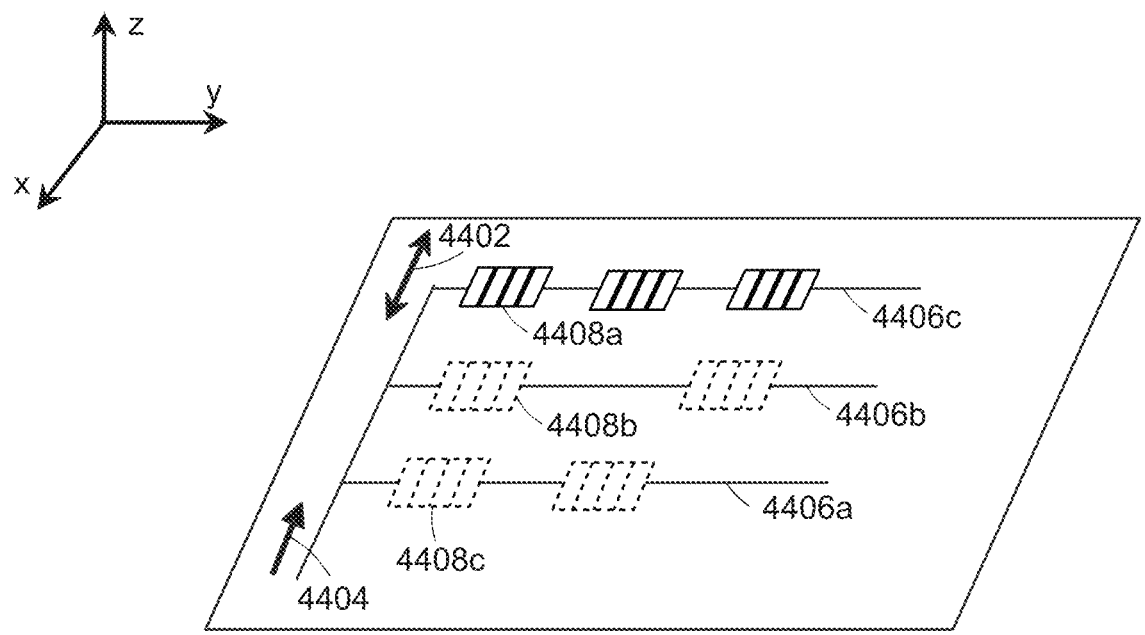
FIG. 44A is a perspective view of a switch array with a moveable grating that travels transversely to the bus waveguide with multiple stop positions.
Figure 44B:
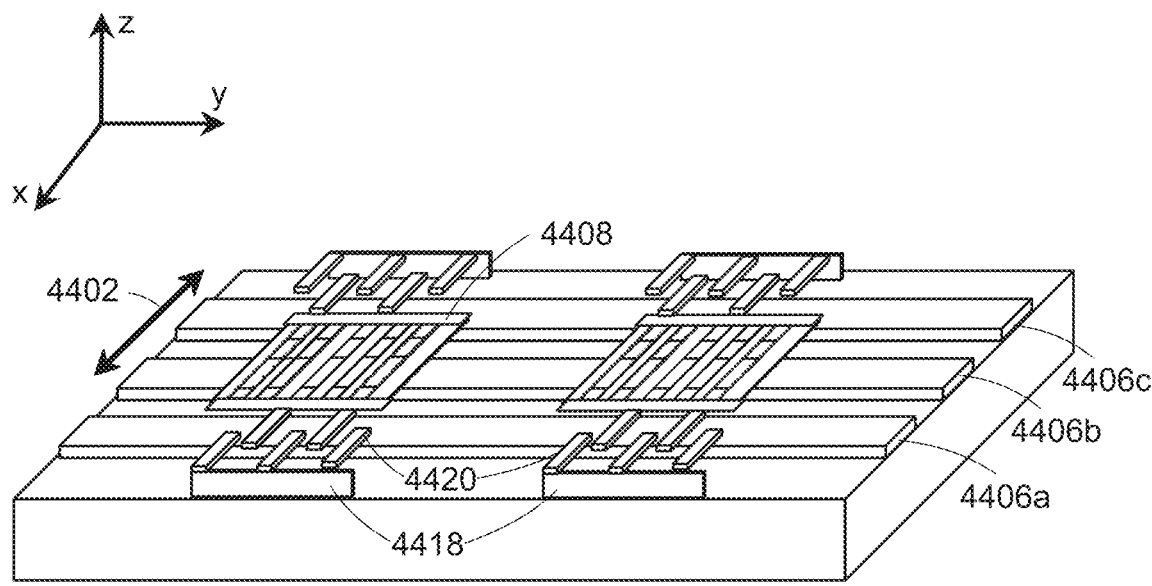
FIG. 44B is a perspective detailed view of a moveable grating that travels transversely to the bus waveguide with multiple stop positions of the switch array from FIG. 43A.
Figure 44C:
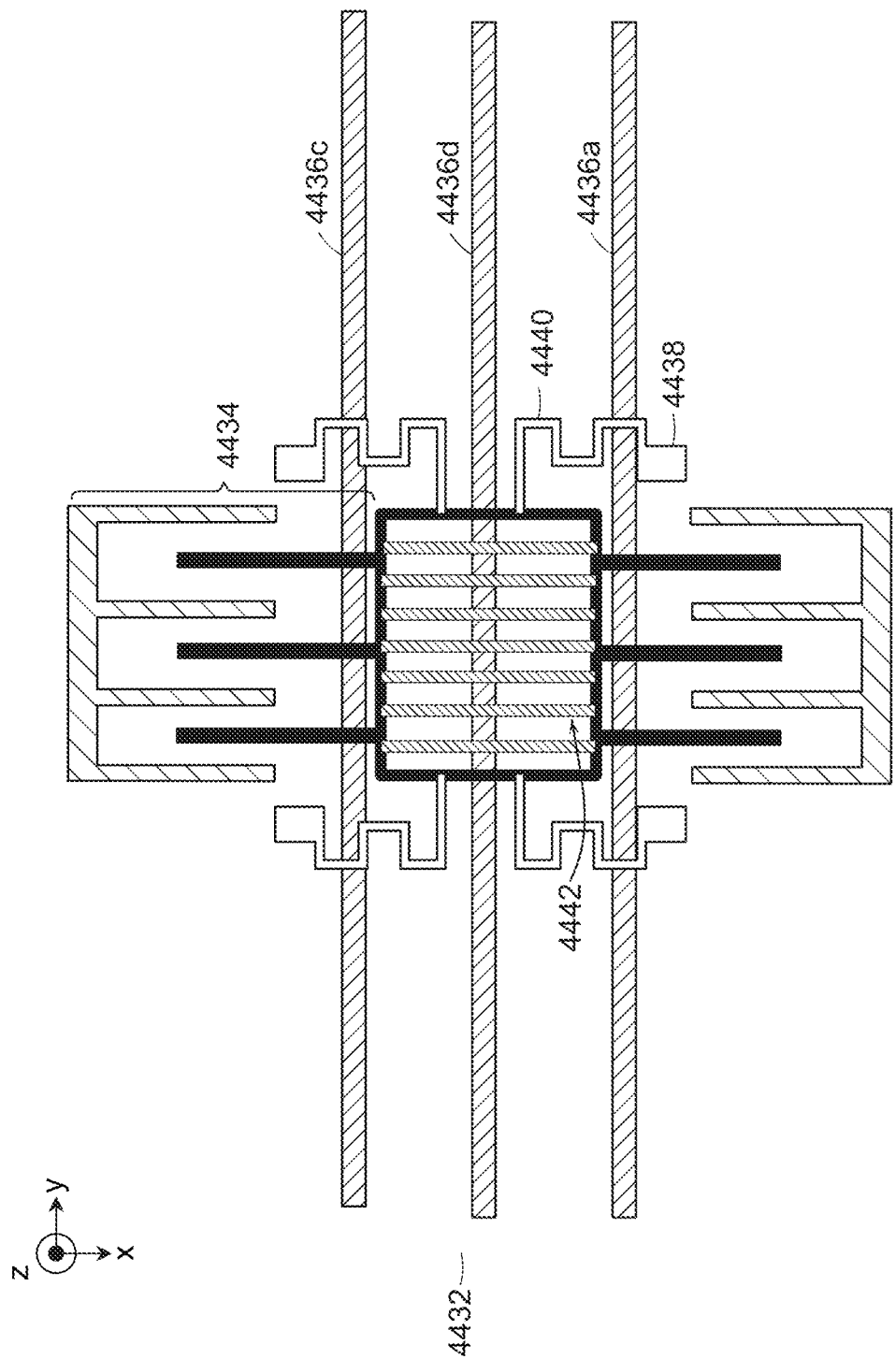
FIG. 44C is a top view of a movable grating that travels transversely to the bus waveguide via interdigitated electrodes.

FIG. 44A is a perspective view of a switch array with a moveable grating 4408 that travels transversely 4402 to the bus waveguide 4406 with multiple stop positions. In this embodiment, the grating 4408 travels transversely such that there are multiple stopping positions, this illustration shows 3 stopping positions, 4408a, 4408b, and 4408c. In this embodiment, the neutral position may be 4408a such that based on voltage applied to the interdigitated electrodes will move the grating to the other positions 4408b, and 4408c. Also, the grating may be configured such that the neutral position is in the middle 4408b, such that a positive voltage across the interdigitated electrodes moves the grating to one position (e.g., 4408a) and a negative voltage across the interdigitated electrode moves the grating to the other position (e.g., 4408c). In this illustration, the light travels down the waveguide 4404 and to three bus waveguides 4406a, 4406b, and 4406c. As described previously, the light may travel down via a beam splitter, or an optical switch, and the light may also travel in the opposite direction of 4404. FIG. 44B is a perspective detailed view of a moveable grating 4408 that travels transversely 4402 to the bus waveguide 4406 with multiple stop positions of the switch array from FIG. 44A. The bus waveguide 4406 is supported by the substrate. The substrate supports an anchor 4418 which is coupled with the interdigitated electrodes 4420. FIG. 44C is a top view of a movable grating 4442 that travels transversely to the bus waveguide 4436 via interdigitated electrodes 4434. In this illustration a spring 4440 is coupled with an anchor 4438 that is coupled with the substrate. The other end of the spring 4440 is coupled with the grating 4442 such that force applied by the interdigitated electrodes 4434 will move the grating 4442 to be over a bus waveguide 4436 as described above.

Figure 45:
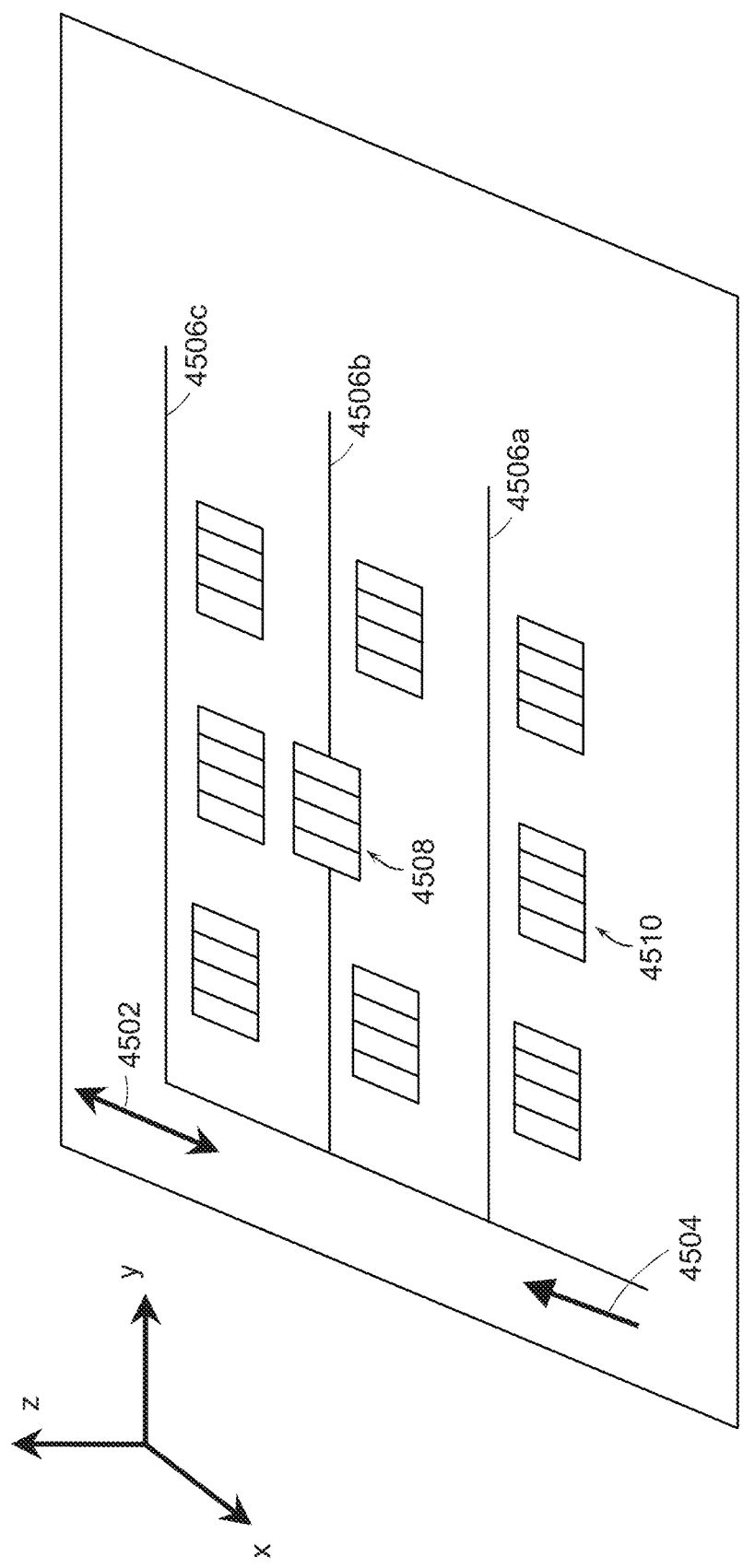
FIG. 45 is a perspective view of a switch array with a moveable grating that travels transversely with stop positions in-plane and off-plane with waveguides.

FIG. 45 is a perspective view of a switch array with a moveable grating that travels transversely 4502 with stop positions in-plane and off-plane with waveguides 4506. In this embodiment, light travels down the bus waveguide in a direction 4504 and is distributed to three bus waveguides 4506a, 4506b, and 4506c. In this embodiment, grating that are off-plane, are shown as 4510 and are not aligned with any bus waveguide 4506. Grating that are in-plane, are shown as 4508 and are aligned with a bus waveguide 4506 such that there is optical coupling between the grating 4508 and the bus waveguide 4506b.

FIGS. 43, 44 and 45 show three examples of in-plane movable MEMS switches in the amplitude array Lidar application. In all of these three figures, grating antenna are used as an example to illustrate the switch concepts, other antenna designs would also work for these switch concepts. In all these three designs, the MEMS switch layer is suspending above the bus waveguide layer. The gap distance between the MEMS switch layer and bus waveguide layer is several nanometers to hundreds of nanometers so that the coupling efficiency between the MEMS switch and bus waveguide is sufficient for more than 50% of the light to be coupled from bus waveguide to MEMS switch layer. In FIG. 43, the MEMS switches can move along the waveguide, and the pixels are virtual pixels which are defined by the stop position of the MEMS switch. Whenever the MEMS switch stops, the light coupled out from that position, and that virtual pixel is turned on. Depending on the dimension of the waveguide and the movement range of the MEMS switch, there could be one (FIGS. 43A and 43B) or more than one (FIGS. 43C and 43D) MEMS switch covering one waveguide length. In FIG. 44, the MEMS switches can move in-plane along x-direction across multiple waveguides. Similar to the design in FIG. 43, the pixels are also virtual pixels defined by the stop position of the MEMS switches. Depending on the dimension of the waveguide array and the movement range of the MEMS switch, one MEMS switch can cover all the waveguides in the array or partial waveguides in the array. One advantage of the MEMS switch shown in FIG. 43 and FIG. 44 is that the switches move in-plane, which is easier to be implemented than the out-of-plane movable switches. Also, the virtual switch stops allow switches to stop at any position along the movement path flexibly.

FIG. 45 shows another in-plane MEMS switch design. Different than the design in FIG. 44, the pixels here are real pixels defined by the relative overlap of MEMS switches and bus waveguides. In OFF state, the switches are located off the waveguides, and in ON state, the switch moves to have overlap with the waveguide. Its advantage is that the movement distance for each switch is small so that the switches are easier to implement.

The proposed in-plane MEMS switches can also be organized in an array and combine with lens to do beam steering in optical transmitter, receiver, or transceiver terminals. All the switch combination and splitter tree combination concepts and row/column wiring concepts also work with the proposed in-plane MEMS switches.

The concepts of a vertically movable MEMS switch with cantilever coupler and fixed optical antenna as presented in this disclosure require stopping the cantilever coupler. For the vertically movable MEMS switches (e.g., FIGS. 4A-4C, FIG. 6), stopping the MEMS switch or optical cantilever at a certain distance away above the bus waveguide needs to be controlled. A mechanical stoppers (a bump) may be used to mechanically stop the MEMS switches. However, as the suspending layer will contact the mechanical stoppers in every operation, the mechanical stoppers may wear out and may thereby degrade light coupling performance of the system. Here a system and method of electrostatic levitation is used as a MEMS switch stopper in the MEMS switch light coupling application.

Figure 46:
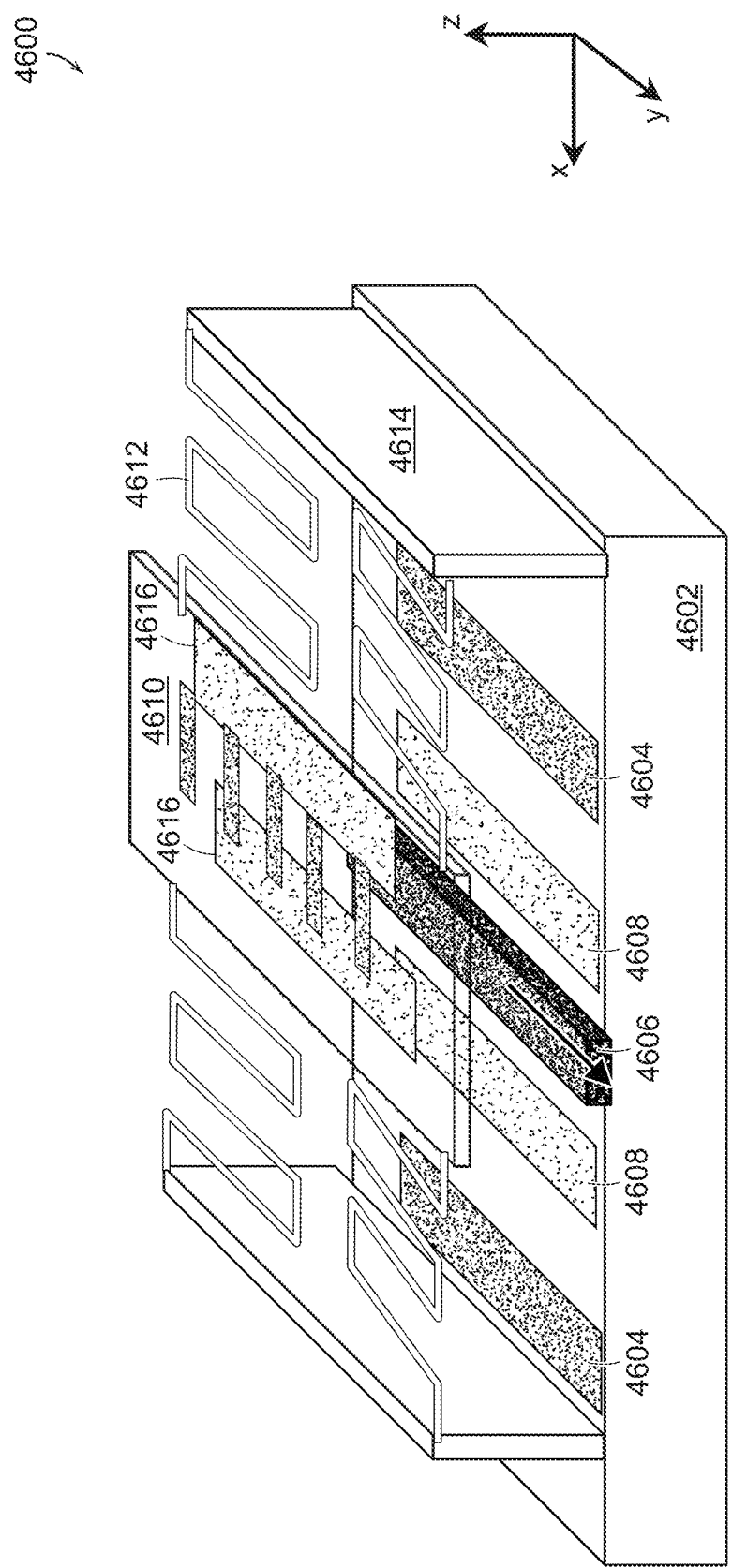
FIG. 46 is a perspective view of a switch with electrostatic levitation to control a coupling distance between a bus waveguide and the gratings.

FIG. 46 is a perspective view of a switch 4600 with electrostatic levitation to control a coupling distance between a bus waveguide and the gratings. The electrostatic levitated switch 4600 has a substrate 4602 that supports bottom side or repulsion electrodes 4604, a bus waveguide 4606, bottom center or activation electrodes 4608, and anchors 4614. Supported above the bus waveguide 4606 is an optical grating 4610 suspended by a spring 4612 that is coupled with the anchor 4614. Positioned on the grating 4610 is a top or reaction electrode 4616. The methods of controlling the stop position of vertically movable MEMS switches with non-mechanical stoppers are described. One method of utilizing electrostatic levitation is shown in FIG. 46 (switchable MEMS grating is used as an example to illustrate the concept). In such a design, the bottom center electrodes and top electrodes are used to electro-statically actuate the MEMS structure to the pull-in or beyond the pull-in state, then the bottom center electrodes and top electrodes are kept in the same voltage level (for example, both are ground), and a large positive voltage is applied to the bottom side electrodes. Therefore, the large electric field generated by the bottom side electrode voltage push the MEMS stricture up, and eventually hold the structure a certain distance above the bus waveguide. The advantage of the electrostatic levitation stopper is that the suspending layer does not physically touch the bottom bus waveguide layer, so that there's no stiction problem or physical wearing-out concerns during the MEMS operation. However, this method request relatively high voltage to hold the suspending layer at a certain position.

Figure 47A:
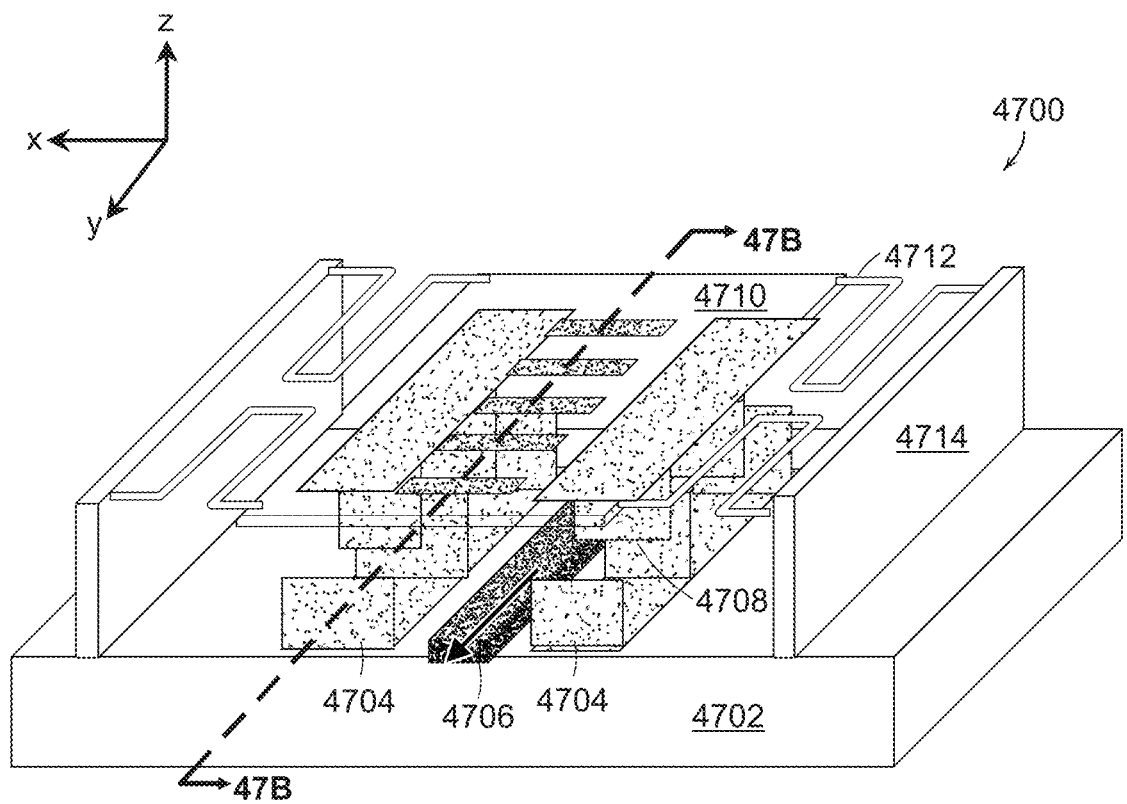
FIG. 47A is a perspective view of a switch with a comb drive to control a coupling distance between a bus waveguide and the gratings.
Figure 47B:
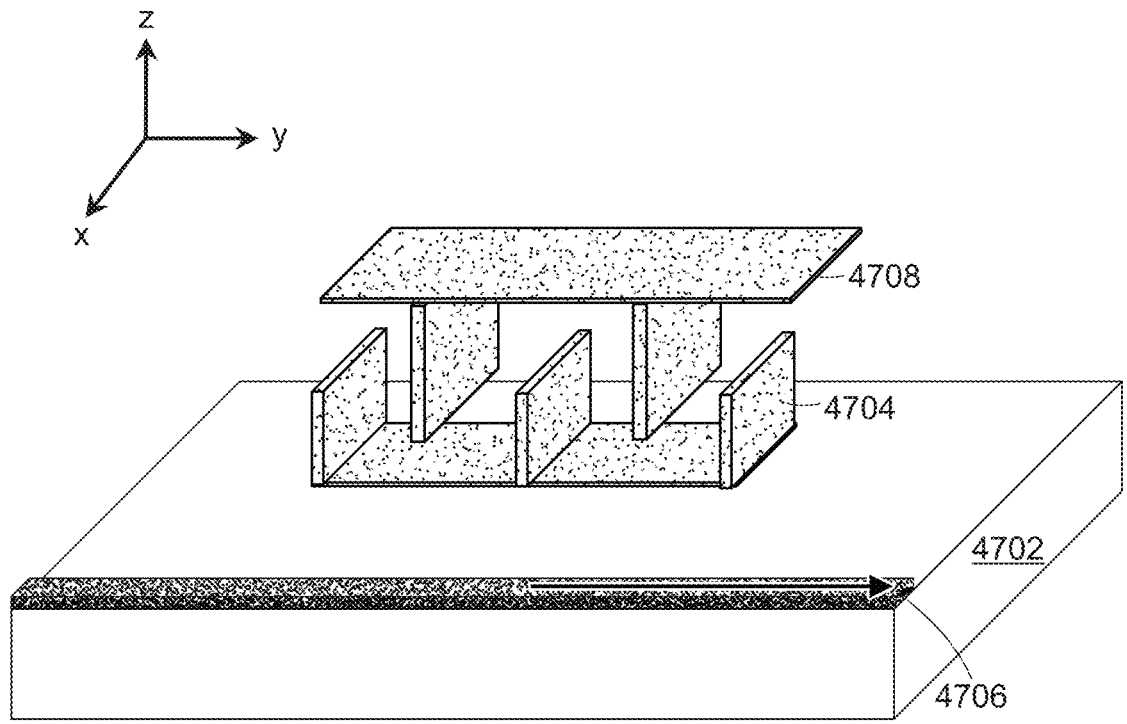
FIG. 47B is a cross-sectional view along a cut of FIG. 47A illustrating the comb drive.

Another method is to use comb drive, one example is shown in FIGS. 47A and 47B. FIG. 47A is a perspective view of a switch 4700 with a comb drive to control a coupling distance between a bus waveguide 4706 and the gratings 4710. The electrostatic comb levitated switch 4700 has a substrate 4702 that supports bottom side or activation comb electrodes 4704, a bus waveguide 4706, and anchors 4714. Supported above the bus waveguide 4706 is an optical grating 4710 suspended by a spring 4712 that is coupled with the anchor 4714. Coupled with the optical grating 4710 is a top or reaction comb electrode 4708. FIG. 47B is a cross-sectional view along a cut of FIG. 47A illustrating the comb drive in which the bottom side or activation comb electrodes 4704 are interdigitated with the top or reaction comb electrode 4708 adjacent to the bus waveguide 4706. In this illustration, the fins of the comb drive are perpendicular with the bus waveguide 4706, but the fins may also be configured to be parallel with the bus waveguide 4706.

Finger electrodes are formed on the movable suspending layer (top electrodes) and fixed substrate layer (bottom electrodes). The electric field direction between top and bottom electrodes can be controlled by the polarity of voltages added to the electrodes. When the voltage added to top electrodes is higher than the bottom electrodes, electric field is going downward and can pull the suspending layer to move towards the bus waveguide. Once it reaches a certain position, changing the top electrodes voltage to be smaller than the bottom electrodes, the electric field is going upward and can help overcome the gravity and hold the suspending layer at a certain position. The advantage of comb drive is that it does not request as much voltage as electrostatic levitation, and it's also a non-mechanical stopper.

In this disclosure, various designs of MEMS switches and switch arrays have been disclosed. Those various designs being used in the optical transmitting, receiving and transceiving terminals. Now methods of integrating the MEMS switches and switch arrays into a chip-Lidar system, and packaging such system is described.

Figure 48:
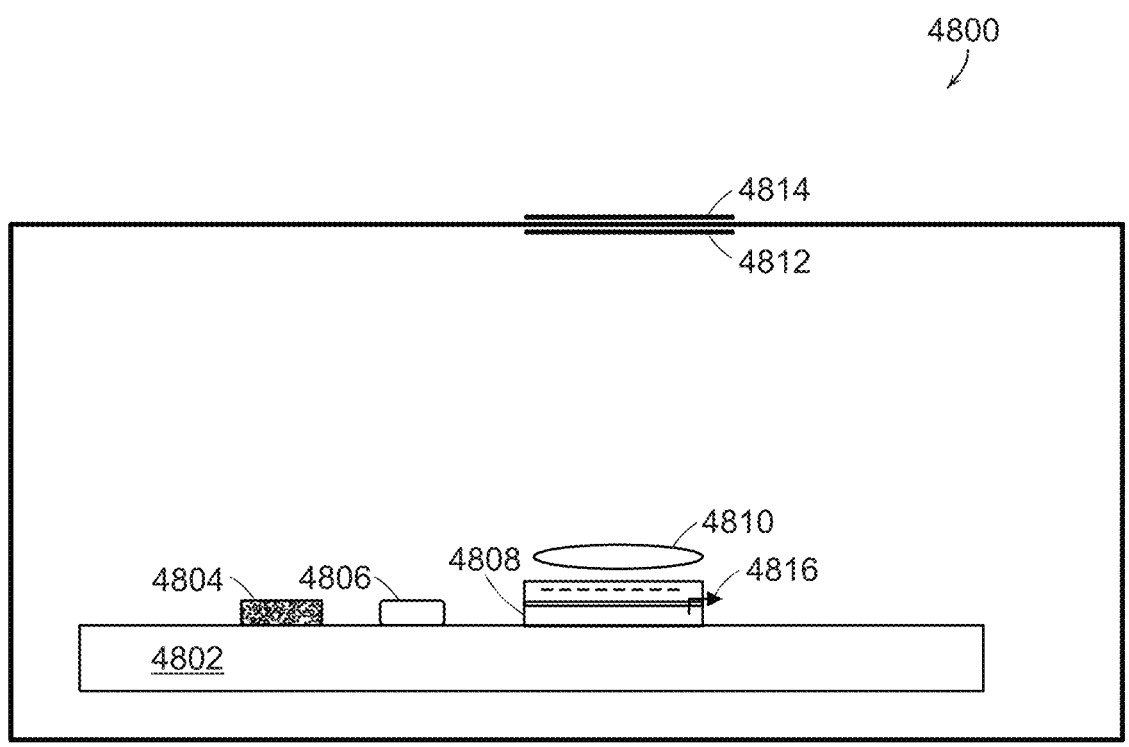
FIG. 48 is a cross-sectional view of a switch array system illustrating packaging.

MEMS switch array based chip-Lidar system integrate MEMS structures onto a silicon photonics platform. This combination of MEMS structure and silicon photonics platform raises new challenges that are not present in MEMS-only systems and silicon-photonics-only systems. Therefore, system integration and packaging needs to be well designed and processed. FIG. 48 is a cross-sectional view of a switch array system illustrating the integration and packaging of a MEMS switch array based chip-Lidar module 4800.

MEMS structures can have multiple failing mechanisms (e.g., dust, moisture), therefore, all the components of the chip-Lidar need to be packaged together and hermetically sealed. A hermetically sealed LIDAR module 4800 includes a heat sink/substrate platform 4802, a light source 4804 (e.g., laser, LED, or other commonly used light source), a light coupling component 4806, a photonic integrated circuit (PIC) chip with MEMS switch and ASIC control 4808, a lens 4810, an anti-reflective inner coating 4812, an anti-reflective outer coating 4814, one or more photo detector(s) 4816 (e.g., photo diode, photo transistor, charge couple device, or other commonly used photo detector), and other necessary coupling components. The light source 4804 may be coherent and polarized.

One example of system integration and packaging is shown in FIG. 48. All the components are integrated on one substrate platform with heat dissipation mechanisms, and hermetic sealed in one package. The cap of the package includes a window area which is transparent to the wavelength that is used in the LIDAR chip so that the light can emit out from the package and return back to the PIC chip. This window area can cover part or entire surface of the cap. Anti-reflection coatings on the inside and outside surface of the window can help reduce the reflection when light transmit through the window. Different parts of the system may be packaged into different pressure levels and with different compositions of gas. For example, the MEMS switch array/PIC 4808 needs a certain pressure level (e.g., above 1 Torr) to induce damping so that MEMS switches can stop at the position to turn on the switch. To reach this purpose, heavy gases such as nitrogen, argon, etc. are used to fill the chamber till the needed pressure level is reached. While other than this area (i.e., within the hermetically sealed module 4800), the pressure may be a vacuum pressure level (e.g., below 1 mTorr) to minimize the influence of particles and moisture. The hermetically sealing temperature of 4800 should be lower than the temperature threshold levels that may affect the performance of the other components (e.g., PIC 4808, light source 4804, photo detector 4816) in the system. For example, the sealing temperature is recommended to stay below 300° C. so that the laser performance wouldn't be affected. Regarding the integration of an ASIC, die bonding via silicon throughputs can minimize the influence of electrical paths on the switching speed and switching performance.

This section proposes multiple designs and concepts of MEMS switch and its array for optical coupling. These proposed structures can be used in optical terminals for optical beam steering. Here, different design and layout arrangement methods for MEMS switch and MEMS switch array are described. All these methods can be used in building optical beam steering terminals.

Figure 49:
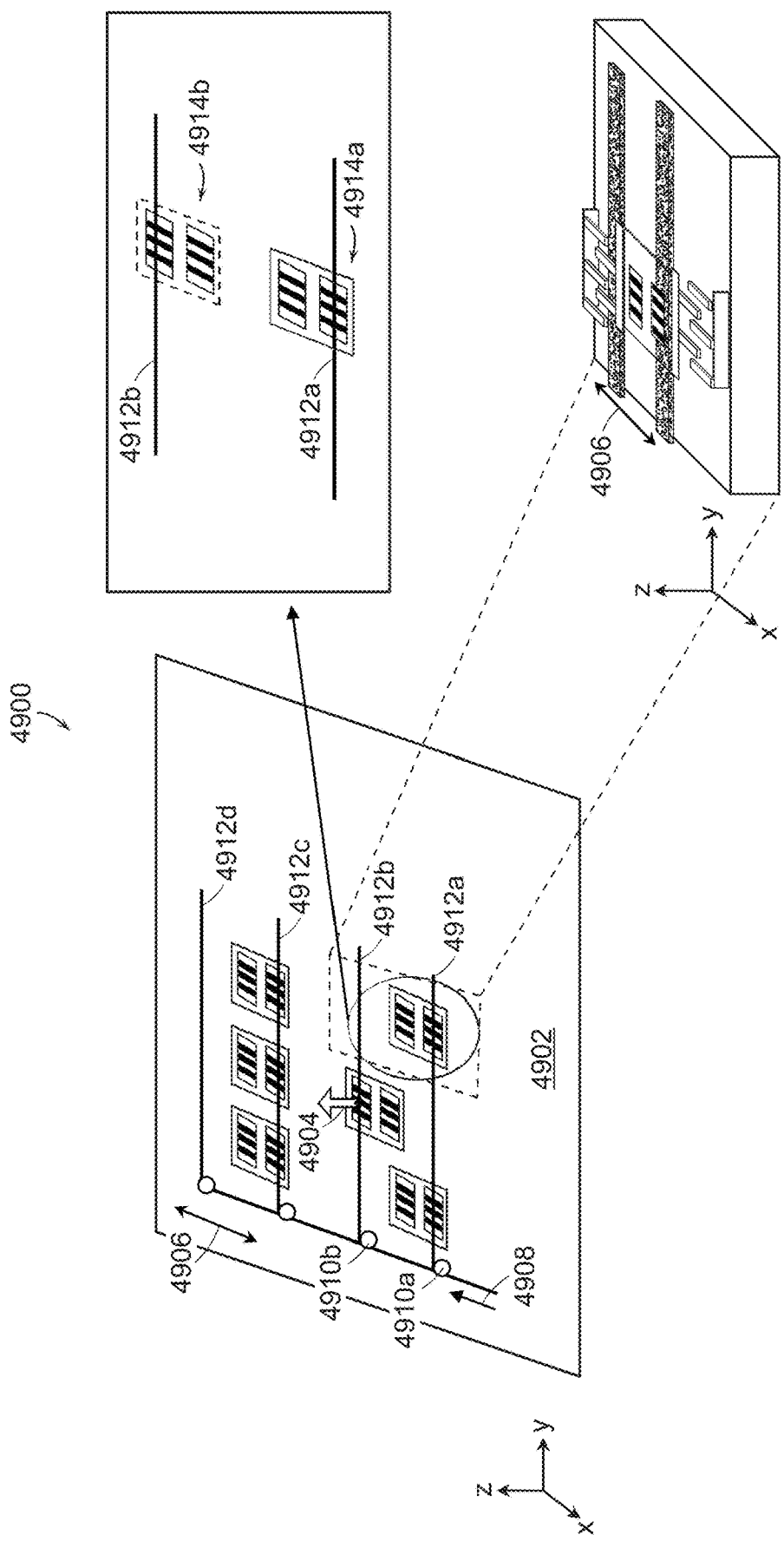
FIG. 49 is a perspective view of a dual grating switch that travels transversely with stop positions in-plane with waveguides.

One example of the MEMS switch array design is shown in FIG. 49. FIG. 49 is a perspective view of a dual grating switch 4900 that travels transversely 4906 with stop positions in-plane with waveguides 4912. The substrate 4902 has multiple type I switches (e.g., 4910*a*, 4910*b*) to channel light to bus waveguides 4912*a*, 4912*b*, 4912*c*, and 4912*d*. In this illustration, the dual grating 4914*a* and 4914*b* is either aligned such that grating 4914*a* is aligned with a bus waveguide 4912*a*, or such that grating 4914*b* is aligned with bus waveguide 4912*b*, such that light 4904 is coupled.

Here the gratings are used as optical coupler/antenna integrated with the MEMS switch to illustrate the concept. Other optical coupler/antenna designs also work for this concept. In the MEMS switch array shown in FIG. 49, each MEMS switch carries two optical antennas and is in charge of two pixels on top of two adjacent bus waveguides. Each MEMS switch can be actuated horizontally and move the two grating couplers/antennas along x-direction across two waveguides. The MEMS switches have two positions (4914*a* and 4914*b*): one grating overlaps with either one of the two waveguides (one pixel is ON, position 4914*a* and position 4914*b*). For example, to turn on the second pixel above waveguide 4912*b*, the row switch 4910*b* is turned on, and the MEMS switch is actuated to move the two grating couplers/antennas towards −x direction so that one grating coupler/antenna can have enough overlap with waveguide 4912*b* and sufficient light can couple from waveguide 4912*b* to that grating and then emit to free space. Depending on which pixel will be turned on, the switch will be deflected until a certain stop against a mechanical spring (as shown in the single switch sketch in FIG. 49). A comb-drive actuator can be used to actuate in-plane motion of the switch. Since the grating is larger than the waveguide, back and forth bouncing will have only a very small influence on the performance. The deflection can be done electrostatically, inductively, piezo-electrically or similar. The distance between the grating layer and the bus waveguide layer should be small enough to make sure sufficient light can couple from bus waveguide to grating when the switch is at either position 4914*a* or position 4914*b*. The advantage for this design is that the number of MEMS switch is only half of the number of pixels.

Figure 50:
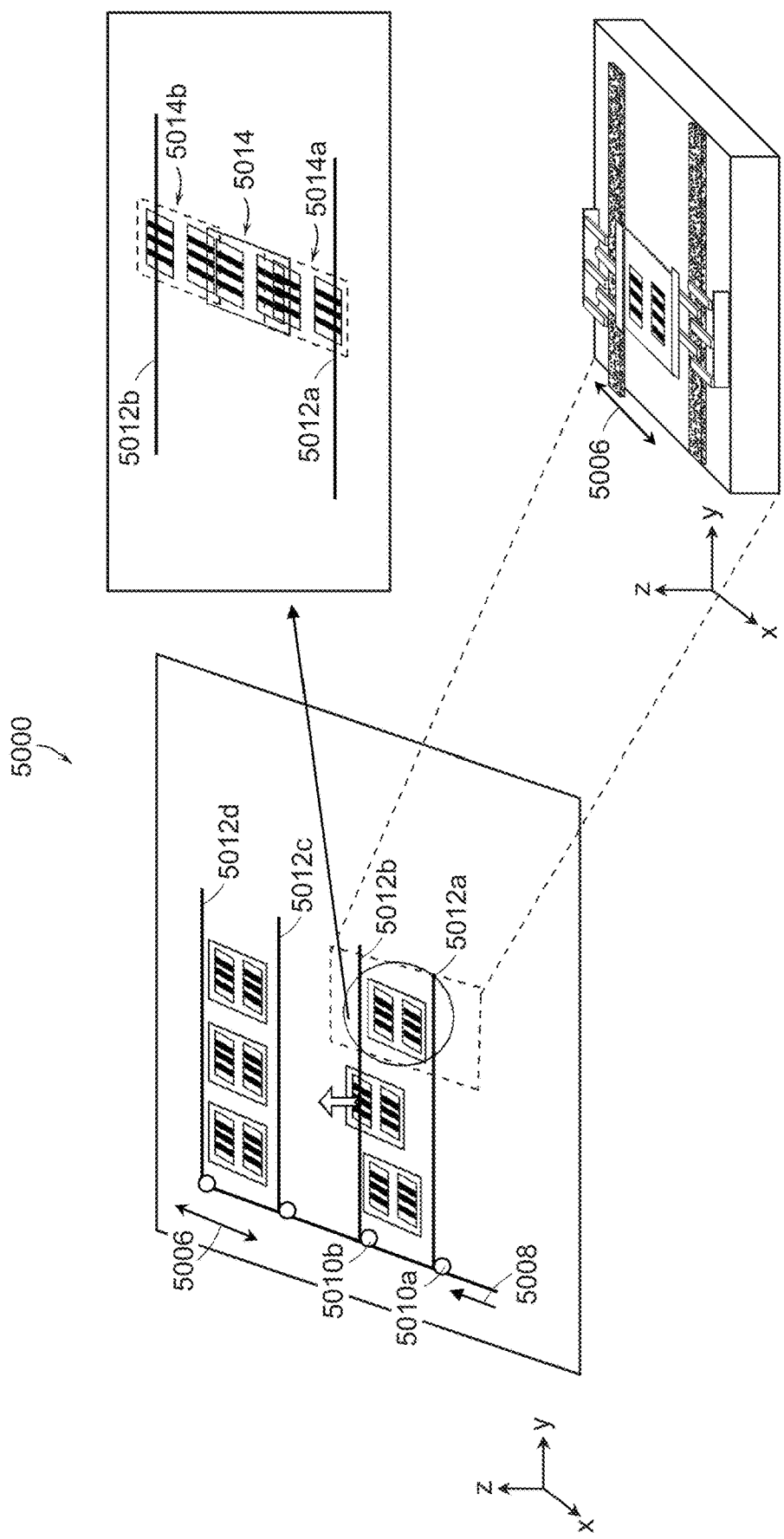
FIG. 50 is a perspective view of a dual grating switch that travels transversely with stop positions in-plane and off-plane with waveguides.

Another design of the MEMS switch array is shown in FIG. 50, where the MEMS switches are also actuated to move horizontally along x-axis and one MEMS switch carry more than one optical couplers/antennas (here again grating is used as a coupler/antenna example to illustrate the concept).

FIG. 50 is a perspective view of a dual grating switch 5000 that travels transversely 5006 with stop positions in-plane and off-plane with waveguides 5012. The substrate has multiple type I switches (e.g., 5010*a*, 5010*b*) to channel light to bus waveguides 5012*a*, 5012*b*, 5012*c*, and 5012*d*. In this illustration, the dual grating 5014*a* and 5014*b* is either aligned such that grating 5014*a* is aligned with a bus waveguide 5012*a*, grating 5014*a* and 5014*b* is centered in between adjacent bus waveguides 5012*a* and 5012*b* such that no light is coupled, or such that grating 5014*b* is aligned with bus waveguide 5012*b* such that light is coupled. These MEMS switches 5000 have three positions as shown in FIG. 50: neutral position where two gratings are located between two waveguides and no overlap with either of them (both pixels are OFF, position 5014), one grating overlaps with one waveguide (one pixel is ON, position 1 and position 5014*a*). Similarly, depending on which pixel will be turned on, the switch will be deflected until a certain stop against a mechanical spring (as shown in the sketch with single switch in FIG. 50). Since the grating is larger than the waveguide, back and forth bouncing will have only a very small influence on the performance. The deflection can be done electrostatically, inductively, piezo-electrically or similar. In this design, however, the row switches are not necessary because position 5014 is a complete OFF position (neither grating is overlapping with either of the bus waveguides). The waveguides can be connected by splitter trees, and by turning the switch to position 5014*a* and 5014*b* to switch on different pixels. In this case, this MEMS switch is a three-way switch. And of course, the distance between the grating layer and the bus waveguide layer should be small enough to make sure sufficient light can couple from bus waveguide to grating when the switch is at either position 5014*a* or position 5014*b*.

Figure 51:
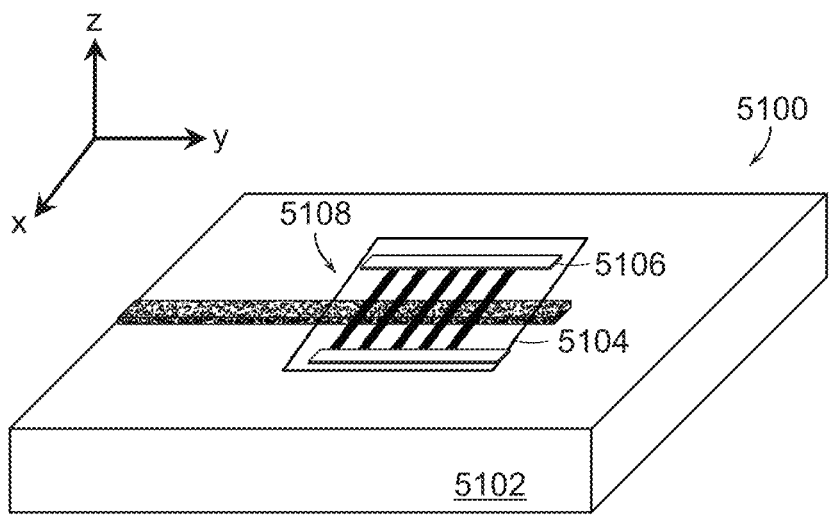
FIG. 51 is a perspective view of a bimorphic switch in which a grating is an in-plane position.
Figure 52:
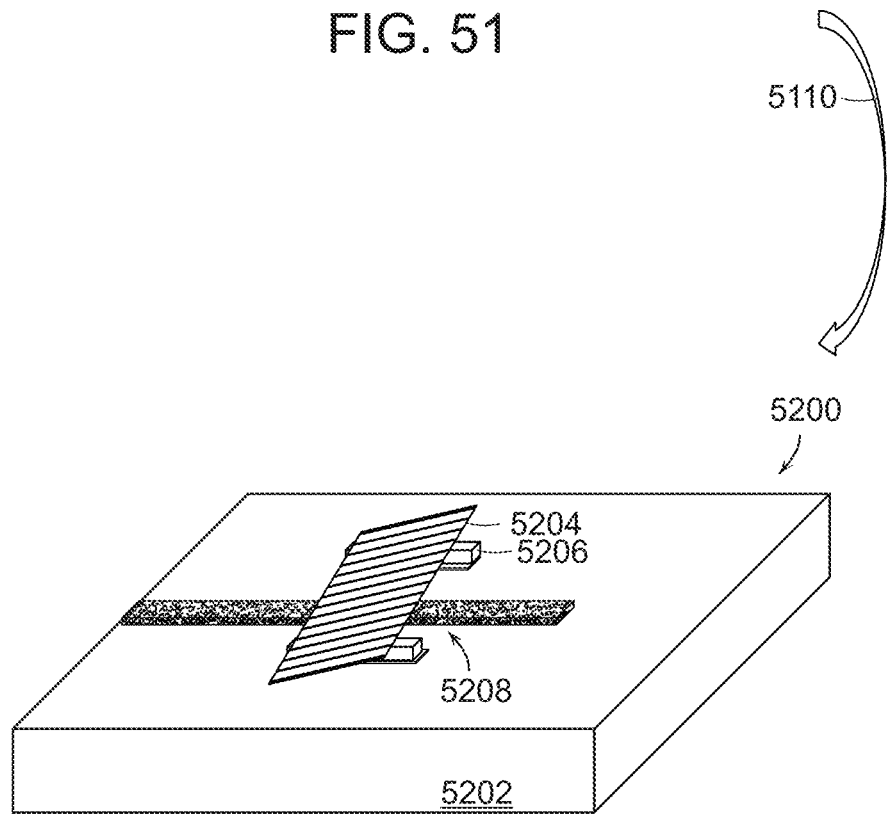
FIG. 52 is a perspective view of a bimorphic switch that rotates a grating vertically in an off-plane position.

FIG. 51 is a perspective view of a bimorphic switch 5100 in which a grating 5108 is an in-plane position. The bimorphic switch 5100 includes a substrate 5102 and suspended above the substrate 5102 is a grating 5108 on a suspension layer 5104 having a bimorphic piezoelectric actuator 5106. When the bimorphic piezoelectric actuator 5106 is activated 5110, the bimorphic switch 5100 moves to FIG. 52. FIG. 52 is a perspective view of a bimorphic switch 5200 that rotates a grating 5208 vertically in an off-plane position. The bimorphic switch 5200 includes a substrate 5202 and suspended above the substrate 5202 is a grating 5208 on a suspension layer 5204 having a bimorphic piezoelectric actuator 5206.

Figure 53:
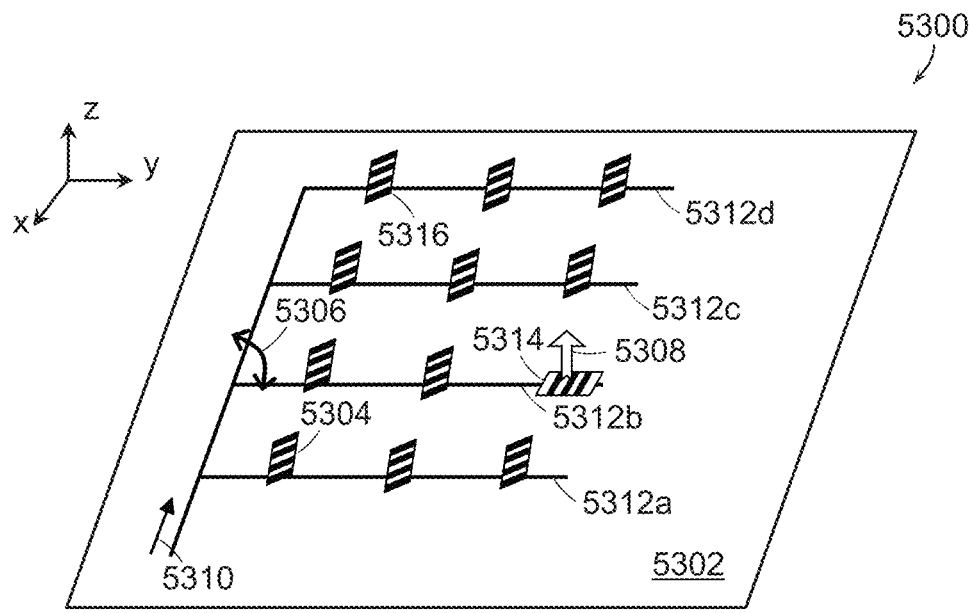
FIG. 53 is a perspective view of switch array in which grating elements rotate about an axis perpendicular with the wave guide.
Figure 54:
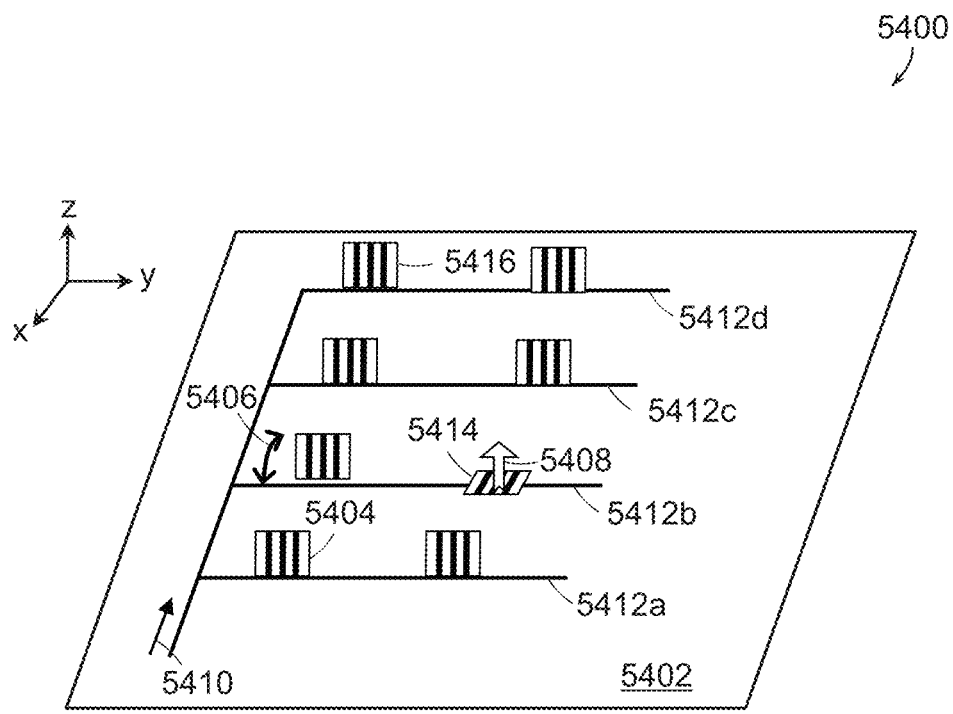
FIG. 54 is a perspective view of switch array in which grating elements rotate about an axis parallel with the wave guide.

FIG. 53 is a perspective view of switch array 5300 in which grating elements rotate about an axis perpendicular with the wave guide (e.g., rotate about the x-axis). A substrate 5302 supports bus waveguides 5312 such that light traveling in a direction 5310 can be distributed to each bus waveguide 5312*a*, 5312*b*, 5312*c*, and 5312*d*. Here gratings 5316, 5304, 5314 are configured to rotate 5306 about the x-axis and when active such as grating 5314, light 5308 is channeled from the bus waveguide 5312*b*. Although this is shown as transmitting light, this can be also be used to receive light. Similarly, FIG. 54 is a perspective view of switch array 5400 in which grating elements rotate about an axis parallel with the waveguide (e.g., rotate about the y-axis). A substrate 5402 supports bus waveguides 5412 such that light traveling in a direction 5410 can be distributed to each bus waveguide 5412*a*, 5412*b*, 5412*c*, and 5412*d*. Here gratings 5416, 5404, 5414 are configured to rotate 5406 about the y-axis and when active such as grating 5414, light 5408 is channeled from the bus waveguide 5412*b*. Although this is shown as transmitting light, this can be also be used to receive light.

MEMS switches can also be designed to tilt or fold, as shown in FIG. 53 and FIG. 54. In the design of FIG. 53, the MEMS switches are actuated to rotate in the y-z plane around x-axis. When the MEMS switch is in parallel with y-axis, there's overlap between grating and bus waveguide, and if the distance between the grating and waveguide is kept small enough, light can couple from bus waveguide to grating and further emit to free space, thus the MEMS switch is turned ON (FIG. 51). When the MEMS switch is tilted to a large enough angle that the light coupling is very weak, the MEMS switch is OFF (FIG. 52). Similarly, as shown in FIG. 54, the MEMS switches are actuated to rotate in the x-z plane around y-axis. The MEMS switch can be actuated by bimorph piezoelectric actuators as shown in FIG. 51 and FIG. 52 or electro active polymers.

Figure 55:
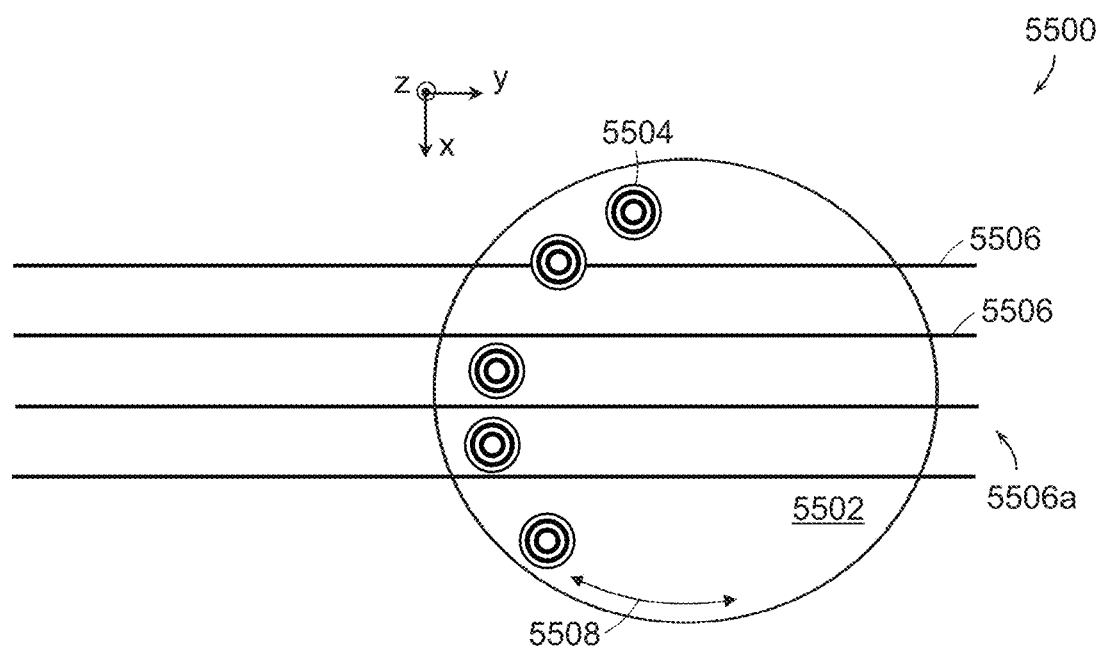
FIG. 55 is a top view of a grating array on a rotary platter that utilizes a rotational mechanism to align in-plane and off-plane operation.

The switches can also be rotated in-plane to slide over the waveguide (like a disc gyro), not only on a 90 degree angle. Similar to FIG. 55, but on a different scale. FIG. 55 is a top view of a grating array 5500 on a rotary platter 5502 that utilizes a rotational mechanism to align in-plane and off-plane operation. The rotary platter 5502 includes gratings 5504 arranged in an array such that rotation 5508 of the platter allows gratings 5504 to align with bus waveguides 5506 to transmit or receive light. An advantage is that the antennas are controlled by one motor only instead of each antenna is controlled by one switch. The antennas can be designed to have a certain pattern that the polarization is not affected during rotation.

Further, the MEMS switchable gratings can use bi-stale membrane to reduce operation power. In this case, the MEMS switch actuation may be a combination of two methods to achieve its ON or OFF state. FIG. 56A is a cross sectional view of a coupler waveguide 5600 with a bi-stable membrane 5612 in an OFF position. A substrate 5602 supports a bus waveguide 5604, an actuation electrode 5606, and a mechanical stop 5608. On a suspended layer is the bi-stable membrane 5612 that includes a reaction electrode 5607, a mechanical stop 5608, and a coupler waveguide 5610. FIG. 56B is a cross sectional view of a coupler waveguide with a bi-stable membrane 5612 in an ON position. The switch, illustrated in FIG. 56A, has the coupler waveguide 5610 (with gratings) on a flexible upper membrane 5612. In the OFF state, the coupler waveguide 5610 is separated from the bus waveguide 5604. To change the switch to the ON state, the coupler waveguide 5610 needs to be pulled down to the bus waveguide 5604 in FIG. 56B. An electrostatic pull-down force applied by electrodes 5606 and 5607 is one actuation method, but this needs constant current to keep the switch on. This would increase the power needed to operate the device. To eliminate the need to keep constant power applied to keep the device on, a stress tuning of the membrane can be implemented to create a bi-stable membrane. This would be done by depositing a compressively stressed film 5612 to the top surface of the membrane coupler waveguide 5610. The stress needs to be tuned such that the membrane is either parallel or very slightly bowed up compared to the lower surface. This membrane has bi-stable characteristics, meaning that it can be flat or slightly bowed up, with no actuation force, and when pulled down with electrostatic actuation, stays down even when the power applied by electrode 5606 and 5607 is stopped. This approach enables turning the switch on by using only a short power pulse to pull it down, and keeping the switch on by the bi-stable membrane itself, no power is needed while the switch is in on state. To return the membrane to the separated off state, a pulsed repulsive electrostatic force is used to push the membrane to the separated off mode.

These proposed in-plane MEMS switches can also be organized in an array and combine with lens to do beam steering in optical transmitter, receiver, or transceiver terminals. All the switch combination and splitter tree combination concepts and row/column wiring concepts also work with the proposed in-plane MEMS switches.

While all of the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the general inventive concept.

What is claimed is:

1. An optical switch comprising:
   a bus waveguide supported by a substrate;
   a coupling waveguide suspended over the bus waveguide;
   a reaction electrode coupled with, and adjacent to, the coupling waveguide;

an actuation electrode supported by the substrate and configured to control a position of the coupling waveguide relative to the bus waveguide via the reaction electrode; and an optical antenna coupled with the coupling waveguide, suspended over the bus waveguide, and disposed at a fixed vertical distance above the bus waveguide, wherein when a voltage difference between the reaction electrode and the actuation electrode is less than a lower threshold, the coupling waveguide is positioned a first distance from the bus waveguide, when the voltage difference between the reaction electrode and the actuation electrode is greater than an upper threshold, the coupling waveguide is positioned a second distance from the bus waveguide, and the second distance is less than the first distance.

2. The optical switch of claim 1, wherein a coupling efficiency between the bus waveguide and the coupling waveguide is greater than 50 percent in response to the voltage difference exceeding the upper threshold and the coupling efficiency between the bus waveguide and the coupling waveguide is less than 1 percent when the voltage difference is less than the lower threshold.

3. The optical switch of claim 1, wherein the lower threshold is 5 Volts, and the upper threshold is 15 volts.

4. The optical switch of claim 1, wherein the second distance is based on a mechanical stop such that the bus waveguide is separated from the coupling waveguide by at least 10 nm.

5. The optical switch of claim 1, wherein the optical antenna is a one dimensional grating that provides a Gaussian beam spot in a far field.

6. The optical switch of claim 1, wherein the substrate is a Silicon on Insulator (SoI) substrate that includes a silicon layer that is coupled with an insulation layer, the bus waveguide is etched in the silicon layer and the actuation electrode is implanted in the silicon layer.

7. The optical switch of claim 6, wherein the silicon layer is Si, SiN, or Si3N4.

8. A beam steering system comprising:
a bus waveguide supported by a substrate;
a coupling waveguide suspended over the bus waveguide;
a reaction electrode coupled with, and adjacent to, the coupling waveguide;
an actuation electrode supported by the substrate and configured to control a position of the coupling waveguide relative to the bus waveguide via the reaction electrode;
an optical antenna coupled with the coupling waveguide, suspended over the bus waveguide, and disposed at a fixed vertical distance above the bus waveguide;
an optical tree having at least one type of optical switch and configured to distribute light to the optical antenna; and
a lens spaced apart from the substrate and configured to diffract the light emitted by the optical antenna,
wherein when a voltage difference between the reaction electrode and the actuation electrode is less than a lower threshold, the coupling waveguide is positioned a first distance from the bus waveguide, when the voltage difference between the reaction electrode and the actuation electrode is greater than an upper threshold, the coupling waveguide is positioned a second distance from the bus waveguide, and the second distance is less than the first distance.

9. The beam steering system of claim 8, wherein the optical antenna is an array of optical antennae arranged in at least one row and at least one column, and the optical tree is configured to selectively enable one of the at least one row or one of the at least one column.

10. The beam steering system of claim 8 further comprising a contact controller, and wherein the optical antenna is an array of optical antennae arranged in at least one row and at least one column, and the contact controller is configured to selectively enable one of the at least one row or one of the at least one column.

11. The beam steering system of claim 8, wherein the lens is configured to translate along a vector perpendicular to the substrate, and the distance from the substrate changes as the lens translates along the vector.

12. The beam steering system of claim 8, wherein the substrate is configured to translate along a vector perpendicular to lens, and the distance of the substrate from the lens changes as the lens translates along the vector.

13. The beam steering system of claim 12, wherein the optical antenna is a one dimensional grating that provides a Gaussian beam spot in a far field, and the Gaussian beam spot is focused on the optical antenna as the substrate translates along the vector.

14. The beam steering system of claim 8 further including,
a receiving bus waveguide supported by the substrate and separate from the bus waveguide,
a receiving coupling waveguide suspended over the receiving bus waveguide,
a receiving reaction electrode coupled with and adjacent to the receiving coupling waveguide,
a receiving actuation electrode supported by the substrate and configured to control the position of the receiving coupling waveguide relative to the receiving bus waveguide, and
wherein the optical antenna is coupled with the receiving coupling waveguide, and
wherein when a voltage difference between the receiving reaction electrode and the receiving actuation electrode exceeds the upper threshold, a coupling efficiency between the receiving bus waveguide and the receiving coupling waveguide is greater than 50 percent.

15. A beam steering system comprising:
a bus waveguide supported by a substrate;
a coupling waveguide suspended over the bus waveguide;
a reaction electrode coupled with, and adjacent to, the coupling waveguide;
an actuation electrode supported by the substrate and configured to control a position of the coupling waveguide relative to the bus waveguide via the reaction electrode;
an optical antenna coupled with the coupling waveguide, and suspended over the waveguide at a fixed vertical distance;
an optical tree having at least one type of optical switch and configured to collect light from the optical antenna; and
a lens spaced apart from the substrate and configured to diffract the light received from the optical antenna,
wherein when a voltage difference between the reaction electrode and the actuation electrode is less than a lower threshold, the coupling waveguide is positioned a first distance from the bus waveguide, when the voltage difference between the reaction electrode and the actuation electrode is greater than an upper threshold, the coupling waveguide is positioned a second distance from the bus waveguide, and the second distance is less than the first distance.

16. The beam steering system of claim 15, wherein the optical antenna is an array of optical antennae arranged in at least one row and at least one column and the optical tree is configured to selectively enable one of the at least one row or one of the at least one column.

17. The beam steering system of claim 15 further comprising a contact controller, and wherein the optical antenna is an array of optical antennae arranged in at least one row and at least one column, and the contact controller is configured to selectively enable one of the at least one row or one of the at least one column.

18. The beam steering system of claim 15, wherein the lens is configured to translate along a vector perpendicular to the substrate, and the distance from the substrate changes as the lens translates along the vector.

19. The beam steering system of claim 15, wherein the substrate is configured to translate along a vector perpendicular to lens, and the distance of the substrate from the lens changes as the lens translates along the vector.

20. The beam steering system of claim 15 further including, a receiving bus waveguide supported by the substrate and separate from the bus waveguide;

a receiving coupling waveguide suspended over the receiving bus waveguide;

a receiving reaction electrode coupled with and adjacent to the receiving coupling waveguide;

a receiving actuation electrode supported by the substrate and configured to control the position of the receiving coupling waveguide relative to the receiving bus waveguide; and wherein the optical antenna is coupled with the receiving coupling waveguide, and wherein a coupling efficiency between the receiving bus waveguide and the receiving coupling waveguide is greater than 50 percent in response to a voltage difference between the receiving reaction electrode and the receiving actuation electrode exceeding the upper threshold.

* * * * *